(12) United States Patent
Seo et al.

(10) Patent No.: US 10,199,436 B2
(45) Date of Patent: *Feb. 5, 2019

(54) LIGHT-EMITTING DEVICE AND ELECTRONIC DEVICE

(71) Applicant: Semiconductor Energy Laboratory Co., Ltd., Kanagawa-ken (JP)

(72) Inventors: Satoshi Seo, Kanagawa (JP); Toshiki Sasaki, Kanagawa (JP); Ryohei Yamaoka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/900,021

(22) Filed: Feb. 20, 2018

(65) Prior Publication Data

US 2018/0190727 A1 Jul. 5, 2018

Related U.S. Application Data

(63) Continuation of application No. 15/598,537, filed on May 18, 2017, now Pat. No. 9,905,617.

(30) Foreign Application Priority Data

May 20, 2016 (JP) ................. 2016-101783
Sep. 13, 2016 (JP) ................. 2016-178920
Nov. 29, 2016 (JP) ................. 2016-231618

(51) Int. Cl.
*H01L 51/52* (2006.01)
*H01L 27/32* (2006.01)
*H01L 51/50* (2006.01)

(52) U.S. Cl.
CPC ........ *H01L 27/3211* (2013.01); *H01L 27/322* (2013.01); *H01L 27/3206* (2013.01);
(Continued)

(58) Field of Classification Search
CPC ............. H01L 27/3211; H01L 27/3209; H01L 27/3206; H01L 27/322; H01L 27/3223;
(Continued)

(56) References Cited

U.S. PATENT DOCUMENTS 7,425,794 B2  9/2008 Adachi
8,789,968 B2  7/2014 Ohsawa et al.
(Continued)

FOREIGN PATENT DOCUMENTS

CN  101213683 A  7/2008
EP  1 908 135  4/2008
(Continued)

OTHER PUBLICATIONS

"Releasing the Industry's First 30-Inch Master Monitor Equipped with 4K Organic EL Panel," https://www.sony.co.jp/SonyInfo/News/Press/201411/14-114/, Nov. 19, 2014, Sony Japan [online], 14 pages.

(Continued)

*Primary Examiner* — Michael M Trinh
(74) *Attorney, Agent, or Firm* — Husch Blackwell LLP

(57) ABSTRACT

Provided is a light-emitting device that can display an image with a wide color gamut or a novel light-emitting element. The light-emitting device includes a plurality of light-emitting elements each of which includes an EL layer between a pair of electrodes. Light obtained from a first light-emitting element through a first color filter has, on chromaticity coordinates (x, y), a chromaticity x of greater than 0.680 and less than or equal to 0.720 and a chromaticity y of greater than or equal to 0.260 and less than or equal to 0.320. Light obtained from a second light-emitting element through a second color filter has, on chromaticity coordinates (x, y), a chromaticity x of greater than or equal to 0.130 and less than or equal to 0.250 and a chromaticity y of (Continued)

greater than 0.710 and less than or equal to 0.810. Light obtained from a third light-emitting element through a third color filter has, on chromaticity coordinates (x, y), a chromaticity x of greater than or equal to 0.120 and less than or equal to 0.170 and a chromaticity y of greater than or equal to 0.020 and less than 0.060.

13 Claims, 43 Drawing Sheets

(52) U.S. Cl.
CPC ...... *H01L 27/3223* (2013.01); *H01L 51/5016* (2013.01); *H01L 51/5036* (2013.01); *H01L 51/5044* (2013.01); *H01L 51/5218* (2013.01); *H01L 51/5221* (2013.01); *H01L 51/5281* (2013.01); *H01L 27/323* (2013.01); *H01L 27/3209* (2013.01); *H01L 27/3213* (2013.01); *H01L 27/3244* (2013.01); *H01L 51/5265* (2013.01); *H01L 51/5275* (2013.01)

(58) Field of Classification Search
CPC ............. H01L 51/5106; H01L 51/5281; H01L 51/5221; H01L 51/5218; H01L 51/504; H01L 51/5036
See application file for complete search history.

(56) References Cited

U.S. PATENT DOCUMENTS

| | | | |
|---|---|---|---|
| 8,957,442 B2 | 2/2015 | Seo et al. | |
| 9,000,458 B2 | 4/2015 | Seo et al. | |
| 9,006,755 B2 | 4/2015 | Seo et al. | |
| 9,123,666 B2* | 9/2015 | Kashiwabara | H01L 27/3211 |
| 9,153,627 B2 | 10/2015 | Ohsawa et al. | |
| 9,172,059 B2 | 10/2015 | Seo et al. | |
| 9,343,515 B2 | 5/2016 | Sugisawa et al. | |
| 9,343,691 B2 | 5/2016 | Seo et al. | |
| 9,412,793 B2 | 8/2016 | Seo et al. | |
| 9,450,032 B2 | 9/2016 | Seo et al. | |
| 9,450,209 B2 | 9/2016 | Seo et al. | |
| 9,461,092 B2 | 10/2016 | Seo et al. | |
| 9,472,601 B2 | 10/2016 | Seo et al. | |
| 9,583,735 B2 | 2/2017 | Seo et al. | |
| 9,595,571 B2 | 3/2017 | Seo et al. | |
| 9,653,705 B2 | 5/2017 | Uesaka et al. | |
| 9,673,264 B2 | 6/2017 | Ohsawa et al. | |
| 9,691,825 B2 | 6/2017 | Seo et al. | |
| 9,711,110 B2 | 7/2017 | Yamazaki et al. | |
| 9,721,998 B2 | 8/2017 | Yamazaki | |
| 9,905,617 B2* | 2/2018 | Seo | H01L 27/3211 |
| 2007/0001588 A1 | 1/2007 | Boroson et al. | |
| 2007/0035243 A1 | 2/2007 | Lee | |
| 2008/0122350 A1 | 5/2008 | Sakata et al. | |
| 2008/0158107 A1* | 7/2008 | Miller | G09G 3/22 345/76 |
| 2012/0075273 A1 | 3/2012 | Abe et al. | |
| 2013/0264549 A1 | 10/2013 | Yamazaki et al. | |
| 2014/0117339 A1 | 5/2014 | Seo | |
| 2014/0332831 A1* | 11/2014 | Ohsawa | H01L 51/5265 257/89 |
| 2015/0171360 A1* | 6/2015 | Kittichungchit | H01L 51/504 257/40 |
| 2015/0263076 A1 | 9/2015 | Seo et al. | |
| 2016/0064682 A1* | 3/2016 | Yamae | H01L 51/5044 257/40 |
| 2016/0380236 A1 | 12/2016 | Seo et al. | |
| 2017/0025479 A1 | 1/2017 | Seo et al. | |
| 2017/0033321 A1 | 2/2017 | Seo et al. | |
| 2017/0084670 A1 | 3/2017 | Seo et al. | |
| 2017/0133438 A1 | 5/2017 | Seo | |
| 2017/0179435 A1 | 6/2017 | Seo et al. | |

FOREIGN PATENT DOCUMENTS

| | | |
|---|---|---|
| JP | 2007-053090 A | 3/2007 |
| JP | 2008-160090 A | 7/2008 |
| JP | 2009-500794 | 1/2009 |
| JP | 2012-072099 A | 4/2012 |
| KR | 2008-0022555 A | 3/2008 |
| KR | 2008-0048977 A | 6/2008 |
| TW | 200705364 | 2/2007 |
| WO | WO 2007/005325 A1 | 1/2007 |

OTHER PUBLICATIONS

"Organic EL Master Monitor TRIMASTER EL Series," https://sony.jp/products/catalog/TRIMASTERELseries_1211.pdf, Nov. 1, 2012, Sony [online], 7 pages.
International Search Report re Application No. PCT/IB2017/052783, dated Aug. 8, 2017.
Written Opinion re Application No. PCT/IB2017/052783, dated Aug. 8, 2017.
"BVM-E/BVM-F/PVM Series TRIMASTER EL OLED Monitors," https://pro.sony.com/bbsccms/assets/files/micro/OLED/brochures/bvm_pvm.pdf, Sony [online], printed Aug. 2010, 36 pages.

* cited by examiner

FIG. 15A
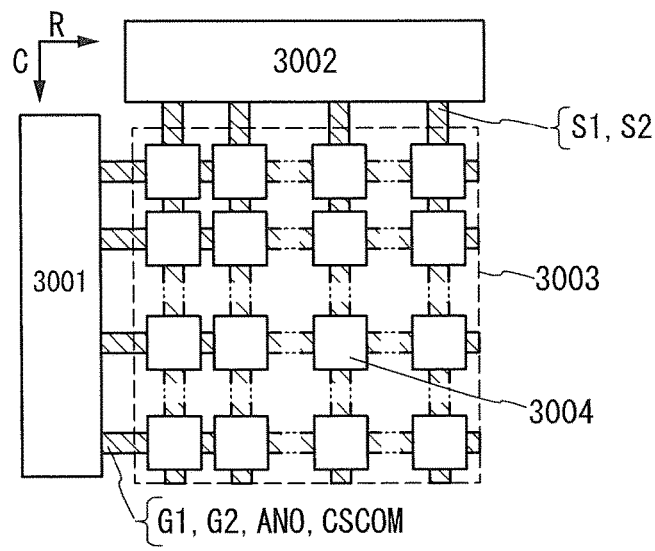
FIG. 15B1
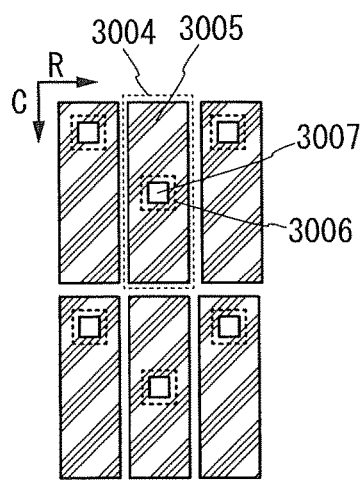
FIG. 15B2
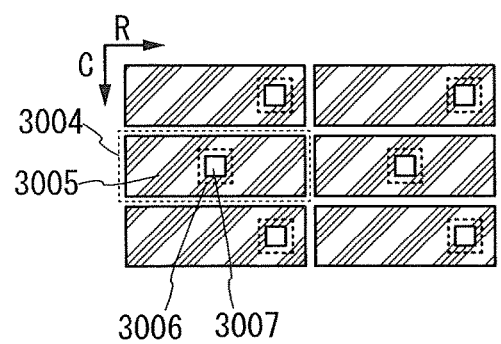

LIGHT-EMITTING DEVICE AND ELECTRONIC DEVICE

This application is a continuation of copending U.S. application Ser. No. 15/598,537, filed on May 18, 2017 which is incorporated herein by reference.

TECHNICAL FIELD

One embodiment of the present invention relates to a light-emitting element, a light-emitting device, and an electronic device. Note that one embodiment of the present invention is not limited thereto. That is, one embodiment of the present invention relates to an object, a method, a manufacturing method, or a driving method. One embodiment of the present invention relates to a process, a machine, manufacture, or a composition of matter. As specific examples, a semiconductor device, a display device, a liquid crystal display device, a lighting device, and the like can be given.

BACKGROUND ART

A light-emitting element including an EL layer between a pair of electrodes (also referred to as an organic EL element) has characteristics such as thinness, light weight, high-speed response to input signals, and low power consumption; thus, a display including such a light-emitting element has attracted attention as a next-generation flat panel display.

In a light-emitting element, voltage application between a pair of electrodes causes, in an EL layer, recombination of electrons and holes injected from the electrodes, which brings a light-emitting substance (organic compound) contained in the EL layer into an excited state. Light is emitted when the light-emitting substance returns to the ground state from the excited state. The excited state can be a singlet excited state (S*) or a triplet excited state (T*). Light emission from a singlet excited state is referred to as fluorescence, and light emission from a triplet excited state is referred to as phosphorescence. The statistical generation ratio of S* to T* in the light-emitting element is considered to be 1:3. Since the spectrum of light emitted from a light-emitting substance depends on the light-emitting substance, the use of different types of organic compounds as light-emitting substances makes it possible to obtain light-emitting elements which exhibit various colors.

To display a full-color image on a display, for example, light-emitting elements of at least three colors of red, green, and blue are necessary. Furthermore, the light-emitting elements are required to consume low power.

Examples of specific methods for displaying a full-color image are as follows: so-called side-by-side patterning in which light-emitting elements that emit light with different colors are separately formed; a white-color filter method in which a white light-emitting element is used in combination with a color filter; and a color conversion method in which a light-emitting element that emits monochromatic light, such as a blue light-emitting element, is used in combination with a color conversion filter. Each of the methods has advantages and disadvantages.

REFERENCE

Patent Document

[Patent Document 1] Japanese Published Patent Application No. 2007-053090

DISCLOSURE OF INVENTION

Compared with side-by-side patterning, a white-color filter method, which is a specific method for displaying a full-color image, facilitates high resolution because a plurality of light-emitting elements share one EL layer, and is suitable particularly for the market of displays.

Since light-emitting elements emitting red light, green light, and blue light utilize white light emitted from a common EL layer in a white-color filter method, a display with a wide color gamut can be obtained by setting the chromaticities (x, y) of emission colors of the light-emitting elements in desired ranges.

Thus, in one embodiment of the present invention, a light-emitting device that can display an image with a wide color gamut can be provided. In one embodiment of the present invention, a novel light-emitting element can be provided. In one embodiment of the present invention, a light-emitting element with high color purity can be provided.

Note that the description of these objects does not preclude the existence of other objects. In one embodiment of the present invention, there is no need to achieve all the objects. Other objects will be apparent from and can be derived from the description of the specification, the drawings, the claims, and the like.

One embodiment of the present invention is a light-emitting device including a plurality of light-emitting elements each of which includes an EL layer between a pair of electrodes. Light emitted from a first light-emitting element has, on CIE1931 chromaticity coordinates (x, y) (hereinafter, simply referred to as chromaticity coordinates (x, y)), a chromaticity x of greater than 0.680 and less than or equal to 0.720 and a chromaticity y of greater than or equal to 0.260 and less than or equal to 0.320, light emitted from a second light-emitting element has a chromaticity x of greater than or equal to 0.130 and less than or equal to 0.250 and a chromaticity y of greater than 0.710 and less than or equal to 0.810, and light emitted from a third light-emitting element has a chromaticity x of greater than or equal to 0.120 and less than or equal to 0.170 and a chromaticity y of greater than or equal to 0.020 and less than 0.060.

Another embodiment of the present invention is a light-emitting device including a plurality of light-emitting elements each of which includes an EL layer between a reflective electrode and a transflective electrode. Light emitted from a first light-emitting element has, on chromaticity coordinates (x, y), a chromaticity x of greater than 0.680 and less than or equal to 0.720 and a chromaticity y of greater than or equal to 0.260 and less than or equal to 0.320, light emitted from a second light-emitting element has a chromaticity x of greater than or equal to 0.130 and less than or equal to 0.250 and a chromaticity y of greater than 0.710 and less than or equal to 0.810, and light emitted from a third light-emitting element has a chromaticity x of greater than or equal to 0.120 and less than or equal to 0.170 and a chromaticity y of greater than or equal to 0.020 and less than 0.060.

Another embodiment of the present invention is a light-emitting device including a plurality of light-emitting elements each of which includes an EL layer between a pair of electrodes. Light obtained from a first light-emitting element through a first color filter has, on CIE1931 chromaticity coordinates, a chromaticity x of greater than 0.680 and less than or equal to 0.720 and a chromaticity y of greater than or equal to 0.260 and less than or equal to 0.320, light obtained from a second light-emitting element through a second color filter has, on the CIE1931 chromaticity coordinates, a chromaticity x of greater than or equal to 0.130 and less than or equal to 0.250 and a chromaticity y of greater than 0.710 and less than or equal to 0.810, and light obtained from a third light-emitting element through a third color filter has, on the CIE1931 chromaticity coordinates, a chromaticity x of greater than or equal to 0.120 and less than or equal to 0.170 and a chromaticity y of greater than or equal to 0.020 and less than 0.060.

Another embodiment of the present invention is a light-emitting device including a plurality of light-emitting elements each of which includes an EL layer between a reflective electrode and a transflective electrode. Light obtained from a first light-emitting element through a first color filter has, on CIE1931 chromaticity coordinates, a chromaticity x of greater than 0.680 and less than or equal to 0.720 and a chromaticity y of greater than or equal to 0.260 and less than or equal to 0.320, light obtained from a second light-emitting element through a second color filter has, on the CIE1931 chromaticity coordinates, a chromaticity x of greater than or equal to 0.130 and less than or equal to 0.250 and a chromaticity y of greater than 0.710 and less than or equal to 0.810, and light obtained from a third light-emitting element through a third color filter has, on the CIE1931 chromaticity coordinates, a chromaticity x of greater than or equal to 0.120 and less than or equal to 0.170 and a chromaticity y of greater than or equal to 0.020 and less than 0.060.

In any of the above structures, the EL layers included in the first light-emitting element, the second light-emitting element, and the third light-emitting element are preferably EL layers that emit white light and that are formed using the same material. Each of the EL layers includes at least a light-emitting layer. A plurality of EL layers may be included in each light-emitting element, and the EL layers may be stacked with a charge generation layer positioned therebetween.

Another embodiment of the present invention is a light-emitting device including a first light-emitting element, a second light-emitting element, and a third light-emitting element each of which includes an EL layer between a pair of electrodes. The EL layers emit white light. Light obtained from the first light-emitting element through a first color filter has, on CIE1931 chromaticity coordinates, a chromaticity x of greater than 0.680 and less than or equal to 0.720 and a chromaticity y of greater than or equal to 0.260 and less than or equal to 0.320, light obtained from the second light-emitting element through a second color filter has, on the CIE1931 chromaticity coordinates, a chromaticity x of greater than or equal to 0.130 and less than or equal to 0.250 and a chromaticity y of greater than 0.710 and less than or equal to 0.810, and light obtained from the third light-emitting element through a third color filter has, on the CIE1931 chromaticity coordinates, a chromaticity x of greater than or equal to 0.120 and less than or equal to 0.170 and a chromaticity y of greater than or equal to 0.020 and less than 0.060.

To extract light with different colors efficiently from the EL layers that emit white light in the light-emitting elements, optical path lengths between the pair of electrodes are preferably adjusted depending on the emission color to form what is called a microcavity structure.

Another embodiment of the present invention is a light-emitting device including a first light-emitting element, a second light-emitting element, and a third light-emitting element each of which includes an EL layer between a reflective electrode and a transflective electrode. The EL layers emit white light. Light obtained from the first light-emitting element through a first color filter has, on CIE1931 chromaticity coordinates, a chromaticity x of greater than 0.680 and less than or equal to 0.720 and a chromaticity y of greater than or equal to 0.260 and less than or equal to 0.320, light obtained from the second light-emitting element through a second color filter has, on the CIE1931 chromaticity coordinates, a chromaticity x of greater than or equal to 0.130 and less than or equal to 0.250 and a chromaticity y of greater than 0.710 and less than or equal to 0.810, and light obtained from the third light-emitting element through a third color filter has, on the CIE1931 chromaticity coordinates, a chromaticity x of greater than or equal to 0.120 and less than or equal to 0.170 and a chromaticity y of greater than or equal to 0.020 and less than 0.060.

Another embodiment of the present invention is a light-emitting device including a first light-emitting element, a second light-emitting element, and a third light-emitting element each of which includes an EL layer between a pair of electrodes. Each of the EL layers emits white light and includes a first EL layer and a second EL layer that are stacked with a charge generation layer positioned therebetween. The first EL layer contains a red light-emitting substance and a green light-emitting substance. The second EL layer contains a blue light-emitting substance. Light obtained from the first light-emitting element through a first color filter has, on CIE1931 chromaticity coordinates, a chromaticity x of greater than 0.680 and less than or equal to 0.720 and a chromaticity y of greater than or equal to 0.260 and less than or equal to 0.320, light obtained from the second light-emitting element through a second color filter has, on the CIE1931 chromaticity coordinates, a chromaticity x of greater than or equal to 0.130 and less than or equal to 0.250 and a chromaticity y of greater than 0.710 and less than or equal to 0.810, and light obtained from the third light-emitting element through a third color filter has, on the CIE1931 chromaticity coordinates, a chromaticity x of greater than or equal to 0.120 and less than or equal to 0.170 and a chromaticity y of greater than or equal to 0.020 and less than 0.060.

Another embodiment of the present invention is a light-emitting device including a first light-emitting element, a second light-emitting element, and a third light-emitting element each of which includes an EL layer between a reflective electrode and a transflective electrode. Each of the EL layers emits white light and includes a first EL layer and a second EL layer that are stacked with a charge generation layer positioned therebetween. The first EL layer contains a red light-emitting substance and a green light-emitting substance. The second EL layer contains a blue light-emitting substance. Light obtained from the first light-emitting element through a first color filter has, on CIE1931 chromaticity coordinates, a chromaticity x of greater than 0.680 and less than or equal to 0.720 and a chromaticity y of greater than or equal to 0.260 and less than or equal to 0.320, light obtained from the second light-emitting element through a second color filter has, on the CIE1931 chromaticity coordinates, a chromaticity x of greater than or equal to 0.130 and less than or equal to 0.250 and a chromaticity y of greater than 0.710 and less than or equal to 0.810, and light obtained from the third light-emitting element through a third color filter has, on the CIE1931 chromaticity coordinates, a chromaticity x of greater than or equal to 0.120 and less than or equal to 0.170 and a chromaticity y of greater than or equal to 0.020 and less than 0.060.

In any of the structures including the reflective electrode and the transflective electrode, an optical path length between the reflective electrode and the transflective electrode in the first light-emitting element may be set so that emission intensity of red light can be increased. An optical path length between the reflective electrode and the transflective electrode in the second light-emitting element may be set so that emission intensity of green light may be increased. An optical path length between the reflective electrode and the transflective electrode in the third light-emitting element may be set so that emission intensity of blue light may be increased.

In any of the structures, the first color filter may have a 600-nm light transmittance of less than or equal to 60% and a 650-nm light transmittance of greater than or equal to 70%. The second color filter may have a 480-nm light transmittance of less than or equal to 60%, a 580-nm light transmittance of less than or equal to 60%, and a 530-nm light transmittance of greater than or equal to 70%. The third color filter may have a 510-nm light transmittance of less than or equal to 60% and a 450-nm light transmittance of greater than or equal to 70%.

In any of the structures, the light obtained from the first light-emitting element through the first color filter may have an emission spectrum whose peak value is within a range from 620 nm to 680 nm.

Another embodiment of the present invention is an electronic device that includes the light-emitting device of one embodiment of the present invention and an operation key, a speaker, a microphone, or an external connection portion.

One embodiment of the present invention includes, in its category, in addition to a light-emitting device including a light-emitting element, an electronic device including a light-emitting element or a light-emitting device (specifically, an electronic device including a light-emitting element or a light-emitting device and a connection terminal or an operation key) and a lighting device including a light-emitting element or a light-emitting device (specifically, a lighting device including a light-emitting element or a light-emitting device and a housing). Accordingly, a light-emitting device in this specification means an image display device or a light source (including a lighting device). Furthermore, a light-emitting device includes the following modules in its category: a module in which a connector such as a flexible printed circuit (FPC) or a tape carrier package (TCP) is attached to a light-emitting device; a module having a TCP whose end is provided with a printed wiring board; and a module in which an integrated circuit (IC) is directly mounted on a light-emitting element by a chip on glass (COG) method.

One embodiment of the present invention can provide a light-emitting device that can display an image with a wide color gamut. One embodiment of the present invention can provide a novel light-emitting element. One embodiment of the present invention can provide a light-emitting element with high color purity. One embodiment of the present invention can provide a light-emitting device with high color reproducibility. One embodiment of the present invention can provide an electronic device including a display portion with high color reproducibility.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

FIGS. 15A, 15B1, and 15B2 illustrate block diagrams of display devices.

BEST MODE FOR CARRYING OUT THE INVENTION

Figure 1A:
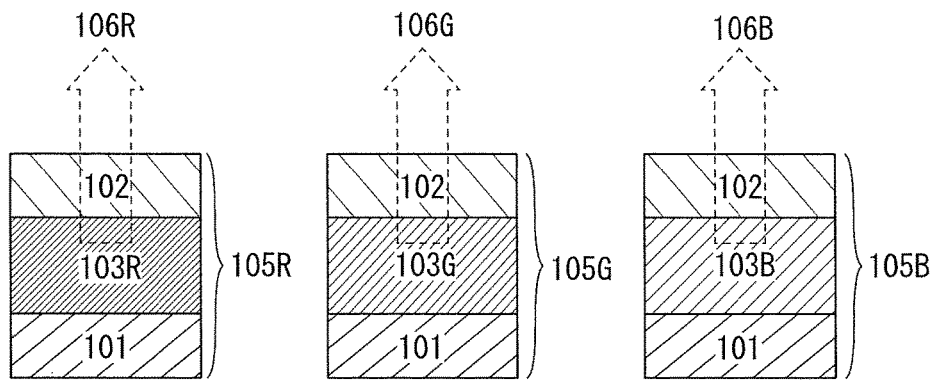
FIGS. 1A to 1C illustrate light-emitting devices of one embodiment of the present invention.

Embodiments of the present invention will be described in detail below with reference to the drawings. However, the present invention is not limited to the following description, and the mode and details can be variously changed unless departing from the scope and spirit of the present invention. Thus, the present invention should not be construed as being limited to the description in the following embodiments.

Note that the position, the size, the range, or the like of each component illustrated in the drawings and the like are not accurately represented in some cases for easy understanding. Therefore, the disclosed invention is not necessarily limited to the position, size, range, or the like as disclosed in the drawings and the like.

In the description of structures of the present invention in this specification and the like with reference to the drawings, the same components in different drawings are denoted by the same reference numeral.

Embodiment 1

In this embodiment, light-emitting devices of one embodiment of the present invention will be described with reference to FIGS. 1A and 1B.

A light-emitting device illustrated in FIG. 1A includes a first light-emitting element 105R, a second light-emitting element 105G, and a third light-emitting element 105B. The first light-emitting element 105R includes a first electrode 101, an EL layer 103R, and a second electrode 102. The second light-emitting element 105G includes the first electrode 101, an EL layer 103G, and the second electrode 102. The third light-emitting element 105B includes the first electrode 101, an EL layer 103B, and the second electrode 102. Note that the EL layers (103R, 103G, and 103B) included in the light-emitting elements contain different materials partly or entirely and are formed by a separate coloring method. This means that, for example, the EL layer 103R can be an EL layer that emits red light, the EL layer 103G can be an EL layer that emits green light, and the EL layer 103B can be an EL layer that emits blue light.

At least one of the electrodes (in the cases of FIGS. 1A and 1B, the second electrode 102 in the arrow direction in which light is emitted from the EL layer) included in each of the light-emitting elements is preferably formed using a light-transmitting electrode material.

Figure 1B:
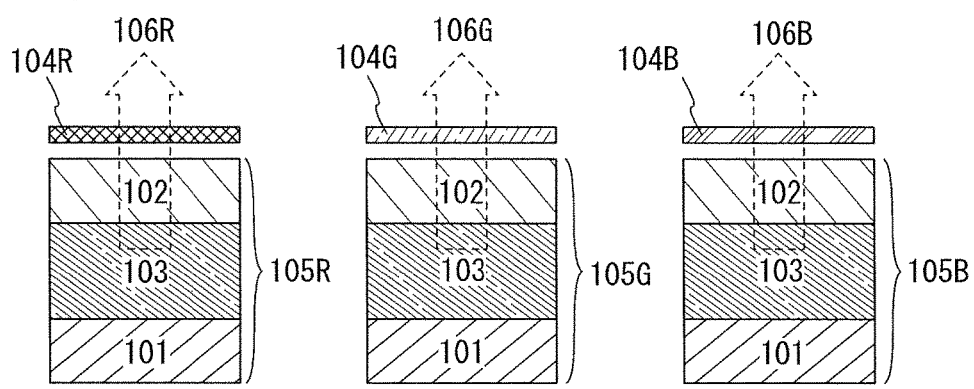

A light-emitting device illustrated in FIG. 1B includes the first light-emitting element 105R, the second light-emitting element 105G, and the third light-emitting element 105B. The first light-emitting element 105R includes the first electrode 101, an EL layer 103, and the second electrode 102. A color filter 104R is provided in a region overlapping with the first electrode 101, the EL layer 103, and the second electrode 102. The second light-emitting element 105G includes the first electrode 101, the EL layer 103, and the second electrode 102. A color filter 104G is provided in a region overlapping with the first electrode 101, the EL layer 103, and the second electrode 102. The third light-emitting element 105B includes the first electrode 101, the EL layer 103, and the second electrode 102. A color filter 104B is provided in a region overlapping with the first electrode 101, the EL layer 103, and the second electrode 102. Note that the light-emitting elements include the same EL layer 103.

The second electrode 102 included in each of the light-emitting elements illustrated in FIG. 1B is preferably formed using a light-transmitting electrode material. Accordingly, red light 106R of light emitted from the EL layer 103 can be extracted from the first light-emitting element 105R to the outside through the color filter 104R. Furthermore, green light 106G of the light emitted from the EL layer 103 can be extracted from the second light-emitting element 105G to the outside through the color filter 104G. In addition, blue light 106B of the light emitted from the EL layer 103 can be extracted from the third light-emitting element 105B to the outside through the color filter 104B. This means that the color filter 104R has a function of transmitting red light, the color filter 104G has a function of transmitting green light, and the color filter 104B has a function of transmitting blue light.

Although not illustrated in FIGS. 1A and 1B, each of the first light-emitting element 105R, the second light-emitting element 105G, and the third light-emitting element 105B in the light-emitting device described in this embodiment may be electrically connected to a transistor that controls light emission.

The EL layers (103, 103R, 103G, and 103B) illustrated in FIGS. 1A and 1B each include functional layers such as a light-emitting layer containing a light-emitting substance, a hole-injection layer, a hole-transport layer, an electron-transport layer, and an electron-injection layer. In the case of stacked EL layers, a charge generation layer is positioned between the EL layers.

The light-emitting layers included in the EL layers (103, 103R, 103G, and 103B) illustrated in FIGS. 1A and 1B can contain one or more kinds of organic compounds in addition to the light-emitting substance. One light-emitting layer or the stacked light-emitting layers may contain light-emitting substances of different colors. In the case where the EL layer (103, 103R, 103G, or 103B) illustrated in FIG. 1A or FIG. 1B is formed of stacked EL layers, a charge generation layer is provided between the EL layers as described above. In that case, the EL layers preferably emit light with different colors.

The first light-emitting element 105R, the second light-emitting element 105G, and the third light-emitting element 105B illustrated in FIG. 1B share the EL layer 103. In that case, light with different colors can be obtained from the light-emitting elements while the EL layer 103 emits white light.

In the case where light emitted from the EL layer 103 is white light obtained by mixing light with a plurality of wavelengths are mixed as illustrated in FIG. 1B, it is preferable to employ a microcavity structure by using the first electrode 101 as a reflective electrode and the second electrode 102 as a transflective electrode to intensify light with a specific wavelength. Note that a microcavity structure may be employed also in the case where the EL layers are separately formed for each light-emitting element as illustrated in FIG. 1A.

Since the first light-emitting element 105R illustrated in FIG. 1A or FIG. 1B is a light-emitting element that emits red light, the thickness of the first electrode 101 is preferably adjusted so that an optical path length between the first electrode 101 and the second electrode 102 may be set to an optical path length that increases the emission intensity of red light. Furthermore, since the second light-emitting element 105G is a light-emitting element that emits green light, the thickness of the first electrode 101 is preferably adjusted so that an optical path length between the first electrode 101 and the second electrode 102 may be set to an optical path length that increases the emission intensity of green light. In addition, since the third light-emitting element 105B is a light-emitting element that emits blue light, the thickness of the first electrode 101 is preferably adjusted so that an optical path length between the first electrode 101 and the second electrode 102 may be set to an optical path length that increases the emission intensity of blue light.

In the case where light emitted from the EL layer 103 is white light as illustrated in FIG. 1B, it is desirable that red light, green light, and blue light that constitute white light have independent emission spectra that do not overlap with each other to prevent a reduction in color purity. The emission spectrum of green light and the emission spectrum of red light are especially likely to overlap with each other because their peak wavelengths are close to each other. The light-emitting substances contained in the EL layers and stacked structures of the EL layers are important in preventing such overlap of the emission spectra. The number of steps can be smaller in the case of light-emitting devices including a common EL layer than in the case of light-emitting devices including separately formed EL layers; however, some difficulties are caused. Thus, one embodiment of the present invention can provide not only a light-emitting device having favorable chromaticity for each emission color, but also a light-emitting device in which overlap of different emission spectra is prevented and chromaticity for each emission color is favorable particularly when a common light-emitting layer that emits white light is included.

The light-emitting device described in this embodiment includes a plurality of light-emitting elements and can display a full-color image. At present, some standards are established as quality indicators for full-color displays.

For example, the sRGB standard, which is an international standard for color spaces defined by the International Electrotechnical Commission (IEC) to standardize color reproduction on devices such as displays, printers, digital cameras, and scanners, is widely used. Note that in the sRGB standard, the chromaticities (x, y) on the CIE1931 chromaticity coordinates (x,y chromaticity coordinates) defined by the International Commission on Illumination (CIE) are (0.640, 0.330) for red (R), (0.300, 0.600) for green (G), and (0.150, 0.060) for blue (B).

In the NTSC standard, which is a color gamut standard for analog television systems defined by the National Television System Committee (NTSC) in America, the chromaticities (x, y) are (0.670, 0.330) for red (R), (0.210, 0.710) for green (G), and (0.140, 0.080) for blue (B).

In the DCI-P3 standard (defined by Digital Cinema Initiatives, LLC), which is the international unified standard used when distributing digital movies (cinema), the chromaticities (x, y) are (0.680, 0.320) for red (R), (0.265, 0.690) for green (G), and (0.150, 0.060) for blue (B).

In the BT.2020 standard for ultra high definition television (UHDTV, also referred to as Super Hi-Vision), which is defined by Japan Broadcasting Corporation (NHK), the chromaticities (x, y) are (0.708, 0.292) for red, (0.170, 0.797) for green, and (0.131, 0.046) for blue.

Figure 1C:
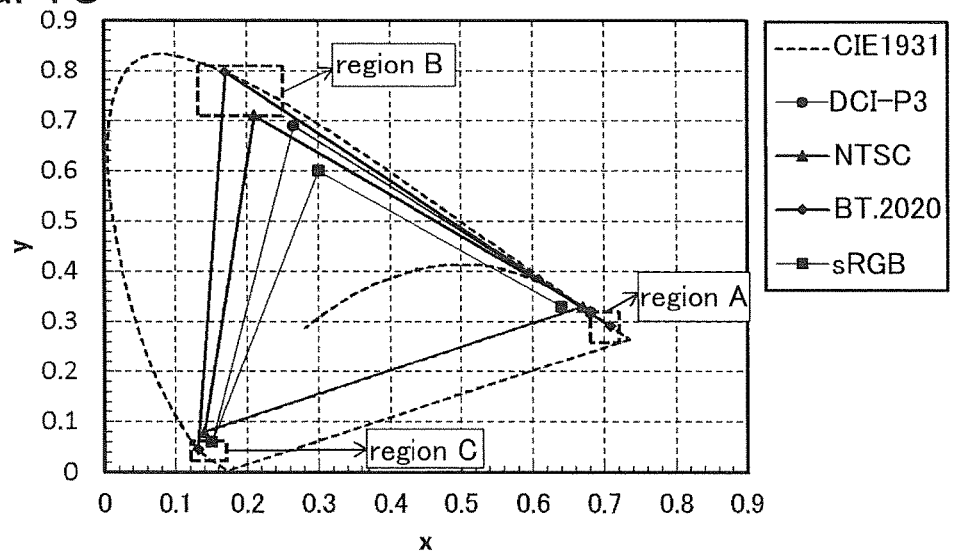

As described above, a variety of standards for displays are defined. The light-emitting device of one embodiment of the present invention includes light-emitting elements (a light-emitting element that emits red light, a light-emitting element that emits green light, and a light-emitting element that emits blue light) that cover chromaticity ranges (a region A, a region B, and a region C) represented by color coordinates in FIG. 1C. Specifically, the light-emitting device includes at least the first light-emitting element 105R from which the red light 106R can be obtained, the second light-emitting element 105G from which the green light 106G can be obtained, and the third light-emitting element 105B from which the blue light 106B can be obtained. Light obtained from the first light-emitting element 105R has chromaticity that falls within the region A in the color coordinates in FIG. 1C, or has a chromaticity x of greater than 0.680 and less than or equal to 0.720 and a chromaticity y of greater than or equal to 0.260 and less than or equal to 0.320 on the CIE1931 chromaticity coordinates. Light obtained from the second light-emitting element 105G has chromaticity that falls within the region B in the color coordinates in FIG. 1C, or has a chromaticity x of greater than or equal to 0.130 and less than or equal to 0.250 and a chromaticity y of greater than 0.710 and less than or equal to 0.810. Light obtained from the third light-emitting element 105B has chromaticity that falls within the region C in the color coordinates in FIG. 1C, or has a chromaticity x of greater than or equal to 0.120 and less than or equal to 0.170 and a chromaticity y of greater than or equal to 0.020 and less than 0.060. Note that as illustrated in FIG. 1B, a structure in which the light-emitting elements (105R, 105G, and 105B) and the color filters (104R, 104G, and 104B) are used in combination and light emissions obtained from the light-emitting elements (105R, 105G, and 105B) through the color filters (104R, 104G, and 104B) cover the above chromaticity ranges may be employed. A light-emitting device including such light-emitting elements can provide high-quality full-color displays. It is needless to say that a structure that covers the above chromaticity ranges without using color filters may be employed as illustrated in FIG. 1A.

Note that the peak wavelength of the emission spectrum of the first light-emitting element 105R illustrated in FIG. 1A is preferably greater than or equal to 620 nm and less than or equal to 680 nm. The peak wavelength of the emission spectrum of the second light-emitting element 105G illustrated in FIG. 1A is preferably greater than or equal to 500 nm and less than or equal to 530 nm. The peak wavelength of the emission spectrum of the third light-emitting element 105B illustrated in FIG. 1A is preferably greater than or equal to 430 nm and less than or equal to 460 nm. The half widths of the emission spectra of the light-emitting elements 105R, 105G, and 105B are preferably greater than or equal to 5 nm and less than or equal to 45 nm, greater than or equal to 5 nm and less than or equal to 35 nm, and greater than or equal to 5 nm and less than or equal to 25 nm, respectively. The peak wavelengths and the half widths of emission spectra of light passed through the color filters illustrated in FIG. 1B have similar values.

In one embodiment of the present invention, the above chromaticities are preferably obtained so that the area ratio to the BT.2020 color gamut in the CIE chromaticity coordinates (x, y) can become higher than or equal to 80%, further preferably higher than or equal to 90%, or the color gamut coverage can become higher than or equal to 75%, further preferably higher than or equal to 85%.

The chromaticities may be measured with any of a luminance colorimeter, a spectroradiometer, and an emission spectrometer, and it is sufficient that the above-described chromaticities be met in any one of the measurements. Note that it is preferable that the above-described chromaticities be met in all of the measurements.

Note that the structures described in this embodiment can be combined with any of the structures described in the other embodiments as appropriate.

Embodiment 2

In this embodiment, light-emitting elements of one embodiment of the present invention will be described.

<<Basic Structure of Light-Emitting Element>>

Figure 2A:
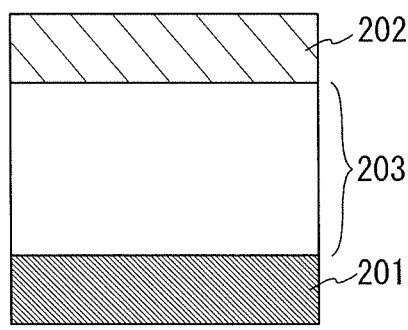
FIGS. 2A to 2D each illustrate a structure of a light-emitting element.

A basic structure of a light-emitting element will be described. FIG. 2A illustrates a light-emitting element including, between a pair of electrodes, an EL layer having a light-emitting layer. Specifically, an EL layer 203 is provided between a first electrode 201 and a second electrode 202 (single structure).

Figure 2B:
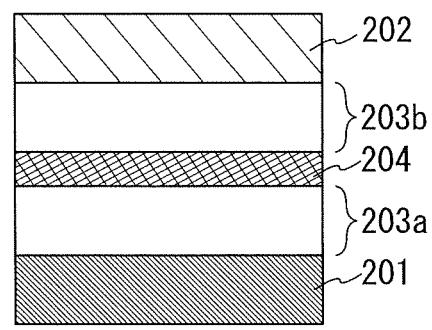

FIG. 2B illustrates a light-emitting element that has a stacked-layer structure (tandem structure) in which a plurality of EL layers (two EL layers 203a and 203b in FIG. 2B) are provided between a pair of electrodes and a charge generation layer 204 is provided between the EL layers. With the use of such a tandem light-emitting element, a light-emitting device which can be driven at low voltage with low power consumption can be obtained.

The charge generation layer 204 has a function of injecting electrons into one of the EL layers (203a or 203b) and injecting holes into the other of the EL layers (203b or 203a) when voltage is applied between the first electrode 201 and the second electrode 202. Thus, when voltage is applied to the first electrode 201 in FIG. 2B such that the potential of the first electrode 201 becomes higher than that of the second electrode 202, the charge generation layer 204 injects electrons into the EL layer 203a and injects holes into the EL layer 203b.

Note that in terms of light extraction efficiency, the charge generation layer 204 preferably has a property of transmitting visible light (specifically, a visible light transmittance of 40% or higher). Furthermore, the charge generation layer 204 functions even if it has lower conductivity than the first electrode 201 or the second electrode 202.

Figure 2C:
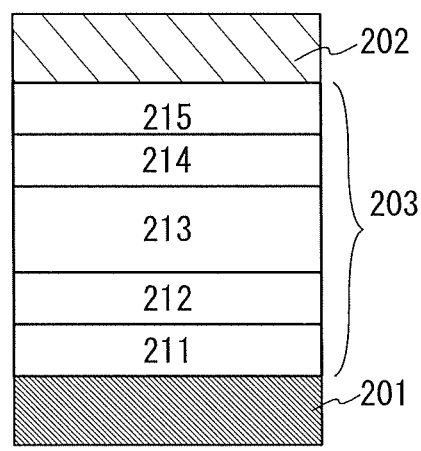

FIG. 2C illustrates a stacked-layer structure of the EL layer 203 in the light-emitting element of one embodiment of the present invention. In this case, the first electrode 201 is regarded as functioning as an anode. The EL layer 203 has a structure in which a hole-injection layer 211, a hole-transport layer 212, a light-emitting layer 213, an electron-transport layer 214, and an electron-injection layer 215 are stacked in this order over the first electrode 201. Even in the case where a plurality of EL layers are provided as in the tandem structure illustrated in FIG. 2B, the layers in each EL layer are sequentially stacked from the anode side as described above. When the first electrode 201 is a cathode and the second electrode 202 is an anode, the stacking order of the layers is reversed.

The light-emitting layer 213 included in the EL layers (203, 203a, and 203b) contains light-emitting substances and a plurality of substances in appropriate combination, so that fluorescence or phosphorescence of desired emission colors can be obtained. The light-emitting layer 213 may have a stacked-layer structure having different emission colors. In that case, light-emitting substances and other substances are different between the stacked light-emitting layers. Alternatively, the plurality of EL layers (203a and 203b) in FIG. 2B may exhibit their respective emission colors. Also in that case, light-emitting substances and other substances are different between the light-emitting layers.

In the light-emitting element of one embodiment of the present invention, for example, a micro optical resonator (microcavity) structure in which the first electrode 201 is a reflective electrode and the second electrode 202 is a transflective electrode can be employed in FIG. 2C, whereby light emission from the light-emitting layer 213 in the EL layer 203 can be resonated between the electrodes and light emission transmitted from the second electrode 202 can be intensified.

Note that when the first electrode 201 of the light-emitting element is a reflective electrode having a structure in which a reflective conductive material and a light-transmitting conductive material (transparent conductive film) are stacked, optical adjustment can be performed by controlling the thickness of the transparent conductive film. Specifically, when the wavelength of light from the light-emitting layer 213 is $\lambda$, the distance between the first electrode 201 and the second electrode 202 is preferably adjusted to around $m\lambda/2$ (m is a natural number).

To amplify desired light (wavelength: $\lambda$) obtained from the light-emitting layer 213, the optical path length from the first electrode 201 to a region where desired light is obtained in the light-emitting layer 213 (light-emitting region) and the optical path length from the second electrode 202 to the region where desired light is obtained in the light-emitting layer 213 (light-emitting region) are preferably adjusted to around $(2m'+1)\lambda/4$ (m' is a natural number). Here, the light-emitting region means a region where holes and electrons are recombined in the light-emitting layer 213.

By such optical adjustment, the spectrum of specific monochromatic light from the light-emitting layer 213 can be narrowed and light emission with high color purity can be obtained.

In that case, the optical path length between the first electrode 201 and the second electrode 202 is, to be exact, the total thickness from a reflective region in the first electrode 201 to a reflective region in the second electrode 202. However, it is difficult to exactly determine the reflective regions in the first electrode 201 and the second electrode 202; thus, it is assumed that the above effect can be sufficiently obtained wherever the reflective regions may be set in the first electrode 201 and the second electrode 202. Furthermore, the optical path length between the first electrode 201 and the light-emitting layer emitting desired light is, to be exact, the optical path length between the reflective region in the first electrode 201 and the light-emitting region where desired light is obtained in the light-emitting layer. However, it is difficult to precisely determine the reflective region in the first electrode 201 and the light-emitting region where desired light is obtained in the light-emitting layer; thus, it is assumed that the above effect can be sufficiently obtained wherever the reflective region and the light-emitting region may be set in the first electrode 201 and the light-emitting layer emitting desired light.

The light-emitting element in FIG. 2C has a microcavity structure, so that light rays (monochromatic light rays) with different wavelengths can be extracted even if the same EL layer is used. Thus, separate coloring for obtaining a plurality of emission colors (e.g., R, G, and B) is not necessary. Therefore, high resolution can be easily achieved. Note that a combination with coloring layers (color filters) is also possible. Furthermore, emission intensity of light with a specific wavelength in the front direction can be increased, whereby power consumption can be reduced.

In the light-emitting element of one embodiment of the present invention, at least one of the first electrode 201 and the second electrode 202 is a light-transmitting electrode (e.g., a transparent electrode or a transflective electrode). In the case where the light-transmitting electrode is a transparent electrode, the transparent electrode has a visible light transmittance of higher than or equal to 40%. In the case where the light-transmitting electrode is a transflective electrode, the transflective electrode has a visible light reflectance of higher than or equal to 20% and lower than or equal to 80%, and preferably higher than or equal to 40% and lower than or equal to 70%. These electrodes preferably have a resistivity of $1\times10^{-2}$ Ωcm or less.

Furthermore, when one of the first electrode 201 and the second electrode 202 is a reflective electrode in the light-emitting element of one embodiment of the present invention, the visible light reflectance of the reflective electrode is higher than or equal to 40% and lower than or equal to 100%, and preferably higher than or equal to 70% and lower than or equal to 100%. This electrode preferably has a resistivity of $1\times10^{-2}$ Ωcm or less.

<<Specific Structure and Fabrication Method of Light-Emitting Element>>

Specific structures and specific fabrication methods of light-emitting elements of embodiments of the present invention will be described with reference to FIGS. 2A to 2D. Here, a light-emitting element having the tandem structure in FIG. 2B and a microcavity structure will be described with reference to FIG. 2D. In the light-emitting element in FIG. 2D having a microcavity structure, the first electrode 201 is formed as a reflective electrode and the second electrode 202 is formed as a transflective electrode. Thus, a single-layer structure or a stacked-layer structure can be formed using one or more kinds of desired electrode materials. Note that the second electrode 202 is formed after formation of the EL layer 203b, with the use of a material selected as described above. For fabrication of these electrodes, a sputtering method or a vacuum evaporation method can be used.

<First Electrode and Second Electrode>

As materials used for the first electrode 201 and the second electrode 202, any of the materials below can be used in an appropriate combination as long as the functions of the electrodes described above can be fulfilled. For example, a metal, an alloy, an electrically conductive compound, a mixture of these, and the like can be appropriately used. Specifically, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

Figure 2D:
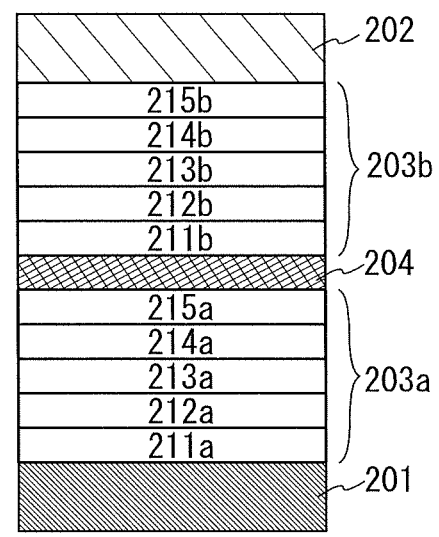

In the light-emitting element in FIG. 2D, when the first electrode 201 is an anode, a hole-injection layer 211a and a hole-transport layer 212a of the EL layer 203a are sequentially stacked over the first electrode 201 by a vacuum evaporation method. After the EL layer 203a and the charge generation layer 204 are formed, a hole-injection layer 211b and a hole-transport layer 212b of the EL layer 203b are sequentially stacked over the charge generation layer 204 in a similar manner.

<Hole-Injection Layer and Hole-Transport Layer>

The hole-injection layers (211, 211a, and 211b) inject holes from the first electrode 201 that is an anode or the charge generation layer (204) to the EL layers (203, 203a, and 203b) and each contain a material with a high hole-injection property.

As examples of the material with a high hole-injection property, transition metal oxides such as molybdenum oxide, vanadium oxide, ruthenium oxide, tungsten oxide, and manganese oxide can be given. Alternatively, it is possible to use any of the following materials: phthalocyanine-based compounds such as phthalocyanine (abbreviation: $H_2Pc$) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); and the like.

Alternatively, as the material with a high hole-injection property, a composite material containing a hole-transport material and an acceptor material (an electron-accepting material) can also be used. In that case, the acceptor material extracts electrons from a hole-transport material, so that holes are generated in the hole-injection layers (211, 211a, and 211b) and the holes are injected into the light-emitting layers (213, 213a, and 213b) through the hole-transport layers (212, 212a, and 212b). Note that each of the hole-injection layers (211, 211a, and 211b) may be formed to have a single-layer structure using a composite material containing a hole-transport material and an acceptor material (electron-accepting material), or a stacked-layer structure in which a layer including a hole-transport material and a layer including an acceptor material (electron-accepting material) are stacked.

The hole-transport layers (212, 212a, and 212b) transport the holes, which are injected from the first electrode 201 by the hole-injection layers (211, 211a, and 211b), to the light-emitting layers (213, 213a, and 213b). Note that the hole-transport layers (212, 212a, and 212b) each contain a hole-transport material. It is particularly preferable that the HOMO level of the hole-transport material included in the hole-transport layers (212, 212a, and 212b) be the same as or close to that of the hole-injection layers (211, 211a, and 211b).

Examples of the acceptor material used for the hole-injection layers (211, 211a, and 211b) include an oxide of a metal belonging to any of Group 4 to Group 8 of the periodic table. Specifically, molybdenum oxide, vanadium oxide, niobium oxide, tantalum oxide, chromium oxide, tungsten oxide, manganese oxide, and rhenium oxide can be given. Among these, molybdenum oxide is especially preferable since it is stable in the air, has a low hygroscopic property, and is easy to handle. Alternatively, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), or the like can be used.

The hole-transport materials used for the hole-injection layers (211, 211a, and 211b) and the hole-transport layers (212, 212a, and 212b) are preferably substances with a hole mobility of greater than or equal to $10^{-6}$ cm$^2$/Vs. Note that other substances may be used as long as the substances have a hole-transport property higher than an electron-transport property.

Preferred hole-transport materials are π-electron rich heteroaromatic compounds (e.g., carbazole derivatives and indole derivatives) and aromatic amine compounds, examples of which include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4''-tris(carbazol-9-yl)triphenylamine (abbreviation: TCTA), 4,4',4''-tris(N,N-diphenylamino)triphenylamine (abbreviation: TDATA), and 4,4',4''-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenyl-carbazol-3-yl)amino]-9-phenylcarbazole (abbreviation: PCzPCN1), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); compounds having a thiophene skeleton, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used.

Note that the hole-transport material is not limited to the above examples and may be one of or a combination of various known materials when used for the hole-injection layers (211, 211a, and 211b) and the hole-transport layers (212, 212a, and 212b). Note that the hole-transport layers (212, 212a, and 212b) may each be formed of a plurality of layers. That is, for example, the hole-transport layers may each have a stacked-layer structure of a first hole-transport layer and a second hole-transport layer.

In the light-emitting element in FIG. 2D, the light-emitting layer 213a is formed over the hole-transport layer 212a of the EL layer 203a by a vacuum evaporation method. After the EL layer 203a and the charge generation layer 204 are formed, the light-emitting layer 213b is formed over the hole-transport layer 212b of the EL layer 203b by a vacuum evaporation method.

<Light-Emitting Layer>

The light-emitting layers (213, 213a, and 213b) each contain a light-emitting substance. Note that as the light-emitting substance, a substance whose emission color is blue, violet, bluish violet, green, yellowish green, yellow, orange, red, or the like is appropriately used. When the plurality of light-emitting layers (213a and 213b) are formed using different light-emitting substances, different emission colors can be exhibited (for example, complementary emission colors are combined to achieve white light emission). Furthermore, a stacked-layer structure in which one light-emitting layer contains two or more kinds of light-emitting substances may be employed.

The light-emitting layers (213, 213a, and 213b) may each contain one or more kinds of organic compounds (a host material and an assist material) in addition to a light-emitting substance (guest material). As the one or more kinds of organic compounds, one or both of the hole-transport material and the electron-transport material described in this embodiment can be used.

In the light-emitting element of one embodiment of the present invention, it is preferable that a light-emitting substance which emits blue light (a blue-light-emitting substance) be used as a guest material in one of the light-emitting layers (213a and 213b) and a material which emits green light (a green-light-emitting substance) and a material which emits red light (a red-light-emitting substance) be used in the other light-emitting layer. This manner is effective in the case where the blue-light-emitting substance (the blue-light-emitting layer) has lower light luminous efficiency or a shorter lifetime than the materials (layers) which emit other colors. Here, it is preferable that a light-emitting substance that converts singlet excitation energy into light emission in the visible light range be used as the blue-light-emitting substance and light-emitting substances that convert triplet excitation energy into light emission in the visible light range be used as the green- and red-light-emitting substances, whereby the spectrum balance between R, G, and B is improved.

There is no particular limitation on the light-emitting substances that can be used for the light-emitting layers (213, 213a, and 213b), and a light-emitting substance that converts singlet excitation energy into light emission in the visible light range or a light-emitting substance that converts triplet excitation energy into light emission in the visible light range can be used. Examples of the light-emitting substance are given below.

As an example of the light-emitting substance that converts singlet excitation energy into light emission, a substance that emits fluorescence (fluorescent material) can be given. Examples of the substance that emits fluorescence include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b]naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N'-(pyrene-1,6-diyl)bis[(6,N-diphenylbenzo[b]naphtho[1,2-d]furan)-8-amine] (abbreviation: 1,6BnfAPrn-03).

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), or the like.

As examples of a light-emitting substance that converts triplet excitation energy into light emission, a substance that emits phosphorescence (phosphorescent material) and a thermally activated delayed fluorescence (TADF) material that exhibits thermally activated delayed fluorescence can be given.

Examples of a phosphorescent material include an organometallic complex, a metal complex (platinum complex), and a rare earth metal complex. These substances exhibit the respective emission colors (emission peaks) and thus, any of them is appropriately selected according to need.

As examples of a phosphorescent material which emits blue or green light and whose emission spectrum has a peak wavelength at greater than or equal to 450 nm and less than or equal to 570 nm, the following substances can be given.

For example, organometallic complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-triazolato]iridium(III) (abbreviation: [Ir(Mptz-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-]phenanthridinato]iridium(III) (abbreviation: [Ir(dmpimpt-Me)$_3$]); organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)); and the like can be given.

As examples of a phosphorescent material which emits green or yellow light and whose emission spectrum has a peak wavelength at greater than or equal to 495 nm and less than or equal to 590 nm, the following substances can be given.

For example, organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium(III) (abbreviation: [Ir(dppm)$_2$(acac)]); organometallic iridium complexes having a pyrazine skeleton, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N, C$^{2'}$)iridium(III) (abbreviation: [Ir(ppy)$_3$]), bis(2-phenylpyridinato-N, C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis(2-phenylbenzothiazolato-N,C$^{2'}$)iridium(III) acetylacetonate (abbreviation: [Ir(bt)$_2$(acac)]); and rare earth metal complexes such as tris(acetylacetonato)(monophenanthroline)terbium(III) (abbreviation: [Tb(acac)$_3$(Phen)]) can be given.

Among the above, an organometallic complex having a pyridine skeleton (particularly, a phenylpyridine skeleton) or a pyrimidine skeleton is a group of compounds effective for meeting the chromaticity of green in one embodiment of the present invention.

As examples of a phosphorescent material which emits yellow or red light and whose emission spectrum has a peak wavelength at greater than or equal to 570 nm and less than or equal to 750 nm, the following substances can be given.

For example, organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(d1npm)$_2$(dpm)]); organometallic complexes having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN]phenyl-KC}(2,2,6,6-tetramethyl-3,5-heptanedionato-κ$^2$O,O')iridium(III) (abbreviation: [Ir(dmdppr-dmCP)$_2$(dpm)]), (acetylacetonato)bis[2-methyl-3-phenylquinoxalinato-N,C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]) can be given.

Among the above, an organometallic iridium complex having a pyrazine skeleton is a group of compounds effective for meeting the chromaticity of red in one embodiment of the present invention. In particular, an organometallic iridium complex containing a cyano group (e.g., [Ir(dmdppr-dmCP)$_2$(dpm)]) is preferable because it is stable.

Note that as the blue-light-emitting substance, a material whose photoluminescence peak wavelength is greater than or equal to 430 nm and less than or equal to 470 nm, preferably greater than or equal to 430 nm and less than or equal to 460 nm may be used. As the green-light-emitting substance, a material whose photoluminescence peak wavelength is greater than or equal to 500 nm and less than or equal to 540 nm, preferably greater than or equal to 500 nm and less than or equal to 530 nm may be used. As the red-light-emitting substance, a material whose photoluminescence peak wavelength is greater than or equal to 610 nm and less than or equal to 680 nm, preferably greater than or equal to 620 nm and less than or equal to 680 nm may be used. Note that the photoluminescence may be measured with either a solution or a thin film.

With the parallel use of such compounds and microcavity effect, the above chromaticity can be more easily met. Here, a transflective electrode (a metal thin film portion) that is needed for obtaining microcavity effect preferably has a thickness greater than or equal to 20 nm and less than or equal to 40 nm, and further preferably greater than 25 nm and less than or equal to 40 nm. However, the thickness greater than 40 nm possibly reduces the efficiency.

As the organic compounds (the host material and the assist material) used in the light-emitting layers (213, 213a, and 213b), one or more kinds of substances having a larger energy gap than the light-emitting substance (the guest material) are used. Note that any of the hole-transport materials listed above and the electron-transport materials given below may be used as the organic compounds (the host material and the assist material).

When the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) which is higher than that of the light-emitting substance is preferably selected as the host material. In that case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, and the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl] benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis (naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p] chrysene derivatives can be used. Specifically, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl) amino]anthracene (abbreviation: 2PCAPA), 6,12-dimethoxy-5,11-diphenylchrysene, N,N,N',N',N",N",N'",N'"-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like can be used.

In the case where a plurality of organic compounds are used for the light-emitting layers (213, 213a, and 213b), it is preferable to use compounds that form an exciplex in combination with a light-emitting substance. In that case, although any of various organic compounds can be combined appropriately to be used, to form an exciplex efficiently, it is particularly preferable to combine a compound that easily accepts holes (hole-transport material) and a compound that easily accepts electrons (electron-transport material). As the hole-transport material and the electron-transport material, specifically, any of the materials described in this embodiment can be used.

The TADF material is a material that can up-convert a triplet excited state into a singlet excited state (i.e., reverse intersystem crossing is possible) using a little thermal energy and efficiently exhibits light emission (fluorescence) from the singlet excited state. The TADF is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $10^{-6}$ seconds or longer, preferably $10^{-3}$ seconds or longer.

Examples of the TADF material include fullerene, a derivative thereof, an acridine derivative such as proflavine, and eosin. Other examples include a metal-containing porphyrin, such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl) phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA) can be used. Note that a substance in which the π-electron rich heteroaromatic ring is directly bonded to the π-electron deficient heteroaromatic ring is particularly preferable because both the donor property of the π-electron rich heteroaromatic ring and the acceptor property of the π-electron deficient heteroaromatic ring are increased and the energy difference between the singlet excited state and the triplet excited state becomes small.

Note that when a TADF material is used, the TADF material can be combined with another organic compound.

In the light-emitting element in FIG. 2D, the electron-transport layer 214a is formed over the light-emitting layer 213a of the EL layer 203a by a vacuum evaporation method. After the EL layer 203a and the charge generation layer 204 are formed, the electron-transport layer 214b is formed over the light-emitting layer 213b of the EL layer 203b by a vacuum evaporation method.

<Electron-Transport Layer>

The electron-transport layers (214, 214a, and 214b) transport the electrons, which are injected from the second electrode 202 by the electron-injection layers (215, 215a, and 215b), to the light-emitting layers (213, 213a, and 213b). Note that the electron-transport layers (214, 214a, and 214b) each contain an electron-transport material. It is preferable that the electron-transport materials included in the electron-transport layers (214, 214a, and 214b) be substances with an electron mobility of higher than or equal to $1 \times 10^{-6}$ cm$^2$/Vs. Note that other substances may also be used as long as the substances have an electron-transport property higher than a hole-transport property.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use metal complexes such as $Alq_3$, tris(4-methyl-8-quinolinolato)aluminum (abbreviation: $Almq_3$), bis(10-hydroxybenzo[h]quinolinato)beryllium (abbreviation: $BeBq_2$), BAlq, Zn(BOX)$_2$, and bis[2-(2-hydroxyphenyl)benzothiazolato]zinc (abbreviation: Zn(BTZ)$_2$), heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs), and quinoxaline derivatives and dibenzoquinoxaline derivatives such as 2-[3-(dibenzothiophen-4-yl)phenyl]dibenzo[fh]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[/h]quinoxaline (abbreviation: 2CzPDBq-III), 7-[3-(dibenzothiophen-4-yl)phenyl]dibenzo[f h]quinoxaline (abbreviation: 7mDBTPDBq-II), and 6-[3-(dibenzothiophen-4-yl)phenyl]dibenzo[fh]quinoxaline (abbreviation: 6mDBTPDBq-II).

Alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

Each of the electron-transport layers (214, 214a, and 214b) is not limited to a single layer, but may be a stack of two or more layers each containing any of the above substances.

In the light-emitting element in FIG. 2D, the electron-injection layer 215a is formed over the electron-transport layer 214a of the EL layer 203a by a vacuum evaporation method. Subsequently, the EL layer 203a and the charge generation layer 204 are formed, the components up to the electron-transport layer 214b of the EL layer 203b are formed and then, the electron-injection layer 215b is formed thereover by a vacuum evaporation method.

<Electron-Injection Layer>

The electron-injection layers (215, 215a, and 215b) each contain a substance having a high electron-injection property. The electron-injection layers (215, 215a, and 215b) can each be formed using an alkali metal, an alkaline earth metal, or a compound thereof, such as lithium fluoride (LiF), cesium fluoride (CsF), calcium fluoride (CaF$_2$), or lithium oxide (LiO$_x$). A rare earth metal compound like erbium fluoride (ErF$_3$) can also be used. Electride may also be used for the electron-injection layers (215, 215a, and 215b). Examples of the electride include a substance in which electrons are added at high concentration to calcium oxide-aluminum oxide. Any of the substances for forming the electron-transport layers (214, 214a, and 214b), which are given above, can also be used.

A composite material in which an organic compound and an electron donor (donor) are mixed may also be used for the electron-injection layers (215, 215a, and 215b). Such a composite material is excellent in an electron-injection property and an electron-transport property because electrons are generated in the organic compound by the electron donor. The organic compound here is preferably a material excellent in transporting the generated electrons; specifically, for example, the electron-transport materials for forming the electron-transport layers (214, 214a, and 214b) (e.g., a metal complex or a heteroaromatic compound) can be used. As the electron donor, a substance showing an electron-donating property with respect to the organic compound may be used. Preferable examples are an alkali metal, an alkaline earth metal, and a rare earth metal. Specifically, lithium, cesium, magnesium, calcium, erbium, ytterbium, and the like can be given. Furthermore, an alkali metal oxide and an alkaline earth metal oxide are preferable, and a lithium oxide, a calcium oxide, a barium oxide, and the like can be given. Alternatively, a Lewis base such as magnesium oxide can be used. Further alternatively, an organic compound such as tetrathiafulvalene (abbreviation: TTF) can be used.

In the case where light obtained from the light-emitting layer 213b is amplified in the light-emitting element illustrated in FIG. 2D, for example, the optical path length between the second electrode 202 and the light-emitting layer 213b is preferably less than one fourth of the wavelength λ of light emitted from the light-emitting layer 213b. In that case, the optical path length can be adjusted by changing the thickness of the electron-transport layer 214b or the electron-injection layer 215b.

<Charge Generation Layer>

In the light-emitting element illustrated in FIG. 2D, the charge generation layer 204 has a function of injecting electrons into the EL layer 203a and injecting holes into the EL layer 203b when a voltage is applied between the first electrode (anode) 201 and the second electrode (cathode) 202. The charge generation layer 204 may have either a structure in which an electron acceptor (acceptor) is added to a hole-transport material or a structure in which an electron donor (donor) is added to an electron-transport material. Alternatively, both of these structures may be stacked. Note that forming the charge generation layer 204 by using any of the above materials can suppress an increase in drive voltage caused by the stack of the EL layers.

In the case where the charge generation layer 204 has a structure in which an electron acceptor is added to a hole-transport material, any of the materials described in this embodiment can be used as the hole-transport material. As the electron acceptor, it is possible to use 7,7,8,8-tetracyano-2,3,5,6-tetrafluoroquinodimethane (abbreviation: F$_4$-TCNQ), chloranil, and the like. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, rhenium oxide, or the like is used.

In the case where the charge generation layer 204 has a structure in which an electron donor is added to an electron-transport material, any of the materials described in this embodiment can be used as the electron-transport material. As the electron donor, it is possible to use an alkali metal, an alkaline earth metal, a rare earth metal, metals that belong to Groups 2 and 13 of the periodic table, or an oxide or carbonate thereof. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used as the electron donor.

<Substrate>

The light-emitting element described in this embodiment can be formed over any of a variety of substrates. Note that the type of the substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of a flexible substrate, an attachment film, and a base material film include plastics typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper.

For fabrication of the light-emitting element in this embodiment, a vacuum process such as an evaporation method or a solution process such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the functional layers (the hole-injection layers (211a and 211b), the hole-transport layers (212a and 212b), the light-emitting layers (213a and 213b), the electron-transport layers (214a and 214b), the electron-injection layers (215a and 215b)) included in the EL layers and the charge generation layer 204 of the light-emitting element can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, micro-contact printing, or nanoimprint lithography), or the like.

Note that materials that can be used for the functional layers (the hole-injection layers (211a and 211b), the hole-transport layers (212a and 212b), the light-emitting layers (213a and 213b), the electron-transport layers (214a and 214b), and the electron-injection layers (215a and 215b)) that are included in the EL layers (203a and 203b) and the charge generation layer 204 in the light-emitting element described in this embodiment are not limited to the above materials, and other materials can be used in combination as long as the functions of the layers are fulfilled. For example, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot may be a colloidal quantum dot, an alloyed quantum dot, a core-shell quantum dot, a core quantum dot, or the like.

The structures described in this embodiment can be combined with any of the structures described in the other embodiments as appropriate.

Embodiment 3

Figure 3A:
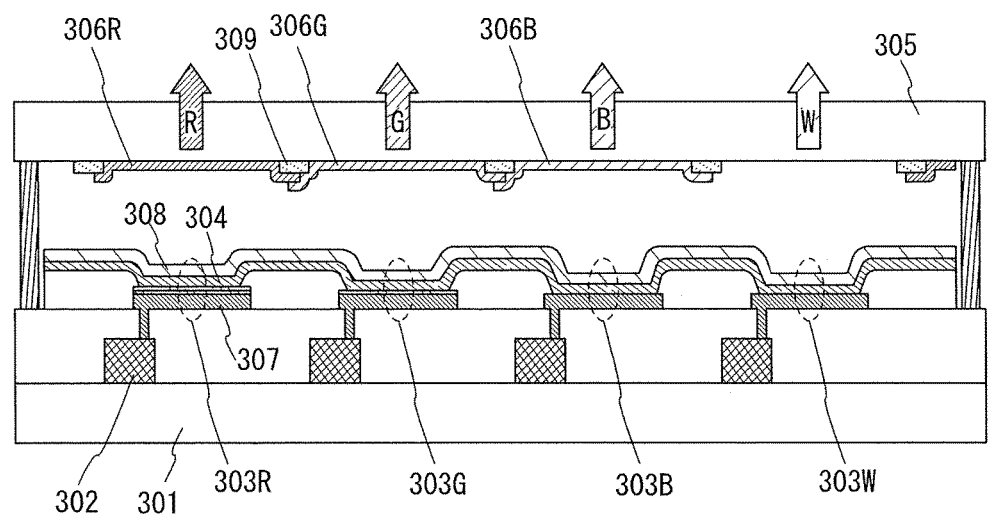
FIGS. 3A and 3B illustrate a light-emitting device.

In this embodiment, the light-emitting device of one embodiment of the present invention will be described with reference to FIG. 3A. Note that a light-emitting device illustrated in FIG. 3A is an active matrix light-emitting device in which transistors (FETs) 302 are electrically connected to light-emitting elements (303R, 303G, 303B, and 303W) over a first substrate 301. The plurality of light-emitting elements (303R, 303G, 303B, and 303W) include a common EL layer 304 and each have a microcavity structure in which the optical path length between electrodes is adjusted depending on the emission color of the light-emitting element. The light-emitting device is a top-emission light-emitting device in which light is emitted from the EL layer 304 through color filters (306R, 306G, and 306B) formed on a second substrate 305.

The light-emitting device illustrated in FIG. 3A is fabricated such that a first electrode 307 functions as a reflective electrode and a second electrode 308 functions as a transflective electrode. Note that description in any of the other embodiments can be referred to as appropriate for electrode materials for the first electrode 307 and the second electrode 308.

Figure 3B:
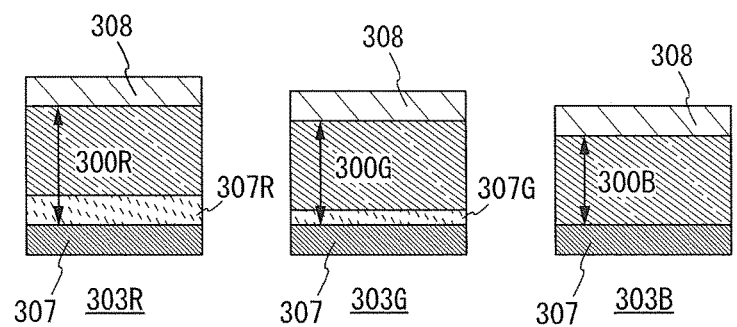

In the case where the light-emitting element 303R functions as a red light-emitting element, the light-emitting element 303G functions as a green light-emitting element, the light-emitting element 303B functions as a blue light-emitting element, and the light-emitting element 303W functions as a white light-emitting element in FIG. 3A, for example, a gap between the first electrode 307 and the second electrode 308 in the light-emitting element 303R is adjusted to have an optical path length 300R, a gap between the first electrode 307 and the second electrode 308 in the light-emitting element 303G is adjusted to have an optical path length 300G, and a gap between the first electrode 307 and the second electrode 308 in the light-emitting element 303B is adjusted to have an optical path length 300B as illustrated in FIG. 3B. Note that optical adjustment can be performed in such a manner that a conductive layer 307R is stacked over the first electrode 307 in the light-emitting element 303R and a conductive layer 307G is stacked over the first electrode 307 in the light-emitting element 303G as illustrated in FIG. 3B.

The second substrate 305 is provided with the color filters (306R, 306G, and 306B). Note that the color filters each transmit visible light in a specific wavelength range and blocks visible light in a specific wavelength range. Thus, as illustrated in FIG. 3A, the color filter 306R that transmits only light in the red wavelength range is provided in a position overlapping with the light-emitting element 303R, whereby red light emission can be obtained from the light-emitting element 303R. Furthermore, the color filter 306G that transmits only light in the green wavelength range is provided in a position overlapping with the light-emitting element 303G, whereby green light emission can be obtained from the light-emitting element 303G. Moreover, the color filter 306B that transmits only light in the blue wavelength range is provided in a position overlapping with the light-emitting element 303B, whereby blue light emission can be obtained from the light-emitting element 303B. Note that the light-emitting element 303W can emit white light without a color filter. Note that a black layer (black matrix) 309 may be provided at an end portion of each color filter. The color filters (306R, 306G, and 306B) and the black layer 309 may be covered with an overcoat layer formed using a transparent material.

Although the light-emitting device in FIG. 3A has a structure in which light is extracted from the second substrate 305 side (top emission structure), a structure in which light is extracted from the first substrate 301 side where the FETs 302 are formed (bottom emission structure) may be employed. Note that in the light-emitting device having a top emission structure, the first substrate 301 can be a light-blocking substrate or a light-transmitting substrate, whereas in a light-emitting device having a bottom emission structure, the first substrate 301 needs to be a light-transmitting substrate.

In FIG. 3A, the light-emitting elements are the red light-emitting element, the green light-emitting element, the blue light-emitting element, and the white light-emitting element; however, the light-emitting elements of one embodiment of the present invention are not limited to the above, and a yellow light-emitting element or an orange light-emitting element may be used. Note that description in any of the other embodiments can be referred to as appropriate for materials that are used for the EL layers (a light-emitting layer, a hole-injection layer, a hole-transport layer, an electron-transport layer, an electron-injection layer, a charge generation layer, and the like) to fabricate each of the light-emitting elements. In that case, a color filter needs to be appropriately selected depending on the emission color of the light-emitting element.

With the above structure, a light-emitting device including light-emitting elements that exhibit a plurality of emission colors can be fabricated.

Note that the structures described in this embodiment can be combined with any of the structures described in the other embodiments as appropriate.

Embodiment 4

In this embodiment, a light-emitting device that is one embodiment of the present invention will be described.

The use of the element structure of the light-emitting element of one embodiment of the present invention allows fabrication of an active matrix light-emitting device or a passive matrix light-emitting device. Note that an active matrix light-emitting device has a structure including a combination of a light-emitting element and a transistor (FET). Thus, each of a passive matrix light-emitting device and an active matrix light-emitting device is one embodiment of the present invention. Note that any of the light-emitting elements described in other embodiments can be used in the light-emitting device described in this embodiment.

In this embodiment, an active matrix light-emitting device will be described with reference to FIGS. 4A and 4B.

Figure 4A:
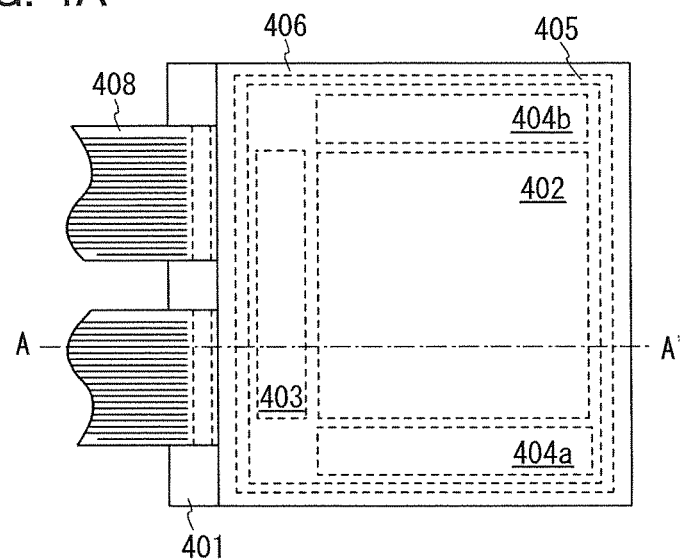
FIGS. 4A and 4B illustrate a light-emitting device.
Figure 4B:
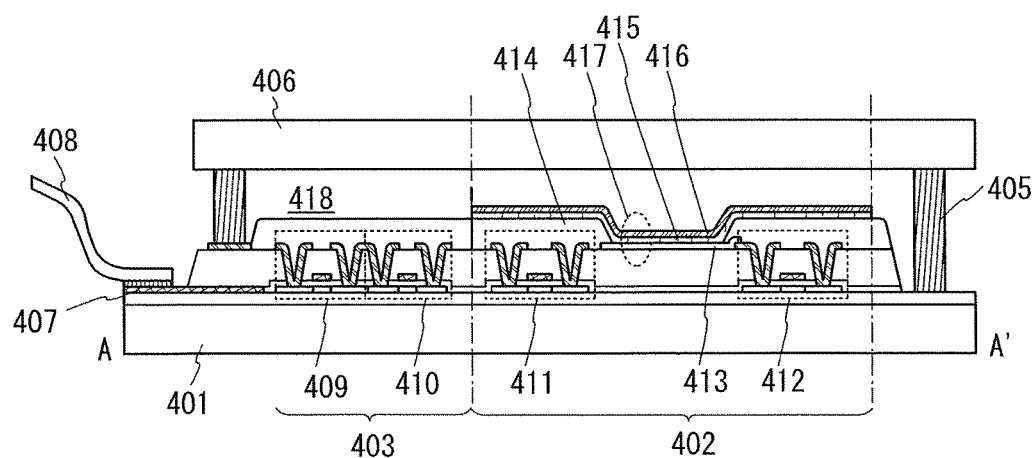

FIG. 4A is a top view illustrating the light-emitting device and FIG. 4B is a cross-sectional view taken along chain line A-A' in FIG. 4A. The active matrix light-emitting device includes a pixel portion 402, a driver circuit portion (source line driver circuit) 403, and driver circuit portions (gate line driver circuits) (404a and 404b) that are provided over a first substrate 401. The pixel portion 402 and the driver circuit portions (403, 404a, and 404b) are sealed between the first substrate 401 and a second substrate 406 with a sealant 405.

A lead wiring 407 is provided over the first substrate 401. The lead wiring 407 is connected to an FPC 408 that is an external input terminal. Note that the FPC 408 transmits a signal (e.g., a video signal, a clock signal, a start signal, or a reset signal) or a potential from the outside to the driver circuit portions (403, 404a, and 404b). The FPC 408 may be provided with a printed wiring board (PWB). Note that the light-emitting device provided with an FPC or a PWB is included in the category of a light-emitting device.

FIG. 4B illustrates a cross-sectional structure of the light-emitting device.

The pixel portion 402 includes a plurality of pixels each of which includes an FET (switching FET) 411, an FET (current control FET) 412, and a first electrode 413 electrically connected to the FET 412. Note that the number of FETs included in each pixel is not particularly limited and can be set appropriately.

As FETs 409, 410, 411, and 412, for example, a staggered transistor or an inverted staggered transistor can be used without particular limitation. A top-gate transistor, a bottom-gate transistor, or the like may be used.

Note that there is no particular limitation on the crystallinity of a semiconductor that can be used for the FETs 409, 410, 411, and 412, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

For the semiconductor, a Group 14 element, a compound semiconductor, an oxide semiconductor, an organic semiconductor, or the like can be used, for example. As a typical example, a semiconductor containing silicon, a semiconductor containing gallium arsenide, or an oxide semiconductor containing indium can be used.

The driver circuit portion 403 includes the FET 409 and the FET 410. The FET 409 and the FET 410 may be formed with a circuit including transistors having the same conductivity type (either n-channel transistors or p-channel transistors) or a CMOS circuit including an n-channel transistor and a p-channel transistor. Furthermore, a driver circuit may be provided outside.

An end portion of the first electrode 413 is covered with an insulator 414. The insulator 414 can be formed using an organic compound such as a negative photosensitive resin or a positive photosensitive resin (acrylic resin), or an inorganic compound such as silicon oxide, silicon oxynitride, or silicon nitride. The insulator 414 preferably has a curved surface with curvature at an upper end portion or a lower end portion thereof. In that case, favorable coverage with a film formed over the insulator 414 can be obtained.

An EL layer 415 and a second electrode 416 are stacked over the first electrode 413. The EL layer 415 includes a light-emitting layer, a hole-injection layer, a hole-transport layer, an electron-transport layer, an electron-injection layer, a charge generation layer, and the like.

The structure and materials described in any of the other embodiments can be used for the components of a light-emitting element 417 described in this embodiment. Although not illustrated, the second electrode 416 is electrically connected to the FPC 408 that is an external input terminal.

Although the cross-sectional view in FIG. 4B illustrates only one light-emitting element 417, a plurality of light-emitting elements are arranged in a matrix in the pixel portion 402. Light-emitting elements that emit light of three kinds of colors (R, G, and B) are selectively formed in the pixel portion 402, whereby a light-emitting device capable of displaying a full-color image can be obtained. In addition to the light-emitting elements that emit light of three kinds of colors (R, G, and B), for example, light-emitting elements that emit light of white (W), yellow (Y), magenta (M), cyan (C), and the like may be formed. For example, the light-emitting elements that emit light of some of the above colors are used in combination with the light-emitting elements that emit light of three kinds of colors (R, G, and B), whereby effects such as an improvement in color purity and a reduction in power consumption can be achieved. Alternatively, a light-emitting device which is capable of displaying a full-color image may be fabricated by a combination with color filters.

When the second substrate 406 and the first substrate 401 are bonded to each other with the sealant 405, the FETs (409, 410, 411, and 412) and the light-emitting element 417 over the first substrate 401 are provided in a space 418 surrounded by the first substrate 401, the second substrate 406, and the sealant 405. Note that the space 418 may be filled with an inert gas (e.g., nitrogen or argon) or an organic substance (including the sealant 405).

An epoxy-based resin, glass frit, or the like can be used for the sealant 405. It is preferable to use a material that is permeable to as little moisture and oxygen as possible for the sealant 405. As the second substrate 406, a substrate that can be used as the first substrate 401 can be similarly used. Thus, any of the various substrates described in the other embodiments can be appropriately used. As the substrate, a glass substrate, a quartz substrate, or a plastic substrate made of fiber reinforced plastic (FRP), polyvinyl fluoride (PVF), polyester, acrylic, or the like can be used. In the case where glass frit is used for the sealant, the first substrate 401 and the second substrate 406 are preferably glass substrates in terms of adhesion.

Accordingly, the active matrix light-emitting device can be obtained.

In the case where the active matrix light-emitting device is provided over a flexible substrate, the FETs and the light-emitting element may be directly formed over the flexible substrate; alternatively, the FETs and the light-emitting element may be formed over a substrate provided with a separation layer and then separated at the separation layer by application of heat, force, laser, or the like to be transferred to a flexible substrate. For the separation layer, a stack including inorganic films such as a tungsten film and a silicon oxide film, or an organic resin film of polyimide or the like can be used, for example. Examples of the flexible substrate include, in addition to a substrate over which a transistor can be formed, a paper substrate, a cellophane substrate, an aramid film substrate, a polyimide film substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. With the use of any of these substrates, an increase in durability, an increase in heat resistance, a reduction in weight, and a reduction in thickness can be achieved.

Note that the structures described in this embodiment can be combined with any of the structures described in the other embodiments as appropriate.

Embodiment 5

In this embodiment, examples of a variety of electronic devices and an automobile manufactured using a light-emitting device of one embodiment of the present invention will be described.

Examples of the electronic device including the light-emitting device are television devices (also referred to as TV or television receivers), monitors for computers and the like, cameras such as digital cameras and digital video cameras, digital photo frames, cellular phones (also referred to as mobile phones or portable telephone devices), portable game machines, portable information terminals, audio playback devices, large game machines such as pachinko machines, and the like. Specific examples of the electronic devices are illustrated in FIGS. 5A, 5B, 5C, 5D, 5D'-1, and 5D'-2 and FIGS. 6A to 6C.

Figure 5A:
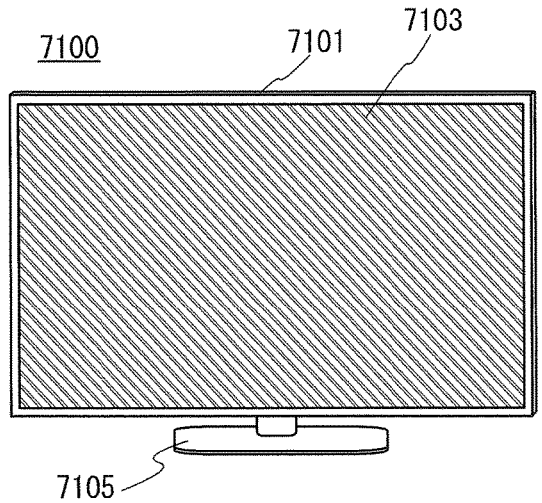
FIGS. 5A, 5B, 5C, 5D, 5D'-1, and 5D'-2 illustrate electronic devices.

FIG. 5A illustrates an example of a television device. In a television device 7100, a display portion 7103 is incorporated in a housing 7101. The display portion 7103 can display images and may be a touch panel (input/output device) including a touch sensor (input device). Note that the light-emitting device of one embodiment of the present invention can be used for the display portion 7103. In addition, here, the housing 7101 is supported by a stand 7105.

The television device 7100 can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasts can be received. Moreover, when the television device is connected to a communication network with or without wires via the modem, one-way (from a sender to a receiver) or two-way (between a sender and a receiver or between receivers) information communication can be performed.

Figure 5B:
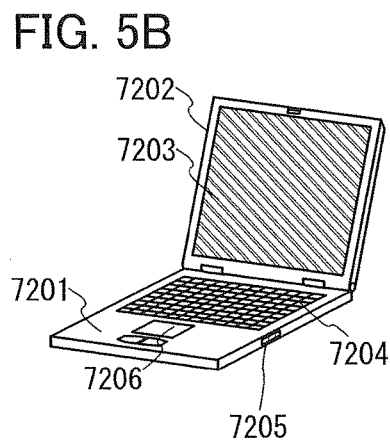

FIG. 5B illustrates a computer, which includes a main body 7201, a housing 7202, a display portion 7203, a keyboard 7204, an external connection port 7205, a pointing device 7206, and the like. Note that this computer can be manufactured using the light-emitting device of one embodiment of the present invention for the display portion 7203. The display portion 7203 may be a touch panel (input/output device) including a touch sensor (input device).

Figure 5C:
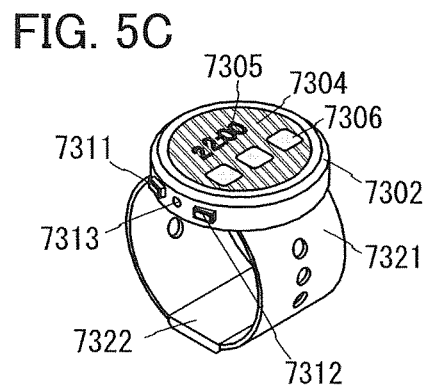

FIG. 5C illustrates a smart watch, which includes a housing 7302, a display portion 7304, operation buttons 7311 and 7312, a connection terminal 7313, a band 7321, a clasp 7322, and the like.

The display portion 7304 mounted in the housing 7302 serving as a bezel includes a non-rectangular display region. The display portion 7304 can display an icon 7305 indicating time, another icon 7306, and the like. The display portion 7304 may be a touch panel (input/output device) including a touch sensor (input device).

The smart watch illustrated in FIG. 5C can have a variety of functions, such as a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display portion 7304.

Figure 5D:
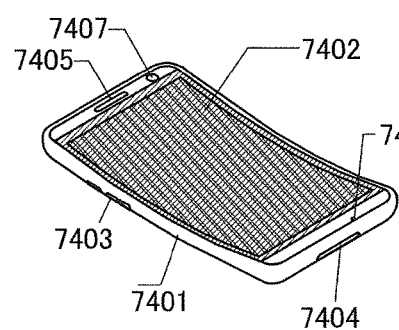
Figure 5D:
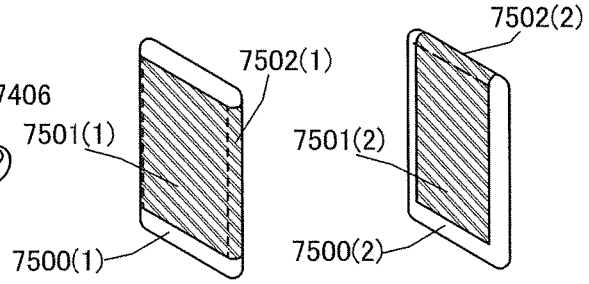

FIG. 5D illustrates an example of a cellular phone (e.g., smartphone). A cellular phone 7400 includes a housing 7401 provided with a display portion 7402, a microphone 7406, a speaker 7405, a camera 7407, an external connection portion 7404, an operation button 7403, and the like. In the case where a light-emitting device is manufactured by forming the light-emitting element of one embodiment of the present invention over a flexible substrate, the light-emitting device can be used for the display portion 7402 having a curved surface as illustrated in FIG. 5D.

When the display portion 7402 of the cellular phone 7400 illustrated in FIG. 5D is touched with a finger or the like, data can be input to the cellular phone 7400. In addition, operations such as making a call and composing e-mail can be performed by touch on the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or composing e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device such as a gyroscope sensor or an acceleration sensor is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. In addition, by providing a backlight or a sensing light source that emits near-infrared light in the display portion, an image of a finger vein, a palm vein, or the like can be taken.

The light-emitting device can be used for a cellular phone having a structure illustrated in FIG. 5D'-1 or FIG. 5D'-2, which is another structure of the cellular phone (e.g., smartphone).

Note that in the case of the structure illustrated in FIG. 5D'-1 or FIG. 5D'-2, text data, image data, or the like can be displayed on second screens 7502(1) and 7502(2) of housings 7500(1) and 7500(2) as well as first screens 7501(1) and 7501(2). Such a structure enables a user to easily see text data, image data, or the like displayed on the second screens 7502(1) and 7502(2) while the cellular phone is placed in the user's breast pocket.

Figure 6A:
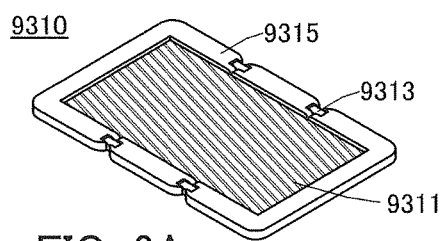
FIGS. 6A to 6C illustrate an electronic device.
Figure 6B:
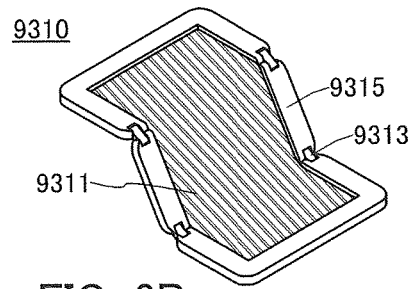
Figure 6C:
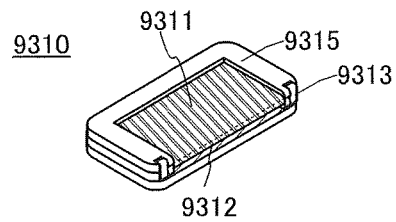

Another electronic device including a light-emitting device is a foldable portable information terminal illustrated in FIGS. 6A to 6C. FIG. 6A illustrates a portable information terminal 9310 which is opened. FIG. 6B illustrates the portable information terminal 9310 which is being opened or being folded. FIG. 6C illustrates the portable information terminal 9310 which is folded. The portable information terminal 9310 is highly portable when folded. The portable information terminal 9310 is highly browsable when opened because of a seamless large display region.

A display portion 9311 is supported by three housings 9315 joined together by hinges 9313. Note that the display portion 9311 may be a touch panel (input/output device) including a touch sensor (input device). By bending the display portion 9311 at a connection portion between two housings 9315 with the use of the hinges 9313, the portable information terminal 9310 can be reversibly changed in shape from an opened state to a folded state. The light-emitting device of one embodiment of the present invention can be used for the display portion 9311. A display region 9312 in the display portion 9311 is a display region that is positioned at a side surface of the portable information terminal 9310 which is folded. On the display region 9312, information icons, file shortcuts of frequently used applications or programs, and the like can be displayed, and confirmation of information and start of application and the like can be smoothly performed.

Figure 7A:
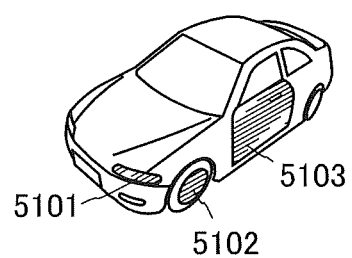
FIGS. 7A and 7B illustrate an automobile.
Figure 7B:
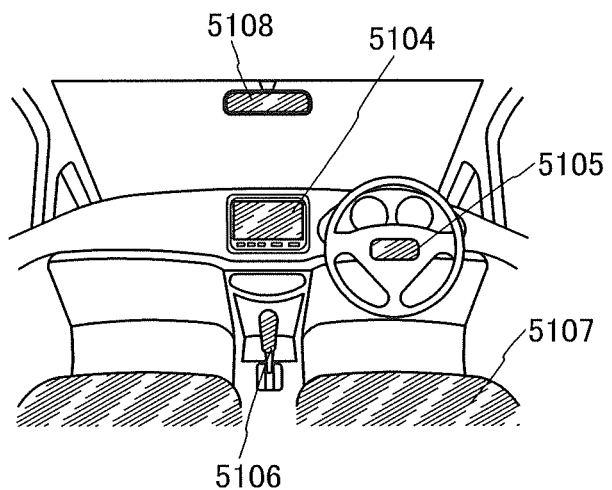

FIGS. 7A and 7B illustrate an automobile including a light-emitting device. The light-emitting device can be incorporated in the automobile, and specifically, can be included in lights 5101 (including lights of the rear part of the car), a wheel cover 5102, a part or the whole of a door 5103, or the like on the outer side of the automobile which is illustrated in FIG. 7A. The light-emitting device can also be included in a display portion 5104, a steering wheel 5105, a gear lever 5106, a seat 5107, an inner rearview mirror 5108, or the like on the inner side of the automobile which is illustrated in FIG. 7B, or in a part of a glass window.

As described above, the electronic devices and the automobile can be obtained using the light-emitting device of one embodiment of the present invention. Note that the light-emitting device can be used for electronic devices and automobiles in a variety of fields without being limited to those described in this embodiment.

Note that the structures described in this embodiment can be combined with any of the structures described in the other embodiments as appropriate.

Embodiment 6

In this embodiment, the structures of lighting devices fabricated using the light-emitting device of one embodiment of the present invention or a light-emitting element which is a part of the light-emitting device will be described with reference to FIGS. 8A to 8D.

Figure 8A:
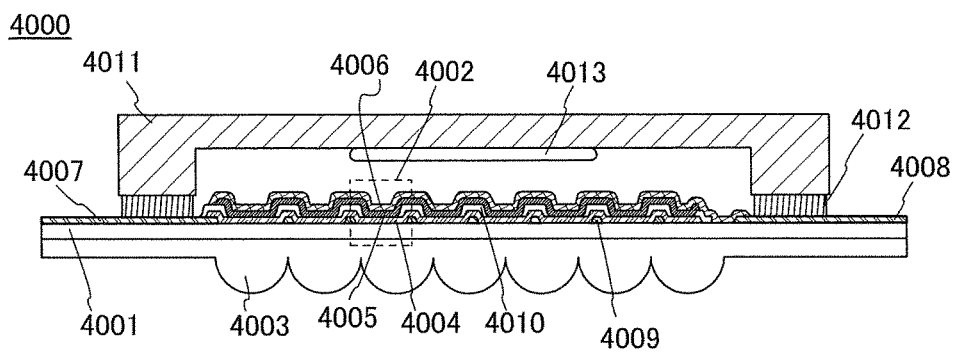
FIGS. 8A to 8D each illustrate a lighting device.
Figure 8B:
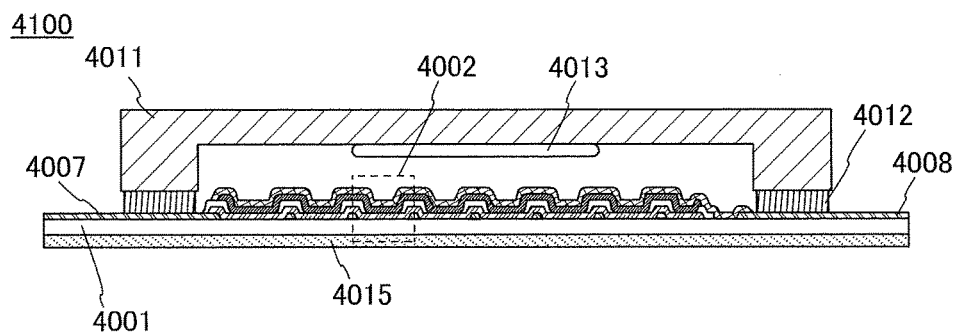
Figure 8C:
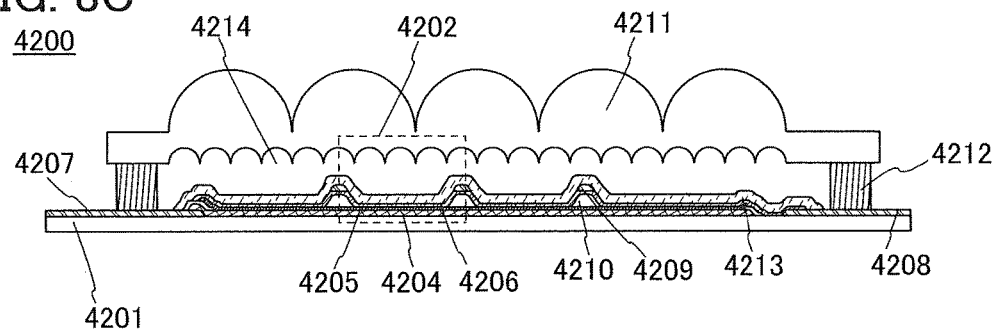
Figure 8D:
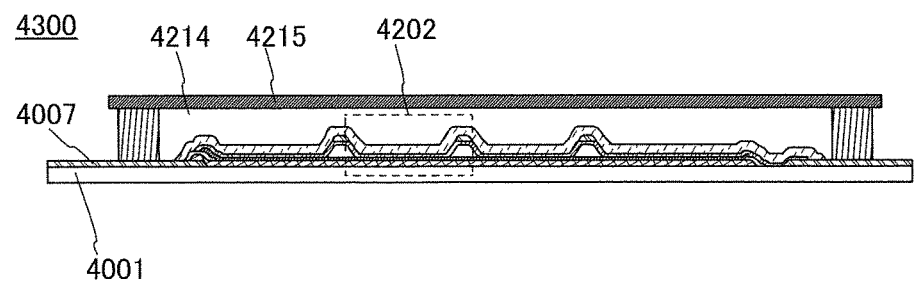

FIGS. 8A to 8D are examples of cross-sectional views of lighting devices. FIGS. 8A and 8B illustrate bottom-emission lighting devices in which light is extracted from the substrate side, and FIGS. 8C and 8D illustrate top-emission lighting devices in which light is extracted from the sealing substrate side.

A lighting device 4000 illustrated in FIG. 8A includes a light-emitting element 4002 over a substrate 4001. In addition, the lighting device 4000 includes a substrate 4003 with unevenness on the outside of the substrate 4001. The light-emitting element 4002 includes a first electrode 4004, an EL layer 4005, and a second electrode 4006.

The first electrode 4004 is electrically connected to an electrode 4007, and the second electrode 4006 is electrically connected to an electrode 4008. In addition, an auxiliary wiring 4009 electrically connected to the first electrode 4004 may be provided. Note that an insulating layer 4010 is formed over the auxiliary wiring 4009.

The substrate 4001 and a sealing substrate 4011 are bonded to each other with a sealant 4012. A desiccant 4013 is preferably provided between the sealing substrate 4011 and the light-emitting element 4002. The substrate 4003 has the unevenness illustrated in FIG. 8A, whereby the extraction efficiency of light emitted from the light-emitting element 4002 can be increased.

Instead of the substrate 4003, a diffusion plate 4015 may be provided on the outside of the substrate 4001 as in a lighting device 4100 illustrated in FIG. 8B.

A lighting device 4200 illustrated in FIG. 8C includes a light-emitting element 4202 over a substrate 4201. The light-emitting element 4202 includes a first electrode 4204, an EL layer 4205, and a second electrode 4206.

The first electrode 4204 is electrically connected to an electrode 4207, and the second electrode 4206 is electrically connected to an electrode 4208. An auxiliary wiring 4209 electrically connected to the second electrode 4206 may be provided. An insulating layer 4210 may be provided under the auxiliary wiring 4209.

The substrate 4201 and a sealing substrate 4211 with unevenness are bonded to each other with a sealant 4212. A barrier film 4213 and a planarization film 4214 may be provided between the sealing substrate 4211 and the light-emitting element 4202. The sealing substrate 4211 has the unevenness illustrated in FIG. 8C, whereby the extraction efficiency of light emitted from the light-emitting element 4202 can be increased.

Instead of the sealing substrate 4211, a diffusion plate 4215 may be provided over the light-emitting element 4202 as in a lighting device 4300 illustrated in FIG. 8D.

Note that with the use of the light-emitting device of one embodiment of the present invention or a light-emitting element which is a part of the light-emitting device as described in this embodiment, a lighting device having desired chromaticity can be provided.

Note that the structures described in this embodiment can be combined with any of the structures described in the other embodiments as appropriate.

Embodiment 7

Figure 9:
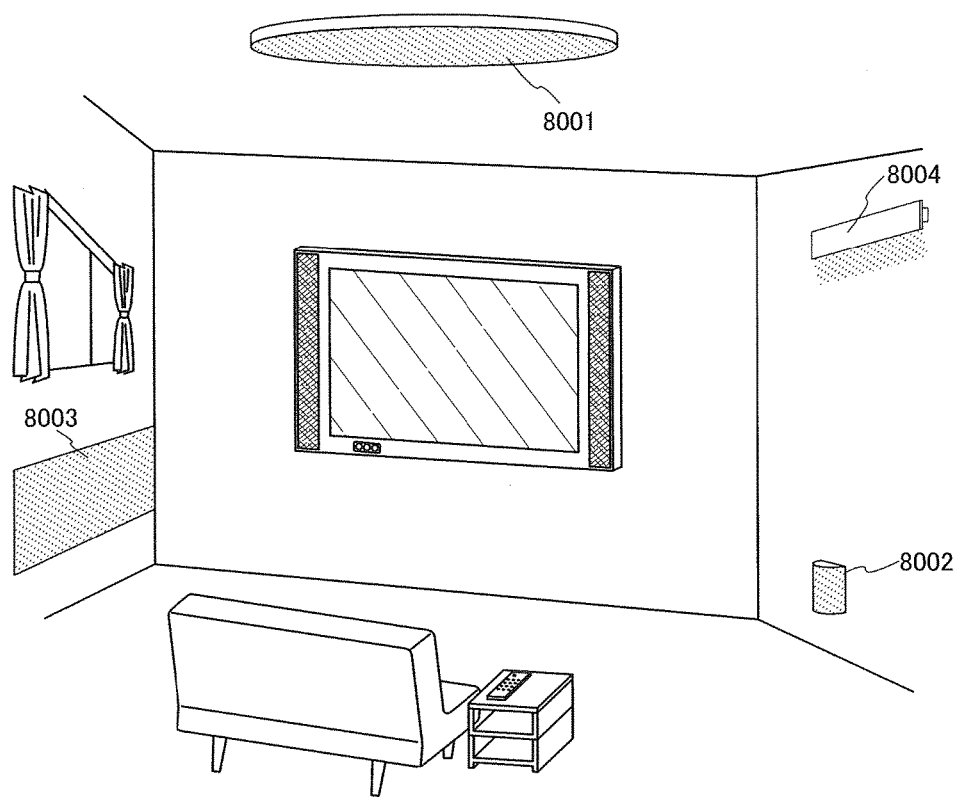
FIG. 9 illustrates lighting devices.

In this embodiment, application examples of a lighting device fabricated using the light-emitting device of one embodiment of the present invention or a light-emitting element which is a part of the light-emitting device will be described with reference to FIG. 9.

A ceiling light 8001 can be used as an indoor lighting device. Examples of the ceiling light 8001 include a direct-mount light and an embedded light. Besides, application to a cord pendant light (light that is suspended from a ceiling by a cord) is also possible.

A foot light 8002 lights a floor so that safety on the floor can be improved. For example, it can be effectively used in a bedroom, on a staircase, or on a passage. In that case, the size or shape of the foot light can be changed depending on the area or structure of a room.

A sheet-like lighting 8003 is a thin sheet-like lighting device. The sheet-like lighting, which is attached to a wall when used, is space-saving and thus can be used for a wide variety of uses. Furthermore, the area of the sheet-like lighting can be increased. The sheet-like lighting can also be used on a wall or housing having a curved surface.

In addition, a lighting device 8004 in which the direction of light from a light source is controlled to be only a desired direction can be used.

Besides the above examples, when the light-emitting device of one embodiment of the present invention or a light-emitting element which is a part of the light-emitting device is used as part of furniture in a room, a lighting device that functions as the furniture can be obtained.

As described above, a variety of lighting devices that include the light-emitting device can be obtained. Note that these lighting devices are also embodiments of the present invention.

The structures described in this embodiment can be combined with any of the structures described in the other embodiments as appropriate.

Embodiment 8

In this embodiment, touch panels including the light-emitting device of one embodiment of the present invention will be described with reference to FIGS. 10A and 10B, FIGS. 11A and 11B, FIGS. 12A and 12B, FIGS. 13A and 13B, and FIG. 14.

Figure 10A:
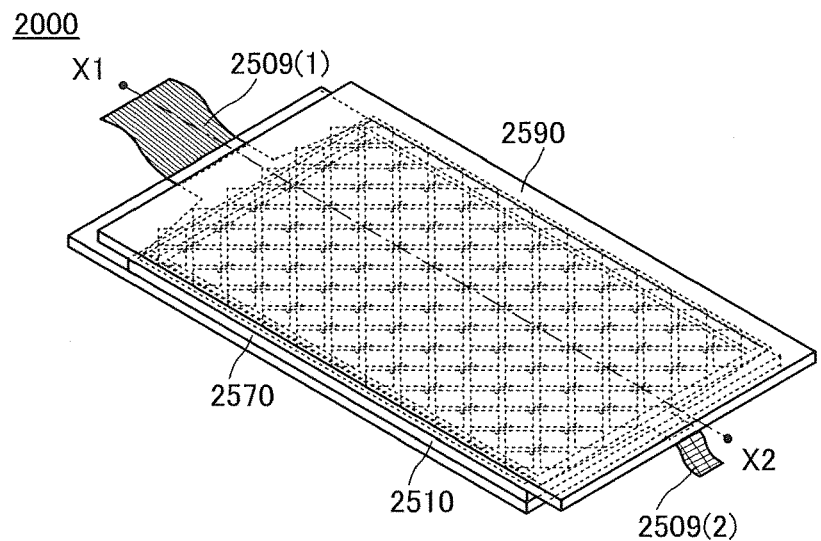
FIGS. 10A and 10B illustrate an example of a touch panel.
Figure 10B:
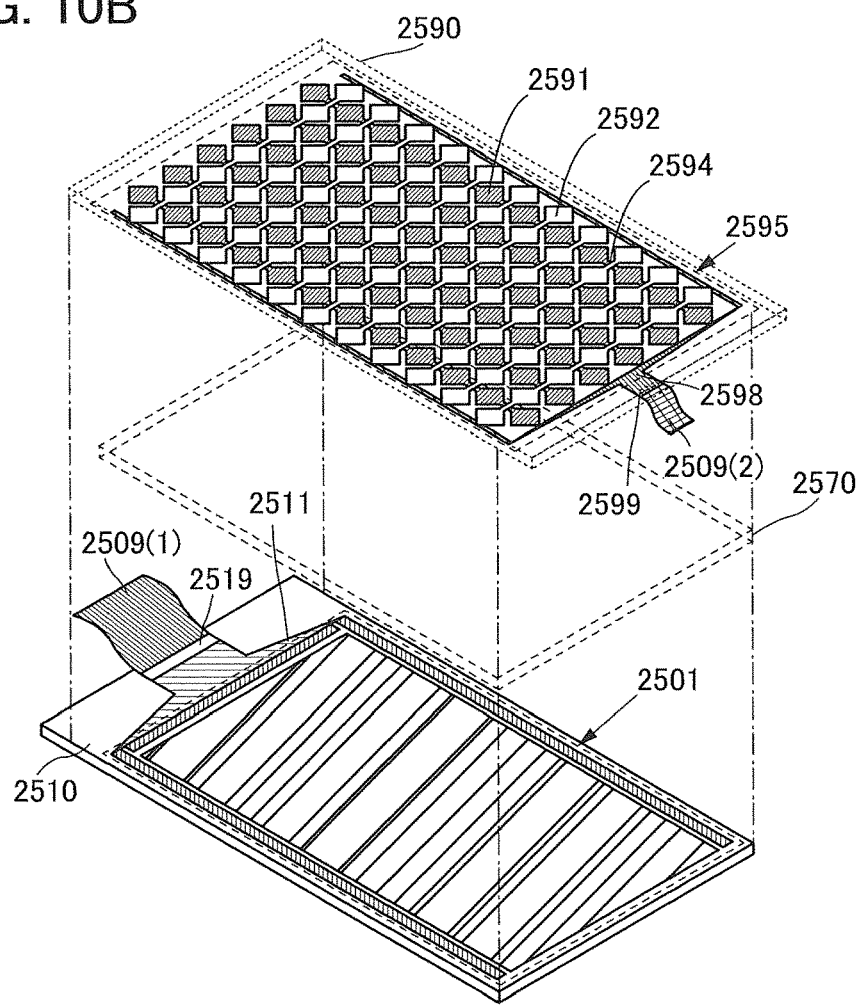

FIGS. 10A and 10B are perspective views of a touch panel 2000. Note that FIGS. 10A and 10B illustrate only main components of the touch panel 2000 for simplicity.

The touch panel 2000 includes a display panel 2501 and a touch sensor 2595 (see FIG. 10B). The touch panel 2000 includes a substrate 2510, a substrate 2570, and a substrate 2590.

The display panel 2501 includes, over the substrate 2510, a plurality of pixels and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal 2599. The terminal 2599 is electrically connected to an FPC 2509(2). Note that in FIG. 10B, electrodes, wirings, and the like of the touch sensor 2595 provided on the back side of the substrate 2590 (the side facing the substrate 2570) are indicated by solid lines for clarity.

As the touch sensor 2595, a capacitive touch sensor can be used, for example. Examples of the capacitive touch sensor include a surface capacitive touch sensor, a projected capacitive touch sensor, and the like.

Examples of the projected capacitive touch sensor are a self-capacitive touch sensor, a mutual capacitive touch sensor, and the like, which differ mainly in the driving method. The use of a mutual capacitive type is preferable because multiple points can be sensed simultaneously.

First, an example of using a projected capacitive touch sensor will be described below with reference to FIG. 10B. Note that in the case of a projected capacitive touch sensor, a variety of sensors that can sense proximity or touch of a sensing target such as a finger can be used.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598. The electrodes 2592 each have a shape of a plurality of quadrangles arranged in one direction with one corner of a quadrangle connected to one corner of another quadrangle with a wiring 2594, as illustrated in FIGS. 10A and 10B. In the same manner, the electrodes 2591 each have a shape of a plurality of quadrangles arranged with one corner of a quadrangle connected to one corner of another quadrangle; however, the direction in which the electrodes 2591 are connected is a direction crossing the direction in which the electrodes 2592 are connected. Note that the direction in which the electrodes 2591 are connected and the direction in which the electrodes 2592 are connected are not necessarily perpendicular to each other, and the electrodes 2591 may be arranged to intersect with the electrodes 2592 at an angle greater than 0° and less than 90°.

The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, the plurality of electrodes 2591 may be provided so that a space between the electrodes 2591 is reduced as much as possible, and the plurality of electrodes 2592 may be provided with an insulating layer located between the electrodes 2591 and 2592. In this case, it is preferable to provide, between two adjacent electrodes 2592, a dummy electrode electrically insulated from these electrodes because the area of regions having different transmittances can be reduced.

Figure 11A:
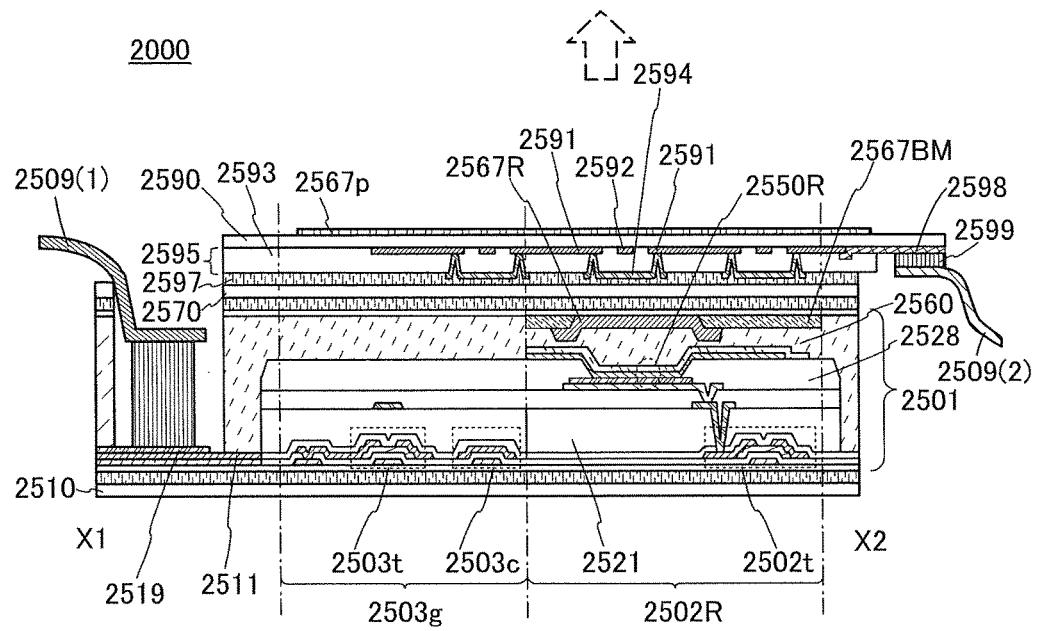
FIGS. 11A and 11B illustrate an example of a touch panel.
Figure 11B:
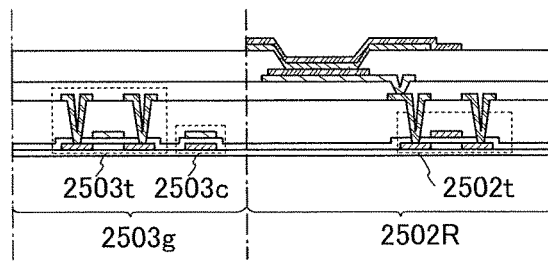

Next, the touch panel 2000 will be described in detail with reference to FIGS. 11A and 11B. FIGS. 11A and 11B correspond to cross-sectional views taken along dashed-dotted line X1-X2 in FIG. 10A.

The touch panel 2000 includes the touch sensor 2595 and the display panel 2501.

The touch sensor 2595 includes the electrodes 2591 and the electrodes 2592 provided in a staggered arrangement in contact with the substrate 2590, an insulating layer 2593 covering the electrodes 2591 and the electrodes 2592, and the wiring 2594 that electrically connects the adjacent electrodes 2591 to each other. Between the adjacent electrodes 2591, the electrode 2592 is provided.

The electrodes 2591 and the electrodes 2592 can be formed using a light-transmitting conductive material. As the light-transmitting conductive material, an In—Sn oxide (also referred to as ITO), an In—Si—Sn oxide (also referred to as ITSO), an In—Zn oxide, an In—W—Zn oxide, or the like can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. A graphene compound may be used as well. When a graphene compound is used, it can be formed, for example, by reducing a graphene oxide film. As a reducing method, a method with application of heat, a method with laser irradiation, or the like can be employed.

For example, the electrodes 2591 and 2592 can be formed by depositing a light-transmitting conductive material on the substrate 2590 by a sputtering method and then removing an unneeded portion by any of various patterning techniques such as photolithography.

Examples of a material for the insulating layer 2593 include a resin such as an acrylic resin or an epoxy resin, a resin having a siloxane bond, and an inorganic insulating material such as silicon oxide, silicon oxynitride, or aluminum oxide.

The adjacent electrodes 2591 are electrically connected to each other with the wiring 2594 formed in part of the insulating layer 2593. Note that a material for the wiring 2594 preferably has higher conductivity than materials for the electrodes 2591 and 2592 to reduce electrical resistance.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Through the terminal 2599, the wiring 2598 and the FPC 2509(2) are electrically connected to each other. The terminal 2599 can be formed using any of various kinds of anisotropic conductive films (ACF), anisotropic conductive pastes (ACP), and the like.

An adhesive layer 2597 is provided in contact with the wiring 2594. That is, the touch sensor 2595 is attached to the display panel 2501 so that they overlap with each other with the adhesive layer 2597 provided therebetween. Note that the substrate 2570 as illustrated in FIG. 11A may be provided over the surface of the display panel 2501 that is in contact with the adhesive layer 2597; however, the substrate 2570 is not always needed.

The adhesive layer 2597 has a light-transmitting property. For example, a thermosetting resin or an ultraviolet curable resin can be used; specifically, a resin such as an acrylic resin, a urethane-based resin, an epoxy-based resin, or a siloxane-based resin can be used.

The display panel 2501 in FIG. 11A includes, between the substrate 2510 and the substrate 2570, a plurality of pixels arranged in a matrix and a driver circuit. Each pixel includes a light-emitting element and a pixel circuit that drives the light-emitting element.

In FIG. 11A, a pixel 2502R is shown as an example of the pixel of the display panel 2501, and a scan line driver circuit 2503g is shown as an example of the driver circuit.

The pixel 2502R includes a light-emitting element 2550R and a transistor 2502t that can supply electric power to the light-emitting element 2550R.

The transistor 2502t is covered with an insulating layer 2521. The insulating layer 2521 has a function of providing a flat surface by covering unevenness caused by the transistor and the like that have been already formed. The insulating layer 2521 may serve also as a layer for preventing diffusion of impurities. That is preferable because a reduction in the reliability of the transistor or the like due to diffusion of impurities can be prevented.

The light-emitting element 2550R is electrically connected to the transistor 2502t through a wiring. It is one electrode of the light-emitting element 2550R that is directly connected to the wiring. An end portion of the one electrode of the light-emitting element 2550R is covered with an insulator 2528.

The light-emitting element 2550R includes an EL layer between a pair of electrodes. A coloring layer 2567R is provided to overlap with the light-emitting element 2550R, and part of light emitted from the light-emitting element 2550R is transmitted through the coloring layer 2567R and extracted in the direction indicated by an arrow in the drawing. A light-blocking layer 2567BM is provided at an end portion of the coloring layer, and a sealing layer 2560 is provided between the light-emitting element 2550R and the coloring layer 2567R.

Note that when the sealing layer 2560 is provided on the side from which light from the light-emitting element 2550R is extracted, the sealing layer 2560 preferably has a light-transmitting property. The sealing layer 2560 preferably has a higher refractive index than the air.

The scan line driver circuit 2503g includes a transistor 2503t and a capacitor 2503c. Note that the driver circuit and the pixel circuits can be formed in the same process over the same substrate. Thus, in a manner similar to that of the transistor 2502t in the pixel circuit, the transistor 2503t in the driver circuit (the scan line driver circuit 2503g) is also covered with the insulating layer 2521.

The wirings 2511 through which a signal can be supplied to the transistor 2503t are provided. The terminal 2519 is provided in contact with the wiring 2511. The terminal 2519 is electrically connected to the FPC 2509(1), and the FPC 2509(1) has a function of supplying signals such as an image signal and a synchronization signal. Note that a printed wiring board (PWB) may be attached to the FPC 2509(1).

Although the case where the display panel 2501 illustrated in FIG. 11A includes a bottom-gate transistor is described, the structure of the transistor is not limited thereto, and any of transistors with various structures can be used. In each of the transistors 2502t and 2503t illustrated in FIG. 11A, a semiconductor layer containing an oxide semiconductor can be used for a channel region. Alternatively, a semiconductor layer containing amorphous silicon or a semiconductor layer containing polycrystalline silicon that is obtained by crystallization process such as laser annealing can be used for a channel region.

FIG. 11B illustrates the structure that includes a top-gate transistor instead of the bottom-gate transistor illustrated in FIG. 11A. The kind of the semiconductor layer that can be used for the channel region does not depend on the structure of the transistor.

In the touch panel 2000 illustrated in FIG. 11A, an anti-reflection layer 2567p overlapping with at least the pixel is preferably provided on a surface of the touch panel on the side from which light from the pixel is extracted, as illustrated in FIG. 11A. As the anti-reflection layer 2567p, a circular polarizing plate or the like can be used.

For the substrates 2510, 2570, and 2590 in FIG. 11A, for example, a flexible material having a vapor permeability of $1 \times 10^{-5}$ g/(m²·day) or lower, preferably $1 \times 10^{-6}$ g/(m²·day) or lower, can be favorably used. Alternatively, it is preferable to use the materials that make these substrates have substantially the same coefficient of thermal expansion. For example, the coefficients of linear expansion of the materials are $1 \times 10^{-3}$/K or lower, preferably $5 \times 10^{-5}$/K or lower, and further preferably $1 \times 10^{-5}$/K or lower.

Next, a touch panel 2000' having a structure different from that of the touch panel 2000 illustrated in FIGS. 11A and 11B will be described with reference to FIGS. 12A and 12B. It can be used as a touch panel as well as the touch panel 2000.

Figure 12A:
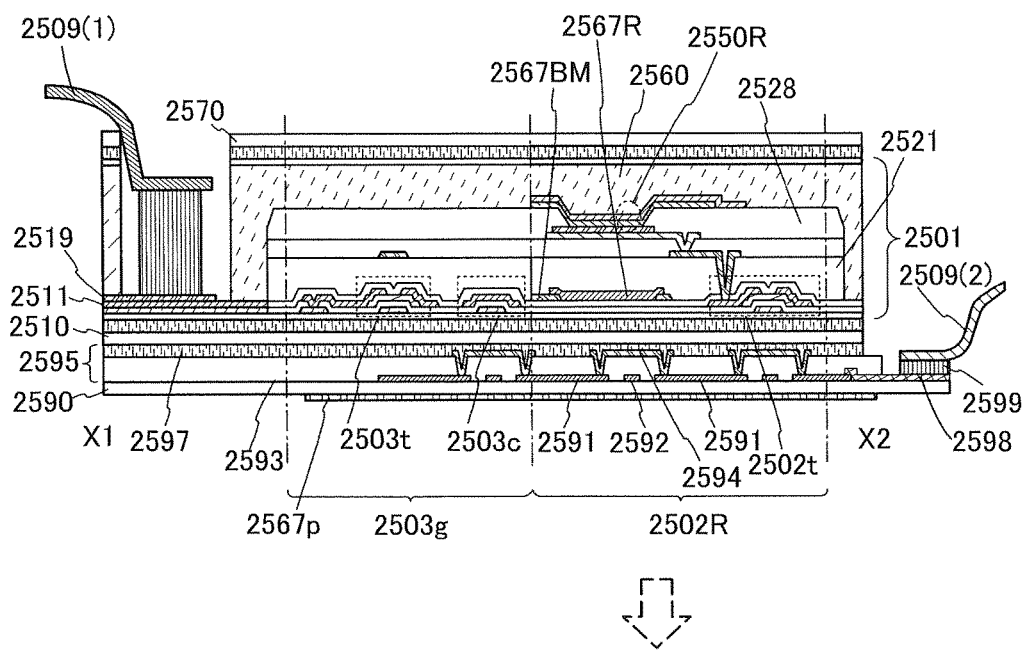
FIGS. 12A and 12B illustrate an example of a touch panel.
Figure 12B:
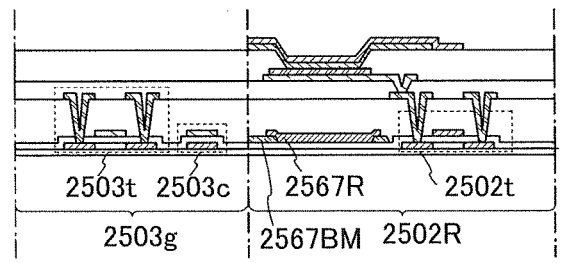

FIGS. 12A and 12B are cross-sectional views of the touch panel 2000'. In the touch panel 2000' illustrated in FIGS. 12A and 12B, the position of the touch sensor 2595 relative to the display panel 2501 is different from that in the touch panel 2000 illustrated in FIGS. 11A and 11B. Only different structures will be described below, and the above description of the touch panel 2000 can be referred to for the other similar structures.

The coloring layer 2567R overlaps with the light-emitting element 2550R. The light-emitting element 2550R illustrated in FIG. 12A emits light to the side where the transistor 2502t is provided. That is, (part of) light emitted from the light-emitting element 2550R passes through the coloring layer 2567R and is extracted in the direction indicated by an arrow in FIG. 12A. Note that the light-blocking layer 2567BM is provided at an end portion of the coloring layer 2567R.

The touch sensor 2595 is provided on the transistor 2502t side (the far side from the light-emitting element 2550R) of the display panel 2501 (see FIG. 12A).

The adhesive layer 2597 is in contact with the substrate 2510 of the display panel 2501 and attaches the display panel 2501 and the touch sensor 2595 to each other in the structure illustrated in FIG. 12A. The substrate 2510 is not necessarily provided between the display panel 2501 and the touch sensor 2595 that are attached to each other by the adhesive layer 2597.

As in the touch panel 2000, transistors with a variety of structures can be used for the display panel 2501 in the touch panel 2000'. Although a bottom-gate transistor is used in FIG. 12A, a top-gate transistor may be used as illustrated in FIG. 12B.

An example of a driving method of the touch panel will be described with reference to FIGS. 13A and 13B.

Figure 13A:
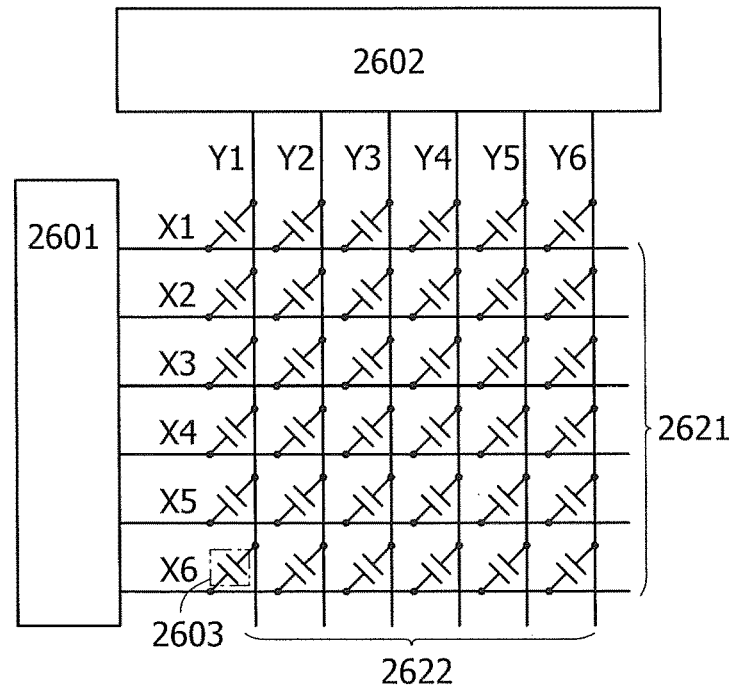
FIGS. 13A and 13B are a block diagram and a timing chart of a touch sensor.

FIG. 13A is a block diagram illustrating the structure of a mutual capacitive touch sensor. FIG. 13A illustrates a pulse voltage output circuit 2601 and a current sensing circuit 2602. Note that in FIG. 13A, six wirings X1 to X6 represent electrodes 2621 to which a pulse voltage is applied, and six wirings Y1 to Y6 represent electrodes 2622 that detect changes in current. FIG. 13A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 13B:
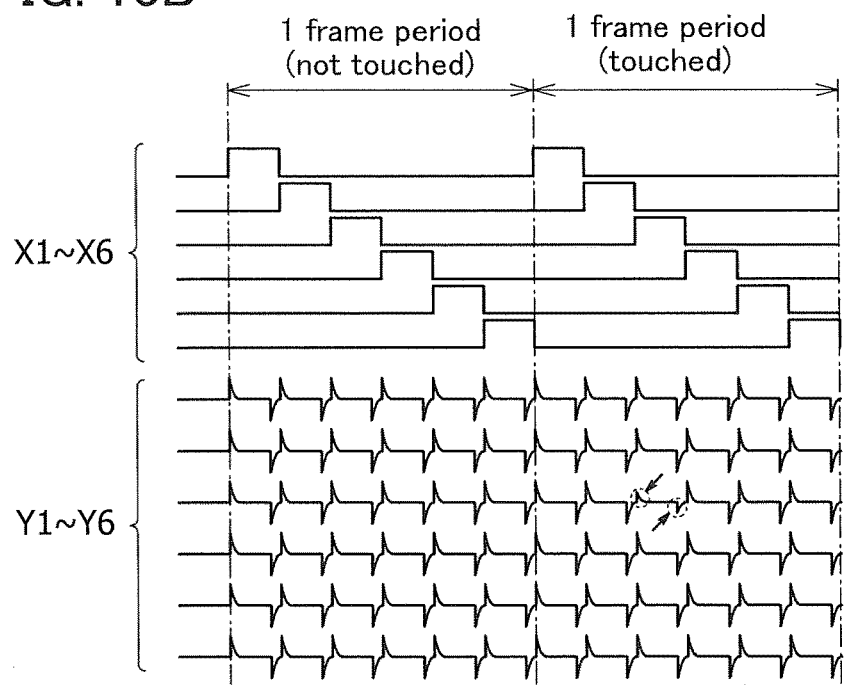

FIG. 13B is a timing chart showing input and output waveforms in the mutual capacitive touch sensor illustrated in FIG. 13A. In FIG. 13B, sensing of a sensing target is performed in all the rows and columns in one frame period. FIG. 13B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in response to the pulse voltage. When there is no approach or contact of a sensing target, the waveforms of the wirings Y1 to Y6 change uniformly in response to changes in the voltages of the wirings X1 to X6. The current value is decreased at the point of approach or contact of a sensing target and accordingly the waveform of the voltage value changes. By detecting a change in mutual capacitance in this manner, the approach or contact of a sensing target can be sensed.

Figure 14:
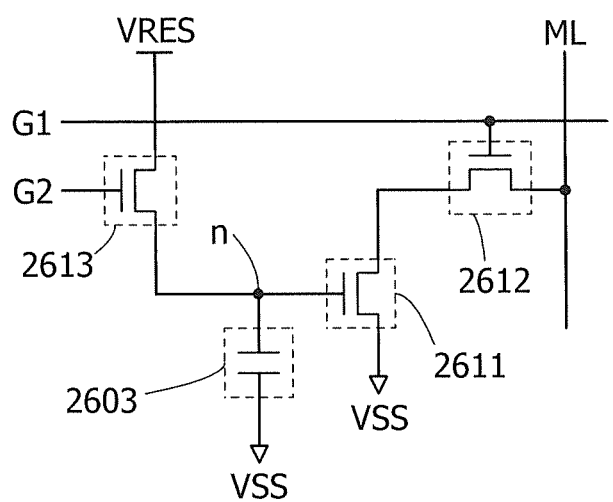
FIG. 14 is a circuit diagram of a touch sensor.

Although FIG. 13A illustrates a passive-type touch sensor in which only the capacitor 2603 is provided at the intersection of wirings as a touch sensor, an active-type touch sensor including a transistor and a capacitor may be used. FIG. 14 illustrates an example of a sensor circuit included in an active-type touch sensor.

The sensor circuit in FIG. 14 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 14 will be described. First, a potential for turning on the transistor 2613 is supplied as the signal G2, and a potential with respect to the voltage VRES is thus applied to a node n connected to the gate of the transistor 2611. Then, a potential for turning off the transistor 2613 is applied as the signal G2, whereby the potential of the node n is maintained. Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed depending on the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, it is preferable to use such a transistor as the transistor 2613 because the potential of the node n can be held for a long time and the frequency of operation of resupplying VRES to the node n (refresh operation) can be reduced.

Note that the structures described in this embodiment can be combined with any of the structures described in the other embodiments as appropriate.

Embodiment 9

In this embodiment, as a display device including the structure of the light-emitting device of one embodiment of the present invention, a display device that includes a reflective liquid crystal element and a light-emitting element and that can display an image both in a transmissive mode and a reflective mode will be described with reference to FIGS. 15A, 15B1, and 15B2, FIG. 16, and FIG. 17. Such a display device can also be referred to as an emissive OLED and reflective LC hybrid display (ER-hybrid display).

The display device described in this embodiment can be driven with extremely low power consumption for displaying an image using the reflective mode in a bright place such as outdoors. Meanwhile, in a dark place such as indoors or in a night environment, an image with a wide color gamut and high color reproducibility can be displayed with the use of the transmissive mode. Thus, by combination of these modes, the display device can display an image with low power consumption and high color reproducibility as compared with the case of a conventional display panel.

As an example of the display device of this embodiment, description will be made of a display device in which a liquid crystal element provided with a reflective electrode and a light-emitting element are stacked and an opening in the reflective electrode is provided in a position overlapping with the light-emitting element. Visible light is reflected by the reflective electrode in the reflective mode and light emitted from the light-emitting element is emitted through the opening in the reflective electrode in the transmissive mode. Note that transistors used for driving these elements (the liquid crystal element and the light-emitting element) are preferably formed on the same plane. It is preferable that the liquid crystal element and the light-emitting element be stacked with an insulating layer therebetween.

FIG. 15A is a block diagram illustrating a display device described in this embodiment. A display device 3000 includes a circuit (G) 3001, a circuit (S) 3002, and a display portion 3003. In the display portion 3003, a plurality of pixels 3004 are arranged in an R direction and a C direction in a matrix. A plurality of wirings G1, wirings G2, wirings ANO, and wirings CSCOM are electrically connected to the circuit (G) 3001. These wirings are also electrically connected to the plurality of pixels 3004 arranged in the R direction. A plurality of wirings S1 and wirings S2 are electrically connected to the circuit (S) 3002, and these wirings are also electrically connected to the plurality of pixels 3004 arranged in the C direction.

Each of the plurality of pixels 3004 includes a liquid crystal element and a light-emitting element. The liquid crystal element and the light-emitting element include portions overlapping with each other.

FIG. 15B1 shows the shape of a conductive film 3005 serving as a reflective electrode of the liquid crystal element included in the pixel 3004. Note that an opening 3007 is provided in a position 3006 which is part of the conductive film 3005 and which overlaps with the light-emitting element. That is, light emitted from the light-emitting element is emitted through the opening 3007.

The pixels 3004 in FIG. 15B1 are arranged such that the adjacent pixels 3004 in the R direction exhibit different colors. Furthermore, the openings 3007 are provided so as not to be arranged in a line in the R direction. Such arrangement has an effect of suppressing crosstalk between the light-emitting elements of adjacent pixels 3004. Furthermore, there is an advantage that element formation is facilitated.

The opening 3007 can have a polygonal shape, a quadrangular shape, an elliptical shape, a circular shape, a cross shape, a stripe shape, or a slit-like shape, for example.

FIG. 15B2 illustrates another example of the arrangement of the conductive films 3005.

The ratio of the opening 3007 to the total area of the conductive film 3005 (excluding the opening 3007) affects the display of the display device. That is, a problem is caused in that as the area of the opening 3007 is larger, the display using the liquid crystal element becomes darker; in contrast, as the area of the opening 3007 is smaller, the display using the light-emitting element becomes darker. Furthermore, in addition to the problem of the ratio of the opening, a small area of the opening 3007 itself also causes a problem in that extraction efficiency of light emitted from the light-emitting element is decreased. The ratio of the opening 3007 to the total area of the conductive film 3005 (excluding the opening 3007) is preferably 5% or more and 60% or less because the display quality can be maintained even when the liquid crystal element and the light-emitting element are used in a combination.

Figure 16:
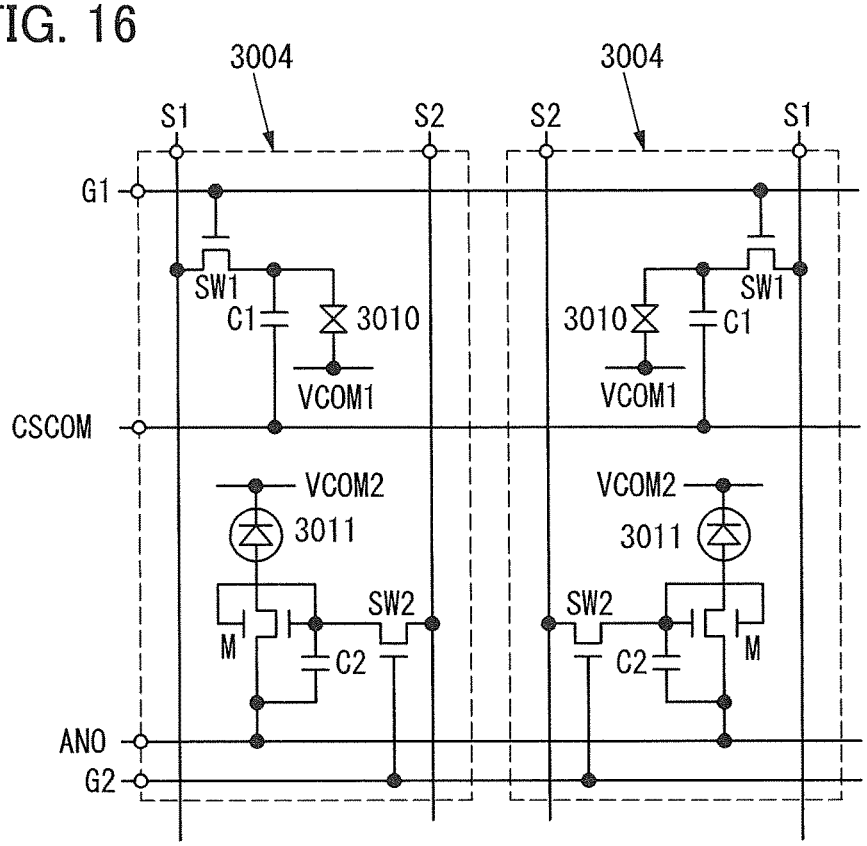
FIG. 16 illustrates a circuit configuration of a display device.

Next, an example of a circuit configuration of the pixel 3004 is described with reference to FIG. 16. FIG. 16 illustrates two adjacent pixels 3004.

The pixel 3004 includes a transistor SW1, a capacitor C1, a liquid crystal element 3010, a transistor SW2, a transistor M, a capacitor C2, a light-emitting element 3011, and the like. Note that these components are electrically connected to any of the wiring G1, the wiring G2, the wiring ANO, the wiring CSCOM, the wiring S1, and the wiring S2 in the pixel 3004. The liquid crystal element 3010 and the light-emitting element 3011 are electrically connected to a wiring VCOM1 and a wiring VCOM2, respectively.

A gate of the transistor SW1 is connected to the wiring G1. One of a source and a drain of the transistor SW1 is connected to the wiring S1, and the other of the source and the drain is connected to one electrode of the capacitor C1 and one electrode of the liquid crystal element 3010. The other electrode of the capacitor C1 is connected to the wiring CSCOM. The other electrode of the liquid crystal element 3010 is connected to the wiring VCOM1.

A gate of the transistor SW2 is connected to the wiring G2. One of a source and a drain of the transistor SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 3011. Furthermore, the other electrode of the light-emitting element 3011 is connected to the wiring VCOM2.

Note that the transistor M includes two gates between which a semiconductor is provided and which are electrically connected to each other. With such a structure, the amount of current flowing through the transistor M can be increased.

The on/off state of the transistor SW1 is controlled by a signal from the wiring G1. A predetermined potential is applied from the wiring VCOM1. Furthermore, orientation of liquid crystals of the liquid crystal element 3010 can be controlled by a signal from the wiring Si. A predetermined potential is applied from the wiring CSCOM.

The on/off state of the transistor SW2 is controlled by a signal from the wiring G2. By the difference between the potentials applied from the wiring VCOM2 and the wiring ANO, the light-emitting element 3011 can emit light. Furthermore, the conduction state of the transistor M can be controlled by a signal from the wiring S2.

Accordingly, in the structure of this embodiment, in the case of the reflective mode, the liquid crystal element 3010 is controlled by the signals supplied from the wiring G1 and the wiring S1 and optical modulation is utilized, whereby an image can be displayed. In the case of the transmissive mode, the light-emitting element 3011 can emit light when the signals are supplied from the wiring G2 and the wiring S2. In the case where both modes are performed at the same time, desired driving can be performed on the basis of the signals from the wiring G1, the wiring G2, the wiring S1, and the wiring S2.

Figure 17:
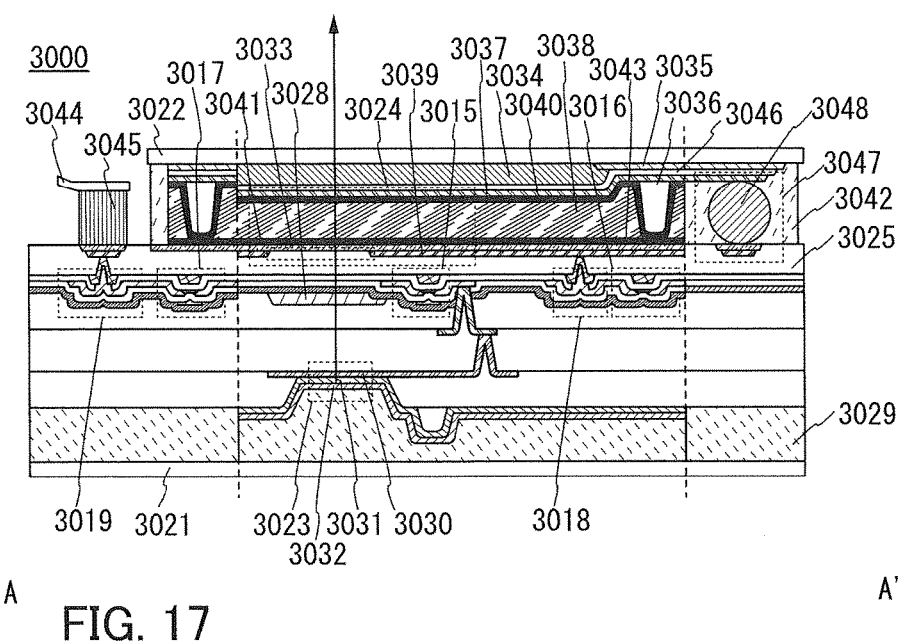
FIG. 17 illustrates a cross-sectional structure of a display device.

Next, specific description will be given with reference to FIG. 17, a schematic cross-sectional view of the display device 3000 described in this embodiment.

The display device 3000 includes a light-emitting element 3023 and a liquid crystal element 3024 between substrates 3021 and 3022. Note that the light-emitting element 3023 and the liquid crystal element 3024 are formed with an insulating layer 3025 positioned therebetween. That is, the light-emitting element 3023 is positioned between the substrate 3021 and the insulating layer 3025, and the liquid crystal element 3024 is positioned between the substrate 3022 and the insulating layer 3025.

A transistor 3015, a transistor 3016, a transistor 3017, a coloring layer 3028, and the like are provided between the insulating layer 3025 and the light-emitting element 3023.

A bonding layer 3029 is provided between the substrate 3021 and the light-emitting element 3023. The light-emitting element 3023 includes a conductive layer 3030 serving as one electrode, an EL layer 3031, and a conductive layer 3032 serving as the other electrode which are stacked in this order over the insulating layer 3025. In the light-emitting element 3023 that is a bottom emission light-emitting element, the conductive layer 3032 and the conductive layer 3030 contain a material that reflects visible light and a material that transmits visible light, respectively. Light emitted from the light-emitting element 3023 is transmitted through the coloring layer 3028 and the insulating layer 3025 and then transmitted through the liquid crystal element 3024 via an opening 3033, thereby being emitted to the outside of the substrate 3022.

In addition to the liquid crystal element 3024, a coloring layer 3034, a light-blocking layer 3035, an insulating layer 3046, a structure 3036, and the like are provided between the insulating layer 3025 and the substrate 3022. The liquid crystal element 3024 includes a conductive layer 3037 serving as one electrode, a liquid crystal 3038, a conductive layer 3039 serving as the other electrode, alignment films 3040 and 3041, and the like. Note that the liquid crystal element 3024 is a reflective liquid crystal element and the conductive layer 3039 serves as a reflective electrode; thus, the conductive layer 3039 is formed using a material with high reflectivity. Furthermore, the conductive layer 3037 serves as a transparent electrode, and thus is formed using a material that transmits visible light. The alignment films 3040 and 3041 are provided on the conductive layers 3037 and 3039 and in contact with the liquid crystal 3038. The insulating layer 3046 is provided so as to cover the coloring layer 3034 and the light-blocking layer 3035 and serves as an overcoat. Note that the alignment films 3040 and 3041 are not necessarily provided.

The opening 3033 is provided in part of the conductive layer 3039. A conductive layer 3043 is provided in contact with the conductive layer 3039. Since the conductive layer 3043 has a light-transmitting property, a material transmitting visible light is used for the conductive layer 3043.

The structure 3036 serves as a spacer that prevents the substrate 3022 from coming closer to the insulating layer 3025 than required. The structure 3036 is not necessarily provided.

One of a source and a drain of the transistor 3015 is electrically connected to the conductive layer 3030 in the light-emitting element 3023. For example, the transistor 3015 corresponds to the transistor M in FIG. 16.

One of a source and a drain of the transistor 3016 is electrically connected to the conductive layer 3039 and the conductive layer 3043 in the liquid crystal element 3024 through a terminal portion 3018. That is, the terminal portion 3018 has a function of electrically connecting the conductive layers provided on both surfaces of the insulating layer 3025. The transistor 3016 corresponds to the transistor SW1 in FIG. 16.

A terminal portion 3019 is provided in a region where the substrates 3021 and 3022 do not overlap with each other. Similarly to the terminal portion 3018, the terminal portion 3019 electrically connects the conductive layers provided on both surfaces of the insulating layer 3025. The terminal portion 3019 is electrically connected to a conductive layer obtained by processing the same conductive film as the conductive layer 3043. Thus, the terminal portion 3019 and an FPC 3044 can be electrically connected to each other through a connection layer 3045.

A connection portion 3047 is provided in part of a region where a bonding layer 3042 is provided. In the connection portion 3047, the conductive layer obtained by processing the same conductive film as the conductive layer 3043 and part of the conductive layer 3037 are electrically connected with a connector 3048. Accordingly, a signal or a potential input from the FPC 3044 can be supplied to the conductive layer 3037 through the connector 3048.

The structure 3036 is provided between the conductive layer 3037 and the conductive layer 3043. The structure 3036 has a function of maintaining a cell gap of the liquid crystal element 3024.

As the conductive layer 3043, a metal oxide, a metal nitride, or an oxide such as an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive layer 3043.

Note that the structures described in this embodiment can be combined with any of the structures described in the other embodiments as appropriate.

Example 1

Figure 18:
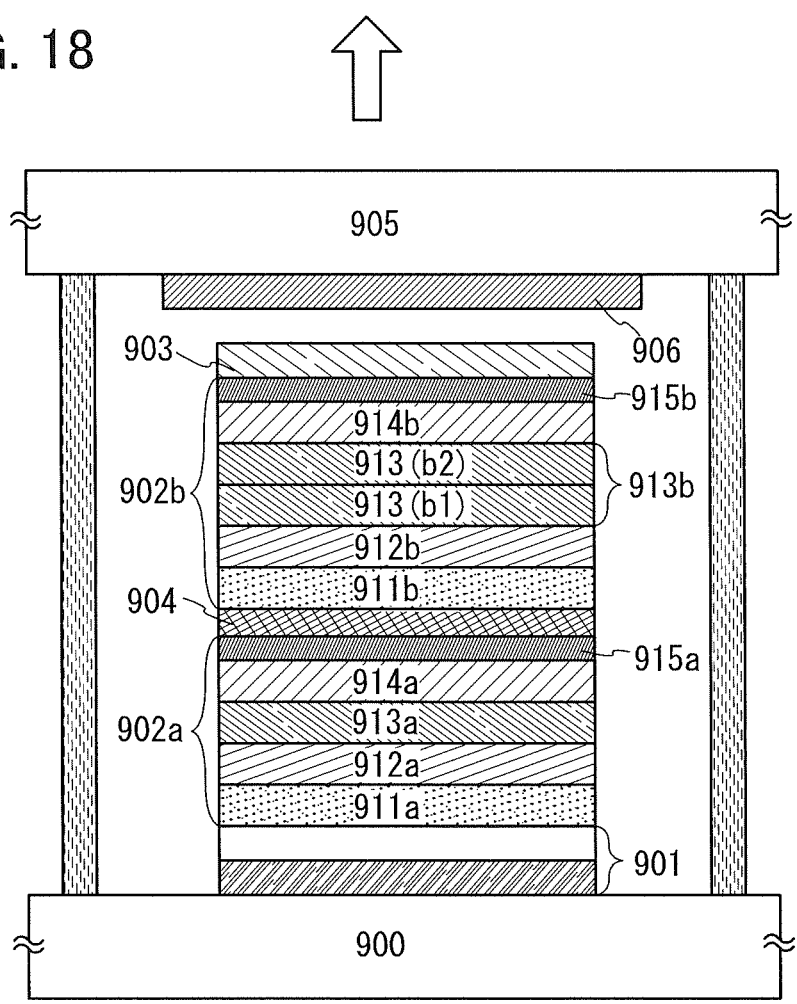
FIG. 18 illustrates a light-emitting element.
Figure 19:
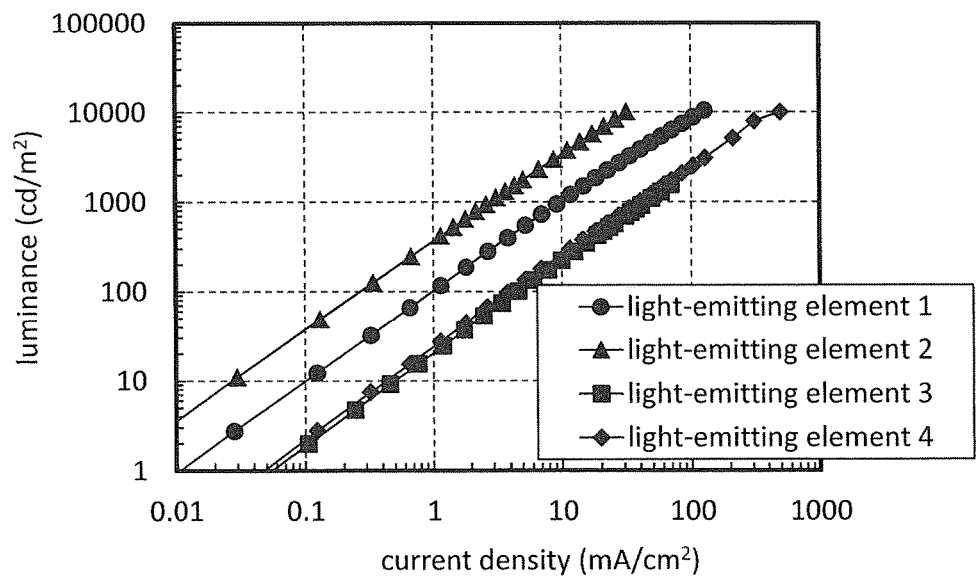
FIG. 19 shows the luminance-current density characteristics of light-emitting elements 1 to 4.
Figure 20:
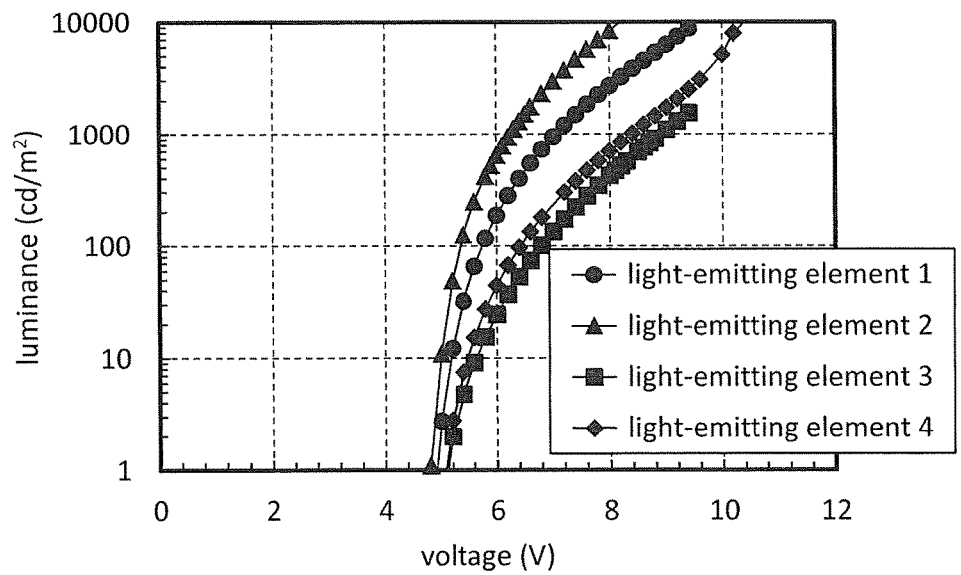
FIG. 20 shows the luminance-voltage characteristics of the light-emitting elements 1 to 4.
Figure 21:
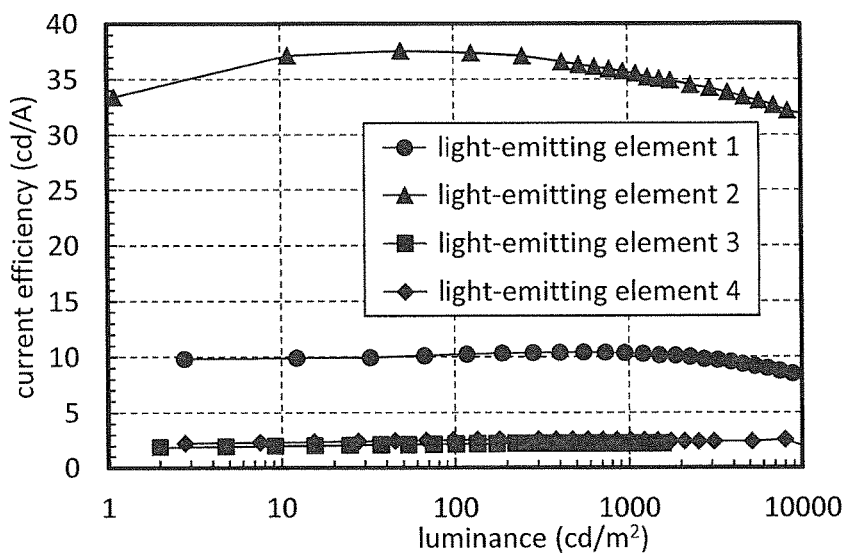
FIG. 21 shows the current efficiency-luminance characteristics of the light-emitting elements 1 to 4.
Figure 22:
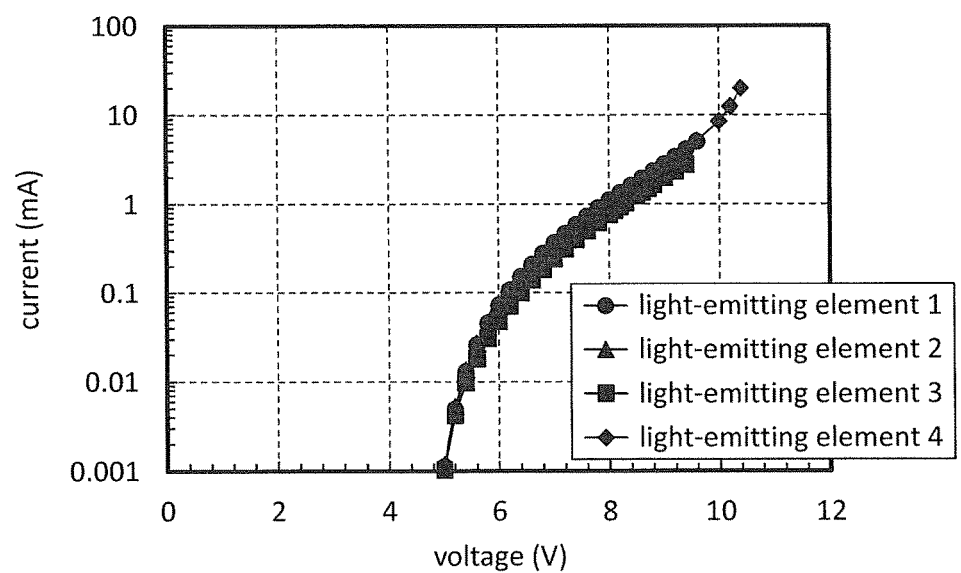
FIG. 22 shows the current-voltage characteristics of the light-emitting elements 1 to 4.
Figure 24:
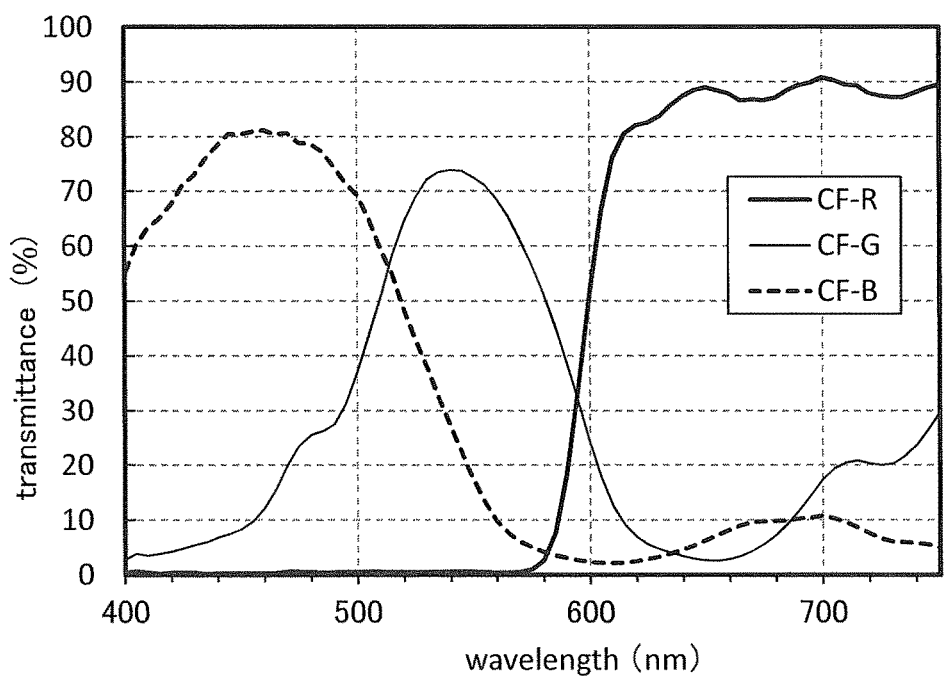
FIG. 24 shows the transmission spectra of color filters.
Figure 25:
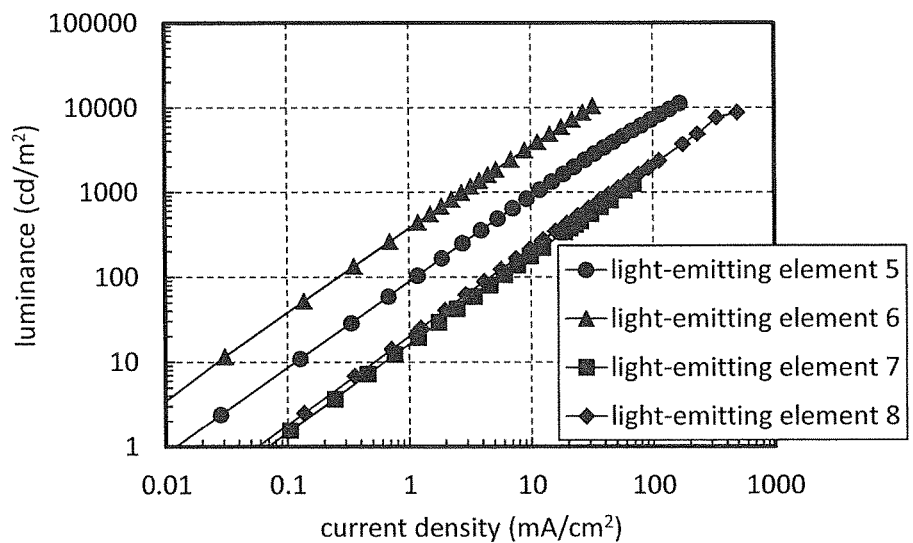
FIG. 25 shows the luminance-current density characteristics of light-emitting elements 5 to 8.
Figure 26:
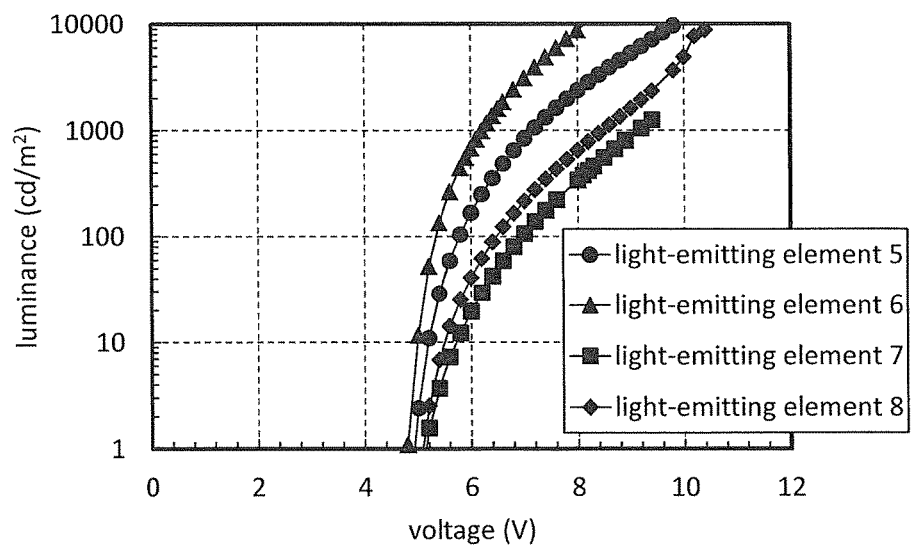
FIG. 26 shows the luminance-voltage characteristics of the light-emitting elements 5 to 8.
Figure 27:
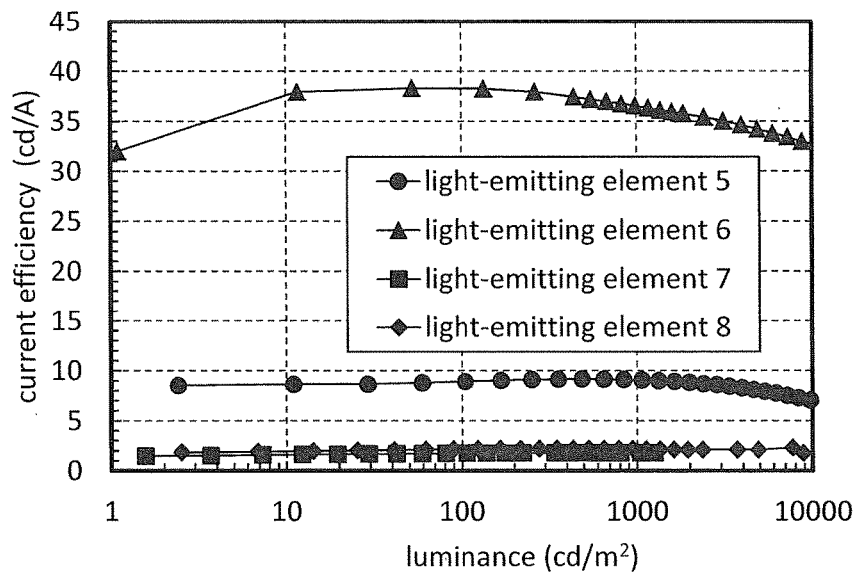
FIG. 27 shows the current efficiency-luminance characteristics of the light-emitting elements 5 to 8.
Figure 28:
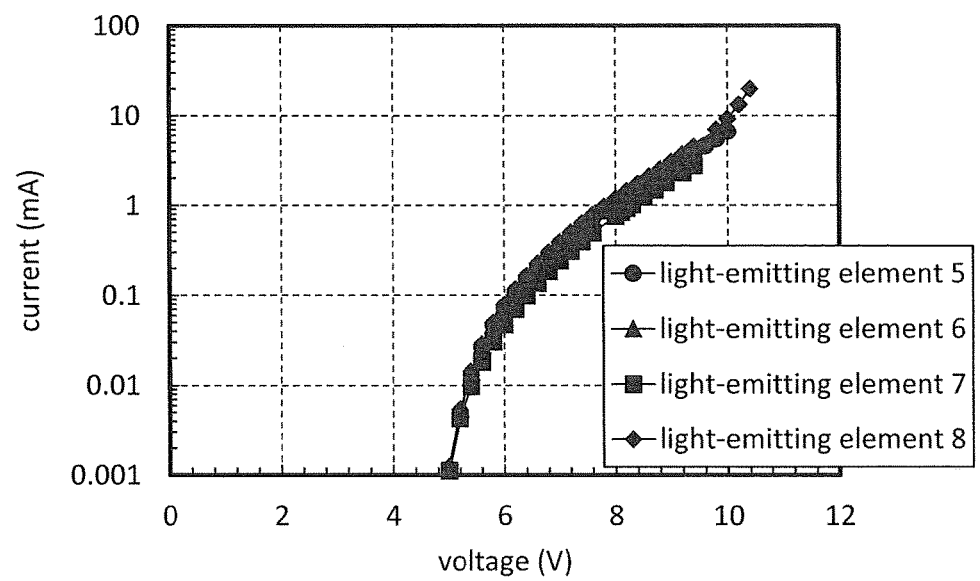
FIG. 28 shows the current-voltage characteristics of the light-emitting elements 5 to 8.

In this example, an element structure, a fabrication method, and properties of a light-emitting element used in the light-emitting device of one embodiment of the present invention will be described. Note that FIG. 18 illustrates an element structure of light-emitting elements described in this example, and Table 1 shows specific structures. Table 1 also shows color filters (CFs) combined with the light-emitting elements. A light-emitting element 1 is combined with a CF-R; a light-emitting element 2, a CF-G; and each of light-emitting elements 3 and 4, a CF-B. FIG. 24 shows transmitting properties of these CFs. Chemical formulae of materials used in this example are shown below.

TABLE 1

| Reference numeral in FIG. 18 | First electrode 901 | First hole-injection layer 911a | First hole-transport layer 912a | Light-emitting layer (A) 913a | | First electron-transport layer 914a | |
|---|---|---|---|---|---|---|---|
| Light-emitting element 1(R) | Ag—Pd—Cu (200 nm) | ITSO (110 nm) | PCPPn:MoOx (1:0.5, 10 nm) | PCPPn (10 nm) | *1 | cgDBCzPA (10 nm) | NBphen (15 nm) |
| Light-emitting element 2(G) | | ITSO (45 nm) | PCPPn:MoOx (1:0.5, 20 nm) | | | | |
| Light-emitting element 3(B1) | | ITSO (10 nm) | PCPPn:MoOx (1:0.5, 12.5 nm) | | | | |
| Light-emitting element 4(B1.5) | | ITSO (110 nm) | PCPPn:MoOx (1:0.5, 16 nm) | | | | |

| | | | | | Light-emitting layer (B) | | |
|---|---|---|---|---|---|---|---|
| Reference numeral in FIG. 18 | First electron-injection layer 915a | Charge generation layer 904 | Second hole-injection layer 911b | Second hole-transport layer 912b | First light-emitting layer 913(b1) | Second light-emitting layer 913(b2) | (Notes) |
| Light-emitting element 1(R) | Li$_2$O (0.1 nm) | CuPc (2 nm) | DBT3P-II:MoOx (1:0.5, 10 nm) | BPAFLP (15 nm) | *2 | *3 | Light-emitting element 1(R) |
| Light-emitting element 2(G) | | | | | | | Light-emitting element 2(G) |
| Light-emitting element 3(B1) | | | | | | | Light-emitting element 3(B1) |
| Light-emitting element 4(B1.5) | | | | | | | Light-emitting element 4(B1.5) |

| Reference numeral in FIG. 18 | Second electron-transport layer 914b | | Second electron-injection layer 915b | Second electrode 903 | | CF | |
|---|---|---|---|---|---|---|---|
| Light-emitting element 1(R) | 2mDBTBPDBq-II (25 nm) | NBphen (15 nm) | LiF (1 nm) | Ag:Mg (1:0.1, 25 nm) | ITO (70 nm) | CF-R | Light-emitting element 1(R) |
| Light-emitting element 2(G) | | | | | | CF-G | Light-emitting element 2(G) |
| Light-emitting element 3(B1) | | | | | | CF-B | Light-emitting element 3(B1) |

TABLE 1-continued
| Light-emitting element 4(B1.5) | | CF-B | Light-emitting element 4(B1.5) |
|---|---|---|---|
*1 cgDBCzPA:1,6BnfAPrn-03 (1:0.03, 25 nm)
*2 2mDBTBPDBq-II:PCBBiF:[Ir(tBuppm)$_3$] (0.8:0.2:0.06, 20 nm)
*3 2mDBTBPDBq-II:[Ir(dmdppr-P)$_2$(dibm)] (1:0.04, 20 nm)
[Chemical formulae 1]
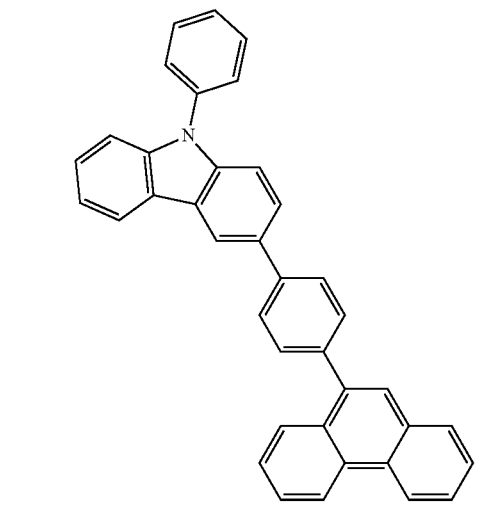
PCPPn
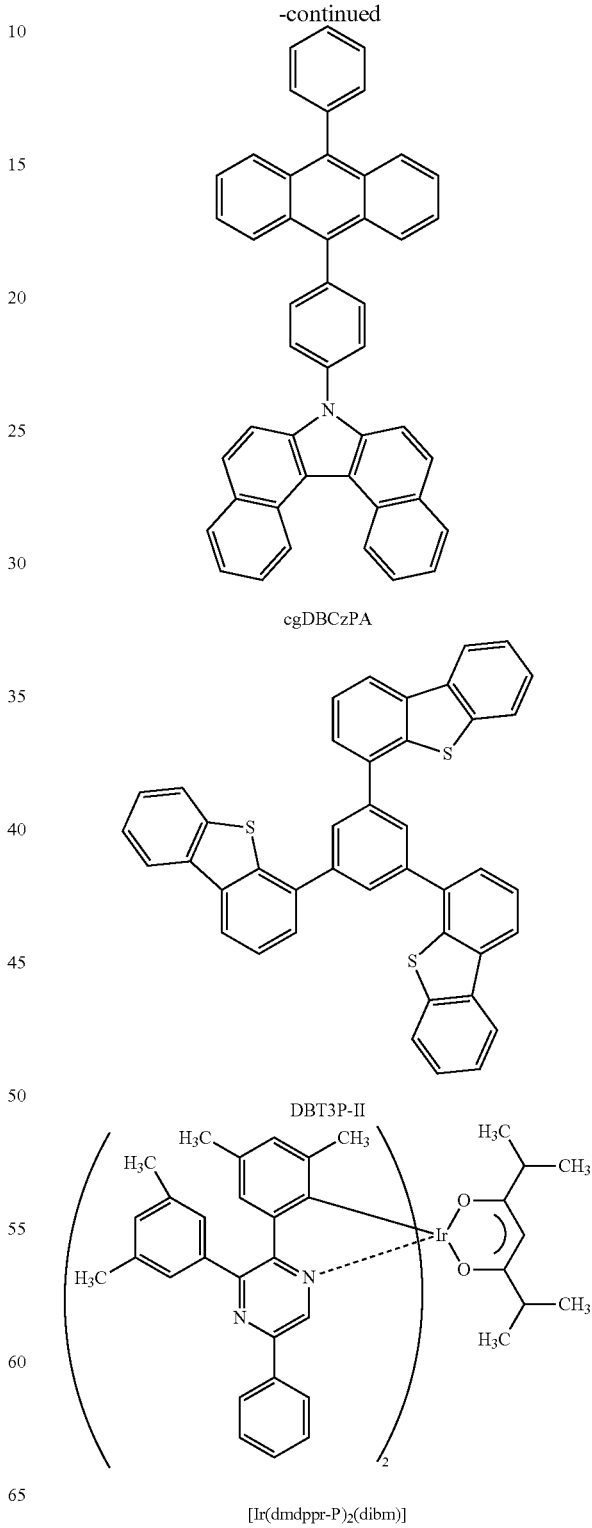
cgDBCzPA
DBT3P-II
1,6BnfAPrn-03
[Ir(dmdppr-P)$_2$(dibm)]

-continued

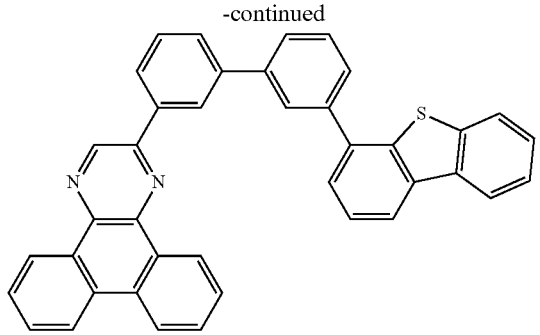

2mDBTBPDBq-II

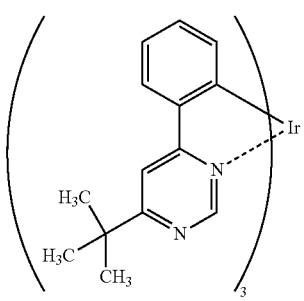

[Ir(tBuppm)₃]

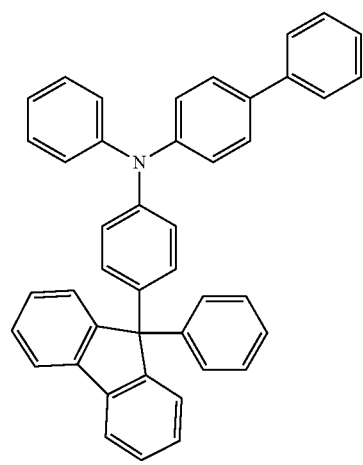

BPAFLP

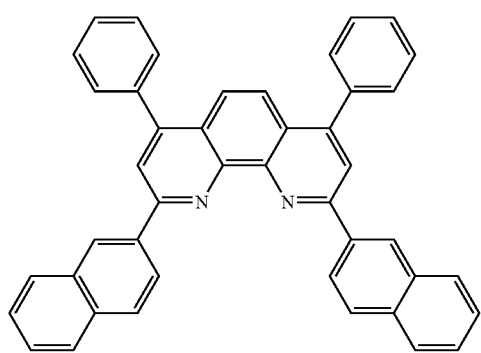

NBphen

-continued

[Chemical Formulae 2]

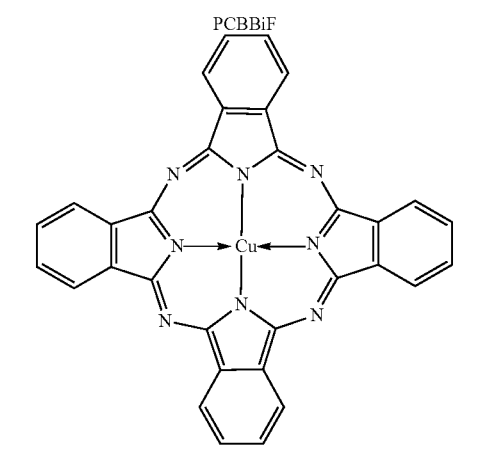

PCBBiF

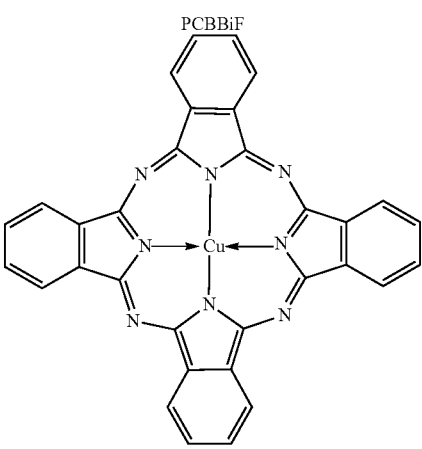

CuPc

<<Fabrication of Light-Emitting Elements>>

Light-emitting elements described in this example each included, as illustrated in FIG. 18, a first electrode 901 over a substrate 900, a first EL layer 902a over the first electrode 901, a charge generation layer 904 over the first EL layer 902a, a second EL layer 902b over the charge generation layer 904, and a second electrode 903 over the second EL layer 902b. Note that the light-emitting element 1 in this example was a light-emitting element emitting mainly red light and also referred to as a light-emitting element 1(R). The light-emitting element 2 was a light-emitting element emitting mainly green light and also referred to as a light-emitting element 2(G). The light-emitting element 3 and the light-emitting element 4 were each a light-emitting element emitting mainly blue light and were also referred to as a light-emitting element 3(B1) and a light-emitting element 4(B1.5), respectively.

First, the first electrode 901 was formed over the substrate 900. The electrode area was set to 4 mm² (2 mm×2 mm). A glass substrate was used as the substrate 900. The first electrode 901 was formed in the following manner: a 200-nm-thick alloy film of silver (Ag), palladium (Pd), and copper (Cu) (the alloy is also referred to as Ag—Pd—Cu) was formed by a sputtering method, and an ITSO was formed by a sputtering method. The ITSO was formed to have a thickness of 110 nm in the case of the light-emitting element 1, 45 nm in the case of the light-emitting element 2, 10 nm in the case of the light-emitting element 3, and 110 nm in the case of the light-emitting element 4. In this example, the first electrode 901 functioned as an anode. The first electrode 901 was a reflective electrode having a function of reflecting light. In this example, both the light-emitting element 3 and the light-emitting element 4 were light-emitting elements emitting blue light while having different optical path lengths between their electrodes. The light-emitting element 3 had an adjusted optical path length between its electrodes of 1 wavelength and the light-emitting element 4 had an adjusted optical path length between its electrodes of 1.5 wavelengths.

As pretreatment, a surface of the substrate was washed with water, baking was performed at 200° C. for one hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for about 30 minutes.

Next, a first hole-injection layer 911a was formed over the first electrode 901. After the pressure in the vacuum evaporation apparatus was reduced to $10^{-4}$ Pa, the first hole-injection layer 911a was formed by co-evaporation to have a weight ratio of 3-[4-(9-phenanthryl)-phenyl]-9-phenyl-9H-carbazole (abbreviation: PCPPn) to molybdenum oxide of 1:0.5 and to have a thickness of 10 nm for the light-emitting element 1; 20 nm for the light-emitting element 2; 12.5 nm for the light-emitting element 3; and 16 nm for the light-emitting element 4.

Then, a first hole-transport layer 912a was formed over the first hole-injection layer 911a. As the first hole-transport layer 912a, PCPPn was deposited by evaporation to a thickness of 10 nm. Note that the first hole-transport layers 912a in the first to fourth light-emitting elements were formed in a similar manner. It will not be mentioned if fabrication of the light-emitting elements had steps in common.

Next, a light-emitting layer (A) 913a was formed over the first hole-transport layer 912a.

The light-emitting layer (A) 913a was formed to a thickness of 25 nm by co-evaporation using 7-[4-(10-phenyl-9-anthryl)phenyl]-7H-dibenzo[c,g]carbazole (abbreviation: cgDBCzPA) as a host material and using N,N'-(pyrene-1,6-diyl)bis[(6,N-diphenylbenzo[b]naphtho[1,2-d]furan)-8-amine] (abbreviation: 1,6BnfAPrn-03) as a guest material (fluorescent material) such that the weight ratio of cgDBCzPA to 1,6BnfAPrn-03 was 1:0.03.

Next, a first electron-transport layer 914a was formed over the light-emitting layer (A) 913a. The first electron-transport layer 914a was formed in the following manner: cgDBCzPA and 2,9-bis(naphthalen-2-yl)-4,7-diphenyl-1,10-phenanthroline (abbreviation: NBphen) were sequentially deposited by evaporation to thicknesses of 10 nm and 15 nm, respectively.

After that, a first electron-injection layer 915a was formed over the first electron-transport layer 914a. The first electron-injection layer 915a was formed to a thickness of 0.1 nm by evaporation of lithium oxide ($Li_2O$).

Then, the charge generation layer 904 was formed over the first electron-injection layer 915a. The charge generation layer 904 was formed to a thickness of 2 nm by evaporation of copper phthalocyanine (abbreviation: CuPc).

Next, a second hole-injection layer 911b was formed over the charge generation layer 904. The second hole-injection layer 911b was formed to a thickness of 10 nm by co-evaporation such that the weight ratio of 4,4',4"-(benzene-1,3,5-triyl)tri(dibenzothiophene) (abbreviation: DBT3P-II) to molybdenum oxide was 1:0.5.

Then, a second hole-transport layer 912b was formed over the second hole-injection layer 911b. The second hole-transport layer 912b was formed to a thickness of 15 nm by evaporation of 4-phenyl-4'-(9-phenylfluoren-9-yl)triphenylamine (abbreviation: BPAFLP).

A light-emitting layer (B) 913b was formed over the second hole-transport layer 912b. The light-emitting layer (B) 913b had a stacked-layer structure of a light-emitting layer (B1) 913(b1) and a light-emitting layer (B2) 913(b2).

The light-emitting layer (B1) 913(b1) was formed to a thickness of 20 nm by co-evaporation using 2-[3'-(dibenzothiophen-4-yl)biphenyl-3-yl]dibenzo[fh]quinoxaline (abbreviation: 2mDBTBPDBq-II) as a host material, using N-(1,1'-biphenyl-4-yl)-N-[4-(9-phenyl-9H-carbazol-3-yl)phenyl]-9,9-dimethyl-9H-fluoren-2-amine (abbreviation: PCBBiF) as an assist material, and using tris(4-t-butyl-6-phenylpyrimidinato)iridium(III) (abbreviation: [Ir(tBuppm)$_3$]) as a guest material (a phosphorescent material) such that the weight ratio of 2mDBTBPDBq-II:PCBBiF:[Ir(tBuppm)$_3$] was 0.8:0.2:0.06. The light-emitting layer (B2) 913(b2) was formed to a thickness of 20 nm by co-evaporation using 2mDBTBPDBq-II as a host material and using bis{4,6-dimethyl-2-[3-(3,5-dimethylphenyl)-5-phenyl-2-pyrazinyl-κN]phenyl-κC}(2,6-dimethyl-3,5-heptanedionato-κ$^2$O,O')iridium(III) (abbreviation: [Ir(dmdppr-P)$_2$(dibm)]) as a guest material (a phosphorescent material), such that the weight ratio of 2mDBTBPDBq-II to [Ir(dmdppr-P)$_2$(dibm)] was 1:0.04.

Next, a second electron-transport layer 914b was formed over the light-emitting layer (B2) 913(b2). The second electron-transport layer 914b was formed in the following manner: 2mDBTBPDBq-II and NBphen were sequentially deposited by evaporation to thicknesses of 25 nm and 15 nm, respectively.

Then, a second electron-injection layer 915b was formed over the second electron-transport layer 914b. The second electron-injection layer 915b was formed to a thickness of 1 nm by evaporation of lithium fluoride (LiF).

Then, the second electrode 903 was formed over the second electron-injection layer 915b in the following manner: silver (Ag) and magnesium (Mg) were formed to a thickness of 25 nm by co-evaporation at a volume ratio of Ag to Mg of 1:0.1, and then an indium tin oxide (ITO) was formed to a thickness of 70 nm by a sputtering method. In this example, the second electrode 903 functioned as a cathode. Moreover, the second electrode 903 was a transflective electrode having functions of transmitting light and reflecting light.

Through the above steps, the light-emitting elements in each of which the EL layers were provided between a pair of electrodes over the substrate 900 were formed. The first hole-injection layer 911a, the first hole-transport layer 912a, the light-emitting layer (A) 913a, the first electron-transport layer 914a, the first electron-injection layer 915a, the second hole-injection layer 911b, the second hole-transport layer 912b, the light-emitting layer (B) 913b, the second electron-transport layer 914b, and the second electron-injection layer 915b described above were functional layers forming the EL layers of one embodiment of the present invention. Furthermore, in all the evaporation steps in the above fabrication method, evaporation was performed by a resistance-heating method.

Each of the light-emitting elements formed in this example was sealed between the substrate 900 and a substrate 905 as illustrated in FIG. 18. The substrate 905 was provided with a color filter 906. The sealing between the substrate 900 and the substrate 905 was performed in such a manner that the substrate 905 was fixed to the substrate 900 with a sealing material in a glove box containing a nitrogen atmosphere, a sealant was applied so as to surround the light-emitting element formed over the substrate 900, and then irradiation with 365-nm ultraviolet light at 6 J/cm$^2$ was performed and heat treatment was performed at 80° C. for 1 hour.

The light-emitting elements formed in this example each have a structure in which light is emitted in the direction indicated by the arrow from the second electrode 903 side of the light-emitting element.

<<Operation Characteristics of Light-Emitting Elements>>

Figure 23:
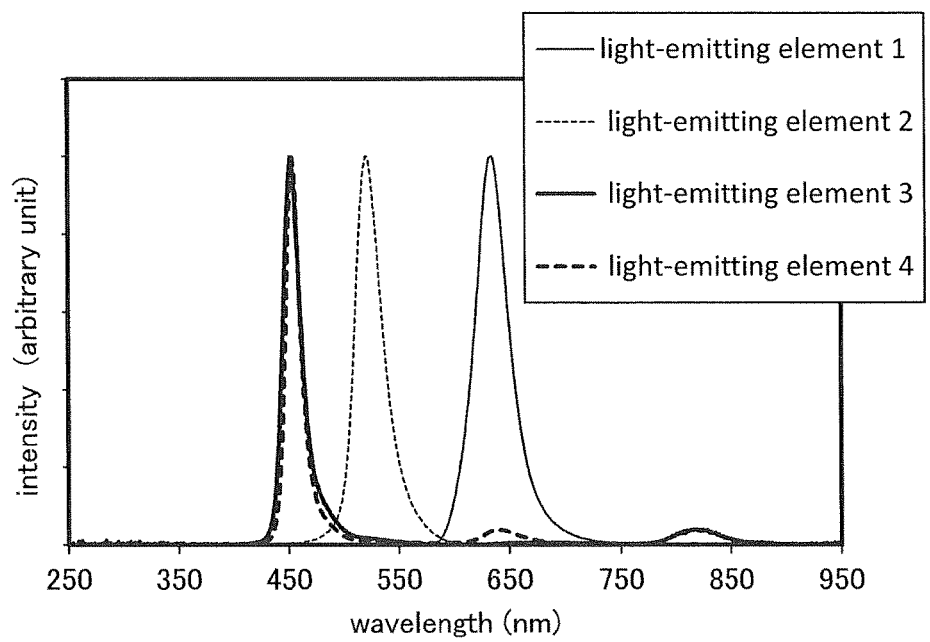
FIG. 23 shows the emission spectra of the light-emitting elements 1 to 4.

Operation characteristics of the formed light-emitting elements were measured. Note that the measurement was performed at room temperature (in an atmosphere kept at 25° C.). The results are shown in FIG. 19 to FIG. 22. FIG. 23 shows emission spectra when current at a current density of 2.5 mA/cm$^2$ was applied to the light-emitting elements. The emission spectra were measured with a multi-channel spectrometer (PMA-12 manufactured by Hamamatsu Photonics K.K.). As shown in FIG. 23, the emission spectrum of the light-emitting element 1 which emits red light has a peak at around 635 nm, the emission spectrum of the light-emitting element 2 which emits green light has a peak at around 521 nm, and the emission spectra of the light-emitting elements 3 and 4 which emit blue light each have a peak at around 453 nm. The spectrum shapes were narrowed. In this example, the measurement results of light emission obtained from a combination of light-emitting elements and color filters are shown.

FIG. 24 shows transmission spectra of the red color filter (CF-R) used in combination with the light-emitting element 1(R), the green color filter (CF-G) used in combination with the light-emitting element 2(G), and the blue color filter (CF-B) used in combination with the light-emitting element 3(B1) or 4(B1.5). FIG. 24 shows that the 600-nm light transmittance of the CF-R is 52%, which is lower than or equal to 60%, whereas the 650-nm light transmittance of the CF-R is 89%, which is higher than or equal to 70%. In addition, the 480-nm light transmittance and 580-nm light transmittance of the CF-G are 26% and 52%, respectively, which are lower than or equal to 60%, whereas the 530-nm light transmittance of the CF-G is 72%, which is higher than or equal to 70%. Furthermore, the 510-nm light transmittance of the CF-B is 60%, which is lower than or equal to 60%, whereas the 450-nm light transmittance of the CF-B is 80%, which is higher than or equal to 70%.

The results of the chromaticities (x, y) of the light-emitting elements formed in this example (the light-emitting elements 1 to 3) measured with a luminance colorimeter (BM-5A manufactured by TOPCON CORPORATION) are shown in Table 2 below. The chromaticities of the light-emitting elements 1(R), 2(G), and 3(B1) were measured at luminances of approximately 730 cd/m$^2$, approximately 1800 cd/m$^2$, and approximately 130 cd/m$^2$, respectively. The luminance ratio is a value such that white light emission close to D65 (light having chromaticity coordinates of (x, y)=(0.313, 0.329)) can be obtained by summing the luminance of R, the luminance of G, and the luminance of B.

TABLE 2

|  | x | y |
|---|---|---|
| Light-emitting element 1(R) | 0.697 | 0.297 |
| Light-emitting element 2(G) | 0.186 | 0.778 |
| Light-emitting element 3(B1) | 0.142 | 0.046 |

On the basis of the results in Table 2, the BT.2020 area ratio and the BT.2020 coverage calculated from the chromaticities (x, y) were 93% and 91%, respectively. Note that an area A of a triangle formed by connecting the CIE chromaticity coordinates (x, y) of RGB which fulfill the BT.2020 standard and an area B of a triangle formed by connecting the CIE chromaticity coordinates (x, y) of the three light-emitting elements in this example were calculated to obtain the area ratio (B/A). The coverage is a value which represents how much percentage of the BT.2020 standard color gamut (the inside of the above triangle) can be reproduced using a combination of the chromaticities of the three light-emitting elements in this example.

The results of the chromaticities (x, y) of the light-emitting elements 1, 2, and 4 measured with a luminance colorimeter among the light-emitting elements formed in this example are shown in Table 3 below. The chromaticities of the light-emitting elements 1(R), 2(G), and 4(B1.5) were measured at luminances of approximately 550 cd/m$^2$, approximately 1800 cd/m$^2$, and approximately 130 cd/m$^2$, respectively. The luminance ratio is a value such that white light emission close to D65 can be obtained by summing the luminance of R, the luminance of G, and the luminance of B.

TABLE 3

|  | x | y |
|---|---|---|
| Light-emitting element 1(R) | 0.697 | 0.297 |
| Light-emitting element 2(G) | 0.186 | 0.778 |
| Light-emitting element 4(B1.5) | 0.156 | 0.042 |

On the basis of the results in Table 3, the BT.2020 area ratio and the BT.2020 coverage calculated from the chromaticities (x, y) were 92% and 90%, respectively. Even such a structure having improved luminous efficiency of blue light can achieve extremely wide-range color reproducibility.

The above results show that, in this example, the light-emitting element 1(R) has a chromaticity x of greater than 0.680 and less than or equal to 0.720 and a chromaticity y of greater than or equal to 0.260 and less than or equal to 0.320, the light-emitting element 2(G) has a chromaticity x of greater than or equal to 0.130 and less than or equal to 0.250 and a chromaticity y of greater than 0.710 and less than or equal to 0.810, and each of the light-emitting element 3(B1) and the light-emitting element 4(B1.5) has a chromaticity x of greater than or equal to 0.120 and less than or equal to 0.170 and a chromaticity y of greater than or equal to 0.020 and less than 0.060. The light-emitting element 1(R) has a chromaticity x of greater than 0.680 and thus has a better red chromaticity than the DCI-P3 standard. The light-emitting element 2(G) has a chromaticity y of greater than 0.71 and thus has a better green chromaticity than the DCI-P3 standard and the NTSC standard. In addition, the light-emitting elements 3(B1) and 4(B1.5) each have a chromaticity y of less than 0.06 and thus have a better blue chromaticity than the DCI-P3 standard.

Note that the chromaticities (x, y) of the light-emitting elements 1, 2, 3, and 4 calculated using the values of the emission spectra shown in FIG. 23 are (0.693, 0.303), (0.202, 0.744), (0.139, 0.056), and (0.160, 0.057), respectively. Therefore, when the chromaticities of a combination of the light-emitting elements 1(R), 2(G), and 3(B1) are calculated using the emission spectra, the BT.2020 area ratio is 86% and the BT.2020 coverage is 84%. In addition, when the chromaticities of a combination of the light-emitting elements 1(R), 2(G), and 4(B1.5) are calculated using the emission spectra, the BT.2020 area ratio is 84% and the BT.2020 coverage is 82%.

Example 2

In this example, an element structure, a forming method, and properties of a light-emitting element used in the light-emitting device of one embodiment of the present invention will be described. Note that FIG. 18 illustrates an element structure of light-emitting elements described in this example, and Table 4 shows specific structures. Chemical formulae of materials used in this example are shown below. The color filters whose transmission spectra are shown in FIG. 24 were used.

[Chemical Formulae 3]

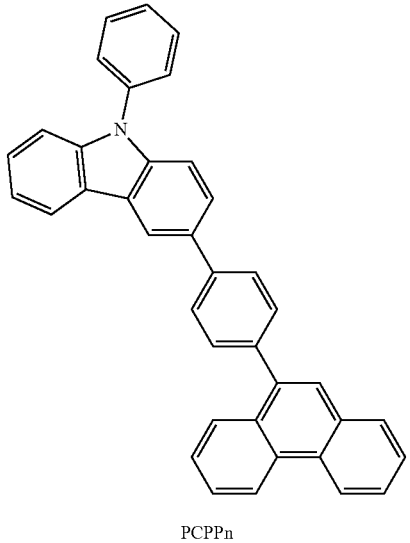

PCPPn

TABLE 4

| Reference numeral in FIG. 18 | First electrode 901 | | First hole-injection layer 911a | First hole-transport layer 912a | Light-emitting layer (A) 913a | First electron-transport layer 914a | |
|---|---|---|---|---|---|---|---|
| Light-emitting element 5(R) | Ag—Pd—Cu (200 nm) | ITSO (110 nm) | PCPPn:MoOx (1:0.5, 10 nm) | PCPPn (10 nm) | *1 | cgDBCzPA (10 nm) | NBphen (15 nm) |
| Light-emitting element 6(G) | | ITSO (45 nm) | PCPPn:MoOx (1:0.5, 20 nm) | | | | |
| Light-emitting element 7(B1) | | ITSO (10 nm) | PCPPn:MoOx (1:0.5, 12.5 nm) | | | | |
| Light-emitting element 8(B1.5) | | ITSO (110 nm) | PCPPn:MoOx (1:0.5, 19 nm) | | | | |

| | | | | | Light-emitting layer (B) | | |
| Reference numeral in FIG. 18 | First electron-injection layer 915a | Charge generation layer 904 | Second hole-injection layer 911b | Second hole-transport layer 912b | First light-emitting layer 913(b1) | Second light-emitting layer 913(b2) | (Notes) |
|---|---|---|---|---|---|---|---|
| Light-emitting element 5(R) | Li₂O (0.1 nm) | CuPc (2 nm) | DBT3P-II:MoOx (1:0.5, 10 nm) | BPAFLP (15 nm) | *2 | *3 | Light-emitting element 5(R) |
| Light-emitting element 6(G) | | | | | | | Light-emitting element 6(G) |
| Light-emitting element 7(B1) | | | | | | | Light-emitting element 7(B1) |
| Light-emitting element 8(B1.5) | | | | | | | Light-emitting element 8(B1.5) |

| Reference numeral in FIG. 18 | Second electron-transport layer 914b | | Second electron-injection layer 915b | Second electrode 903 | | CF | |
|---|---|---|---|---|---|---|---|
| Light-emitting element 5(R) | 2mDBTBPDBq-II (25 nm) | NBphen (15 nm) | LiF (1 nm) | Ag:Mg (1:0.1, 30 nm) | ITO (70 nm) | CF-R | Light-emitting element 5(R) |
| Light-emitting element 6(G) | | | | | | CF-G | Light-emitting element 6(G) |
| Light-emitting element 7(B1) | | | | | | CF-B | Light-emitting element 7(B1) |
| Light-emitting element 8(B1.5) | | | | | | CF-B | Light-emitting element 8(B1.5) |

*1 cgDBCzPA:1,6BnfAPrn-03 (1:0.03, 25 nm)
*2 2mDBTBPDBq-II:PCBBiF:[Ir(tBuppm)₃] (0.8:0.2:0.06, 20 nm)
*3 2mDBTBPDBq-II:[Ir(dmdppr-P)₂(dibm)] (1:0.04, 20 nm)

-continued
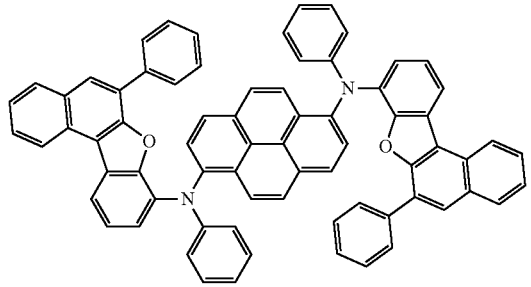
1,6BnfAPrn-03
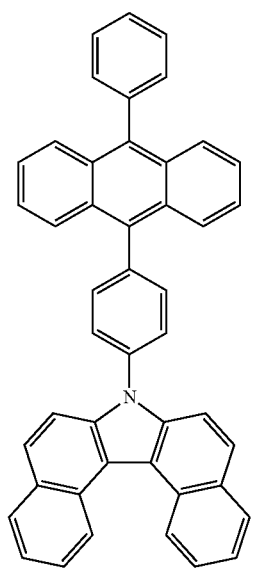
cgDBCzPA
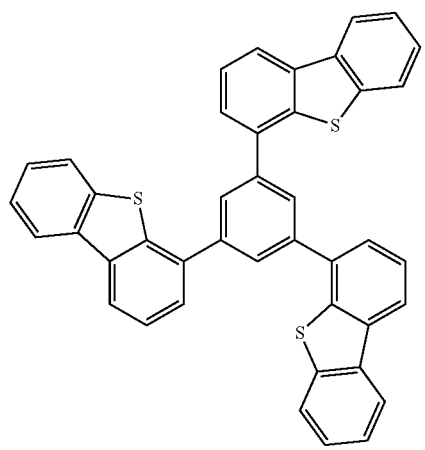
DBT3P-II
-continued
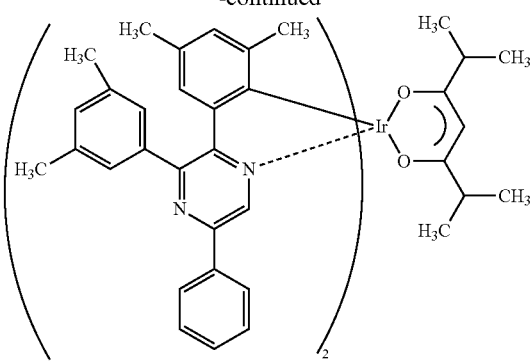
[Ir(dmdppr-P)$_2$(dibm)]
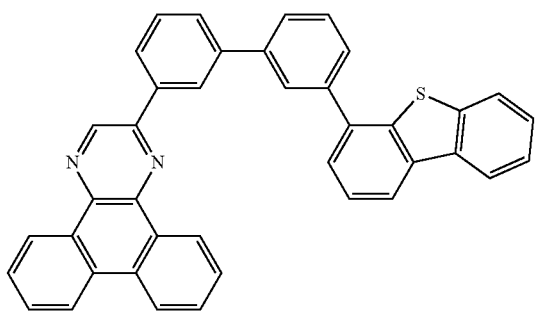
2mDBTBPDBq-II
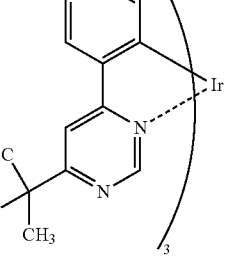
[Ir(tBuppm)$_3$]
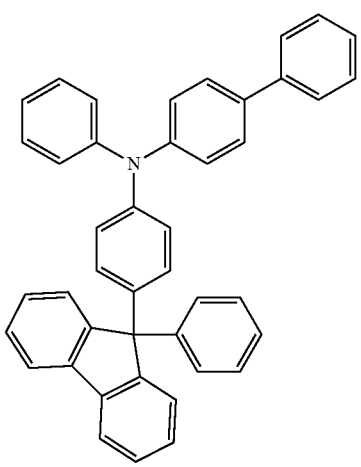
BPAFLP

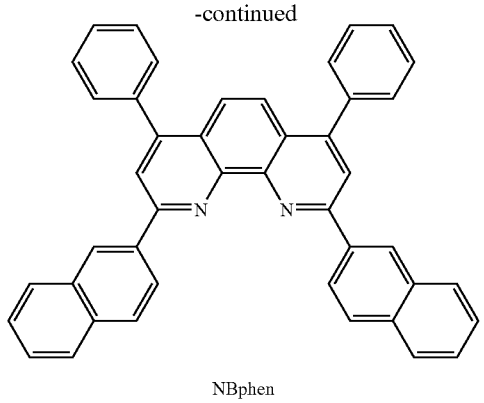

NBphen

[Chemical Formulae 4]

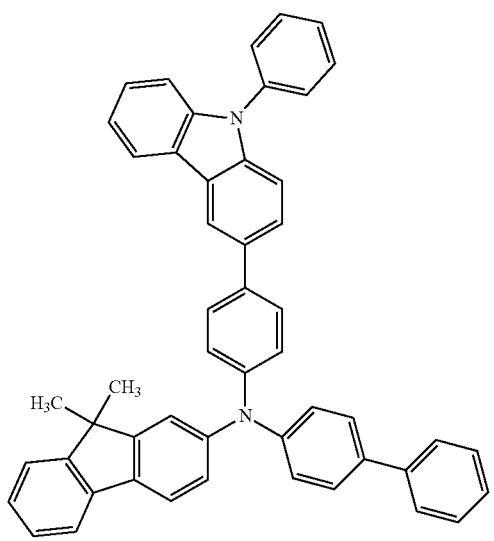

PCBBiF

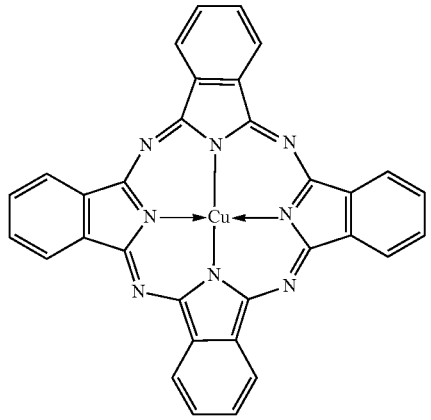

CuPc

<<Fabrication of Light-Emitting Elements>>

Light-emitting elements described in this example each included, as illustrated in FIG. 18, the first electrode 901 over the substrate 900, the first EL layer 902a over the first electrode 901, the charge generation layer 904 over the first EL layer 902a, the second EL layer 902b over the charge generation layer 904, and the second electrode 903 over the second EL layer 902b as in Example 1. Note that a light-emitting element 5 in this example was a light-emitting element emitting mainly red light and also referred to as a light-emitting element 5(R). A light-emitting element 6 was a light-emitting element emitting mainly green light and also referred to as a light-emitting element 6(G). A light-emitting element 7 and a light-emitting element 8 were each a light-emitting element emitting mainly blue light and were also referred to as a light-emitting element 7(B1) and a light-emitting element 8(B1.5), respectively.

In the light-emitting elements in this example, the thicknesses of the layers formed in fabricating the elements were different from each other. However, the layers can be formed in manners similar to those in Example 1 using the same materials; thus, Example 1 is referred to and description is omitted in this example.

<<Operation Characteristics of Light-Emitting Elements>>

Figure 29:
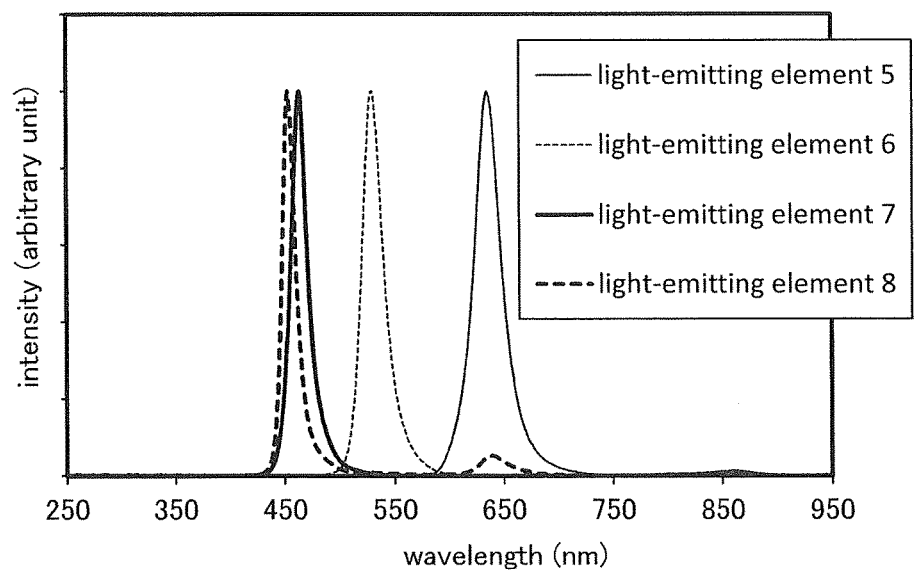
FIG. 29 shows the emission spectra of the light-emitting elements 5 to 8.

Operation characteristics of the formed light-emitting elements were measured. Note that the measurement was performed at room temperature (in an atmosphere kept at 25° C.). The results are shown in FIG. 25 to FIG. 28. FIG. 29 shows emission spectra when current at a current density of 2.5 mA/cm$^2$ was applied to the light-emitting elements. The emission spectra were measured with a multi-channel spectrometer (PMA-12 manufactured by Hamamatsu Photonics K.K.). As shown in FIG. 29, the emission spectrum of the light-emitting element 5 which emits red light has a peak at around 635 nm, the emission spectrum of the light-emitting element 6 which emits green light has a peak at around 530 nm, and the emission spectra of the light-emitting elements 7 and 8 which emit blue light have peaks at around 464 nm and 453 nm, respectively. The spectrum shapes were narrowed. In this example, the measurement results of light emission obtained from a combination of light-emitting elements and color filters are shown.

Next, the results of the chromaticities (x, y) of the light-emitting elements formed in this example (the light-emitting elements 5 to 7) measured with a luminance colorimeter (BM-5A manufactured by TOPCON CORPORATION) are shown in Table 5 below. The chromaticities of the light-emitting elements 5(R), 6(G), and 7(B1) were measured at luminances of approximately 650 cd/m$^2$, approximately 1900 cd/m$^2$, and approximately 140 cd/m$^2$, respectively. The luminance ratio is a value such that white light emission close to D65 can be obtained by summing the luminance of R, the luminance of G, and the luminance of B.

TABLE 5

|  | x | y |
|---|---|---|
| Light-emitting element 5(R) | 0.700 | 0.294 |
| Light-emitting element 6(G) | 0.175 | 0.793 |
| Light-emitting element 7(B1) | 0.142 | 0.039 |

On the basis of the results in Table 5, the BT.2020 area ratio and the BT.2020 coverage calculated from the chromaticities (x, y) were 97% and 95%, respectively.

The results of the chromaticities (x, y) of the light-emitting elements 5 to 8 among the light-emitting elements formed in this example with a luminance colorimeter are shown in Table 6 below. The chromaticities of the light-emitting elements 5(R), 6(G), and 8(B1.5) were measured at luminances of approximately 650 cd/m$^2$, approximately 1900 cd/m$^2$, and approximately 170 cd/m$^2$, respectively. The luminance ratio is a value such that white light emission close to D65 can be obtained by summing the luminance of R, the luminance of G, and the luminance of B.

TABLE 6

|  | x | y |
| --- | --- | --- |
| Light-emitting element 5(R) | 0.700 | 0.294 |
| Light-emitting element 6(G) | 0.175 | 0.793 |
| Light-emitting element 8(B1.5) | 0.153 | 0.046 |

On the basis of the results in Table 6, the BT.2020 area ratio and the BT.2020 coverage calculated from the chromaticities (x, y) were 95% and 93%, respectively. Even such a structure having improved luminous efficiency of blue light can achieve extremely wide-range color reproducibility.

The above results show that, in this example, the light-emitting element 5(R) has a chromaticity x of greater than 0.680 and less than or equal to 0.720 and a chromaticity y of greater than or equal to 0.260 and less than or equal to 0.320, the light-emitting element 6(G) has a chromaticity x of greater than or equal to 0.130 and less than or equal to 0.250 and a chromaticity y of greater than 0.710 and less than or equal to 0.810, and each of the light-emitting element 7(B1) and the light-emitting element 8(B1.5) has a chromaticity x of greater than or equal to 0.120 and less than or equal to 0.170 and a chromaticity y of greater than or equal to 0.020 and less than 0.060. The light-emitting element 6(G) has a chromaticity y of greater than 0.71, and thus has a better green chromaticity than the DCI-P3 standard and the NTSC standard. In addition, the light-emitting elements 7(B1) and 8(B1.5) each have a chromaticity y of less than 0.06, and thus have a better blue chromaticity than the DCI-P3 standard.

Note that the chromaticities (x, y) of the light-emitting elements 5, 6, 7, and 8 calculated using the values of the emission spectra shown in FIG. 29 are (0.696, 0.300), (0.185, 0.760), (0.140, 0.048), and (0.154, 0.056), respectively. Therefore, when the chromaticities of a combination of the light-emitting elements 5(R), 6(G), and 7(B1) are calculated using the emission spectra, the BT.2020 area ratio is 91% and the BT.2020 coverage is 89%. In addition, when the chromaticities of a combination of the light-emitting elements 5(R), 6(G), and 8(B1.5) are calculated using the emission spectra, the BT.2020 area ratio is 88% and the BT.2020 coverage is 86%.

Reference Example

In this reference example, a synthesis method of bis{4, 6-dimethyl-2-[5-(4-cyano-2,6-dimethylphenyl)-3-(3,5-dimethylphenyl)-2-pyrazinyl-κN]ph enyl-κC}(2,2,6,6-tetramethyl-3,5-heptanedionato-κ$^2$O,O')iridium(III) (abbreviation: [Ir(dmdppr-dmCP)$_2$(dpm)]) (Structural formula (100)), which is an organometallic complex and a light-emitting substance that can be used for the light-emitting layer in the light-emitting element of one embodiment of the present invention, is described. The emission spectrum of the organometallic complex has a peak of greater than or equal to 600 nm and less than or equal to 700 nm. The structure of [Ir(dmdppr-dmCP)$_2$(dpm)] is shown below.

[Chemical Formula 5]

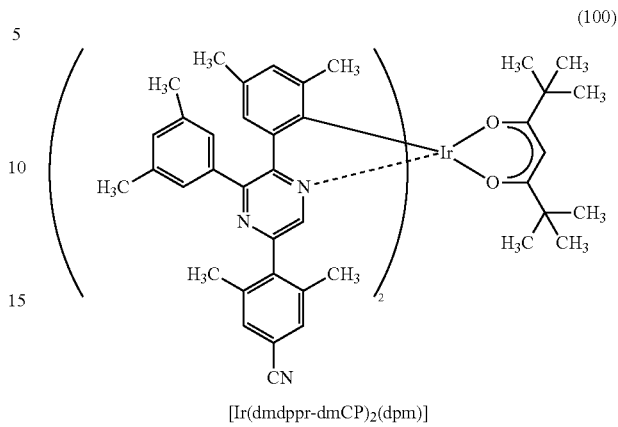

[Ir(dmdppr-dmCP)$_2$(dpm)]

Step 1: Synthesis of 5-hydroxy-2,3-(3,5-dimethylphenyl)pyrazine

First, 5.27 g of 3,3',5,5'-tetramethylbenzyl, 2.61 g of glycinamide hydrochloride, 1.92 g of sodium hydroxide, and 50 mL of methanol were put into a three-necked flask equipped with a reflux pipe, and the air in the flask was replaced with nitrogen. After that, the mixture was stirred at 80° C. for 7 hours to cause a reaction. Then, 2.5 mL of 12M hydrochloric acid was added thereto and stirring was performed for 30 minutes. Then, 2.02 g of potassium bicarbonate was added, and stirring was performed for 30 minutes. After the resulting suspension was subjected to suction filtration, the obtained solid was washed with water and methanol to give an objective pyrazine derivative as milky white powder in a yield of 79%. A synthesis scheme of Step 1 is shown in (a-1).

[Chemical Formula 6]

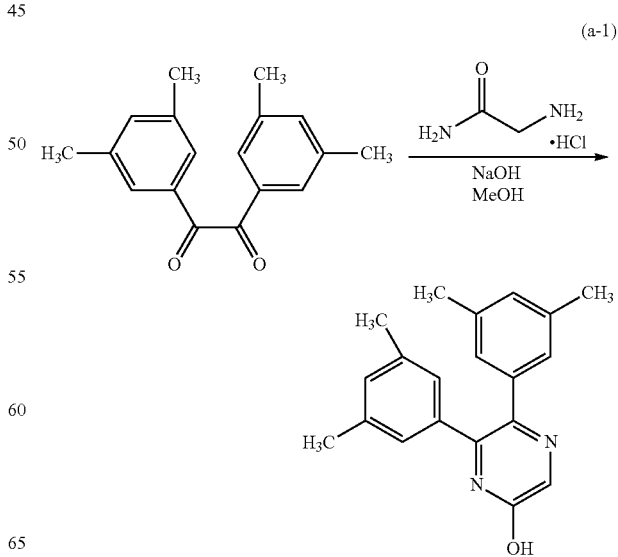

Step 2: Synthesis of 5,6-bis(3,5-dimethylphenyl)pyrazin-2-yl trifluoromethanesulfonate Next, 4.80 g of 5-hydroxy-2,3-(3,5-dimethylphenyl)pyrazine which was obtained in Step 1, 4.5 mL of triethylamine, and 80 mL of dehydrated dichloromethane were put into a three-necked flask, and the air in the flask was replaced with nitrogen. The flask was cooled down to −20° C. Then, 3.5 mL of trifluoromethanesulfonic anhydride was dropped therein, and stirring was performed at room temperature for 17.5 hours. After that, the flask was cooled down to 0° C. Then, 0.7 mL of trifluoromethanesulfonic anhydride was further dropped therein, and stirring was performed at room temperature for 22 hours to cause a reaction. To the reaction solution, 50 mL of water and 5 mL of 1M hydrochloric acid were added and then, dichloromethane was added, so that a substance contained in the reaction solution was extracted in the dichloromethane. A saturated aqueous solution of sodium hydrogencarbonate and saturated saline were added to this dichloromethane for washing. Then, magnesium sulfate was added thereto for drying. After being dried, the solution was filtered, and the filtrate was concentrated and the obtained residue was purified by silica gel column chromatography using toluene:hexane=1:1 (volume ratio) as a developing solvent, to give an objective pyrazine derivative as yellow oil in a yield of 96%. A synthesis scheme of Step 2 is shown in (a-2).

[Chemical Formula 7]

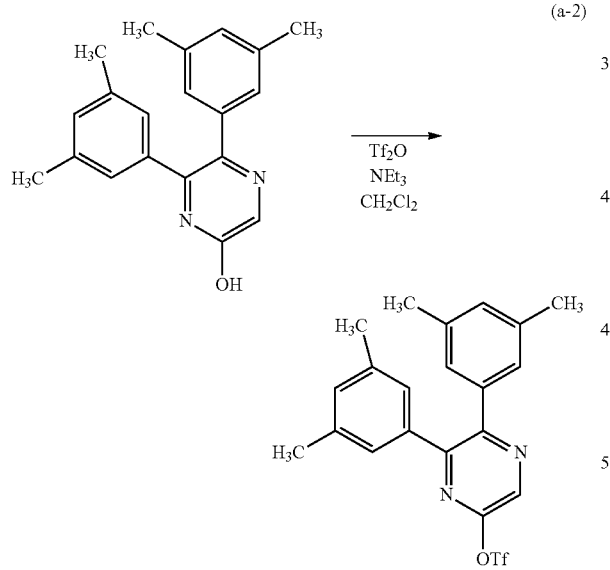

(a-2)

Step 3: Synthesis of 5-(4-cyano-2,6-dimethylphenyl)-2,3-bis(3,5-dimethylphenyl)pyrazine (Abbreviation: Hdmdppr-dmCP)

Next, 2.05 g of 5,6-bis(3,5-dimethylphenyl)pyrazin-2-yl trifluoromethanesulfonate which was obtained in Step 2, 1.00 g of 4-cyano-2,6-dimethylphenylboronic acid, 3.81 g of tripotassium phosphate, 40 mL of toluene, and 4 mL of water were put into a three-necked flask, and the air in the flask was replaced with nitrogen. The mixture in the flask was degassed by being stirred under reduced pressure, 0.044 g of tris(dibenzylideneacetone)dipalladium(0) and 0.084 g of tris(2,6-dimethoxyphenyl)phosphine were then added thereto, and the mixture was refluxed for 7 hours. Water was added to the reaction solution, and then toluene was added, so that the material contained in the reaction solution was extracted in the toluene. Saturated saline was added to the toluene solution, and the toluene solution was washed. Then, magnesium sulfate was added thereto for drying. After being dried, the solution was filtered, and the filtrate was concentrated and the obtained residue was purified by silica gel column chromatography using hexane:ethyl acetate=5:1 (volume ratio) as a developing solvent, to give an objective pyrazine derivative Hdmdppr-dmCP as white powder in a yield of 90%. A synthesis scheme of Step 3 is shown in (a-3).

[Chemical Formula 8]

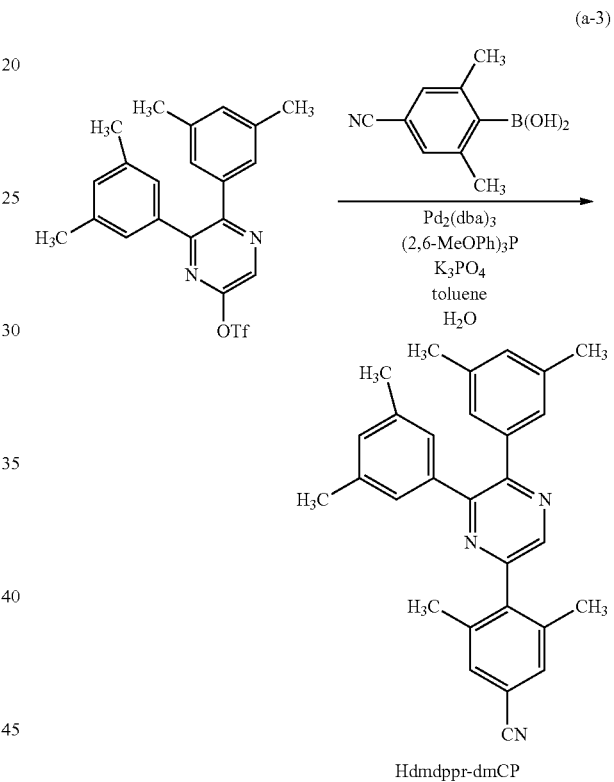

(a-3)

Step 4: Synthesis of di-μ-chloro-tetrakis {4,6-dimethyl-2-[5-(4-cyano-2,6-dimethylphenyl)-3-(3,5-dimethylphenyl)-2-pyrazinyl-κN]phenyl-κC}diiridium(III) (Abbreviation: [Ir(dmdppr-dmCP)$_2$Cl]$_2$)

Next, 15 mL of 2-ethoxyethanol, 5 mL of water, 1.74 g of Hdmdppr-dmCP (abbreviation) which was obtained in Step 3, and 0.60 g of iridium chloride hydrate (IrCl$_3$×H$_2$O) (produced by FURUYA METAL Co., Ltd.) were put into a recovery flask equipped with a reflux pipe, and the air in the flask was replaced with argon. After that, microwave irradiation (2.45 GHz, 100 W) was performed for an hour to cause a reaction. The solvent was distilled off, and then the obtained residue was suction-filtered and washed with hexane to give a dinuclear complex [Ir(dmdppr-dmCP)$_2$Cl]$_2$ as brown powder in a yield of 89%. A synthesis scheme of Step 4 is shown in (a-4).

[Chemical Formula 9]

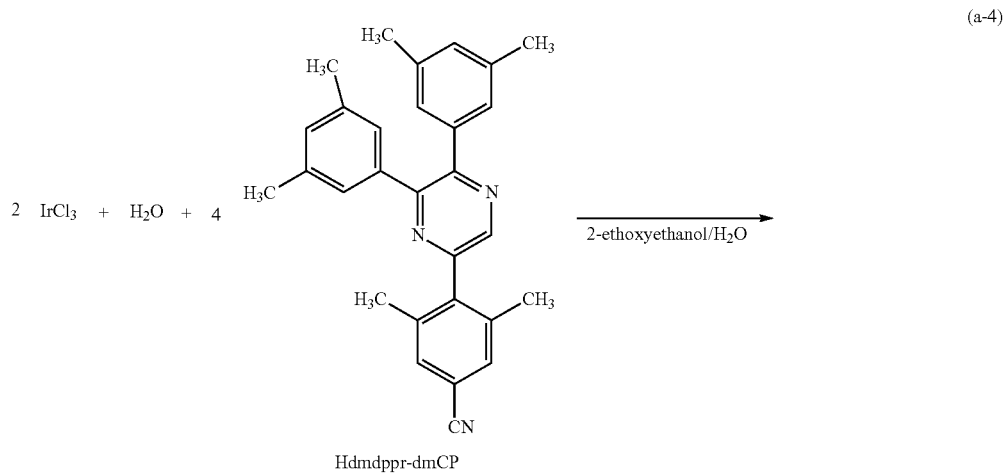

(a-4)

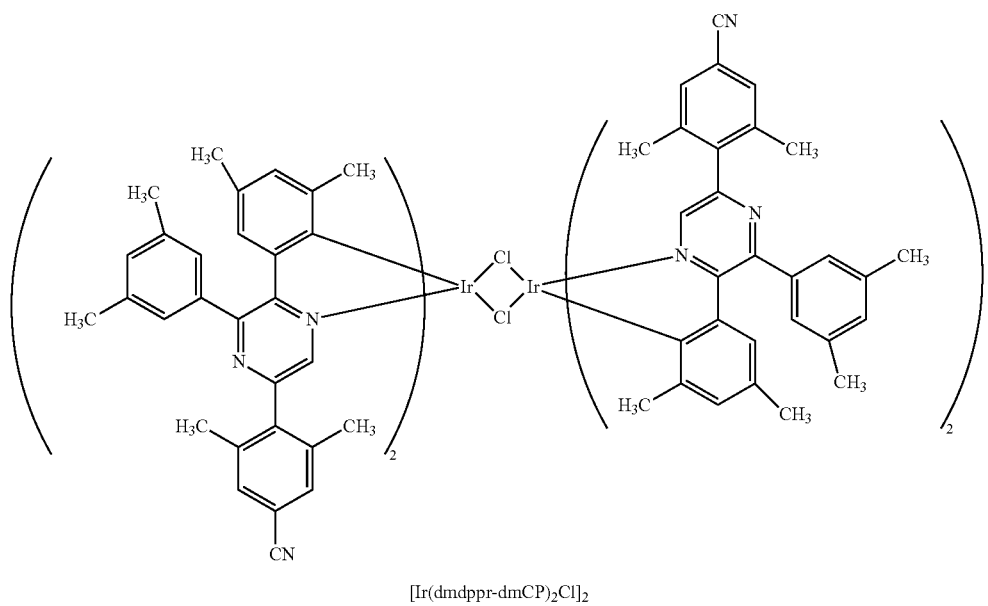

Step 5: Synthesis of bis{4,6-dimethyl-2-[5-(4-cyano-2,6-dimethylphenyl)-3-(3,5-dimethylphenyl)-2-pyrazinyl-κN]ph enyl-κC}(2,2,6,6-tetramethyl-3,5-heptanedionato-κ$^2$O, O')iridium(III) (abbreviation: [Ir(dmdppr-dmCP)$_2$(dpm)])

Furthermore, 30 mL of 2-ethoxyethanol, 0.96 g of [Ir(dmdppr-dmCP)$_2$Cl]$_2$ that is the dinuclear complex obtained in Step 4, 0.26 g of dipivaloylmethane (abbreviation: Hdpm), and 0.48 g of sodium carbonate were put into a recovery flask equipped with a reflux pipe, and the air in the flask was replaced with argon. After that, microwave irradiation (2.45 GHz, 100 W) was performed for 60 minutes. Moreover, 0.13 g of Hdpm was added thereto, and the reaction container was subjected to microwave irradiation (2.45 GHz, 120 W) for 60 minutes to cause a reaction. The solvent was distilled off, and the obtained residue was purified by silica gel column chromatography using dichloromethane and hexane as a developing solvent in a volume ratio of 1:1. The obtained residue was further purified by silica gel column chromatography using dichloromethane as a developing solvent, and then recrystallization was performed with a mixed solvent of dichloromethane and methanol to give [Ir(dmdppr-dmCP)$_2$(dpm)] which is the organometallic complex as red powder in a yield of 37%. By a train sublimation method, 0.39 g of the obtained red powder was purified. The sublimation purification was carried out at 300° C. under a pressure of 2.6 Pa with a flow rate of an argon gas at 5 mL/min. After the purification by sublimation, a red solid, which was an objective substance, was obtained in a yield of 85%. A synthetic scheme of Step 5 is shown in (a-5).

[Chemical Formula 10]

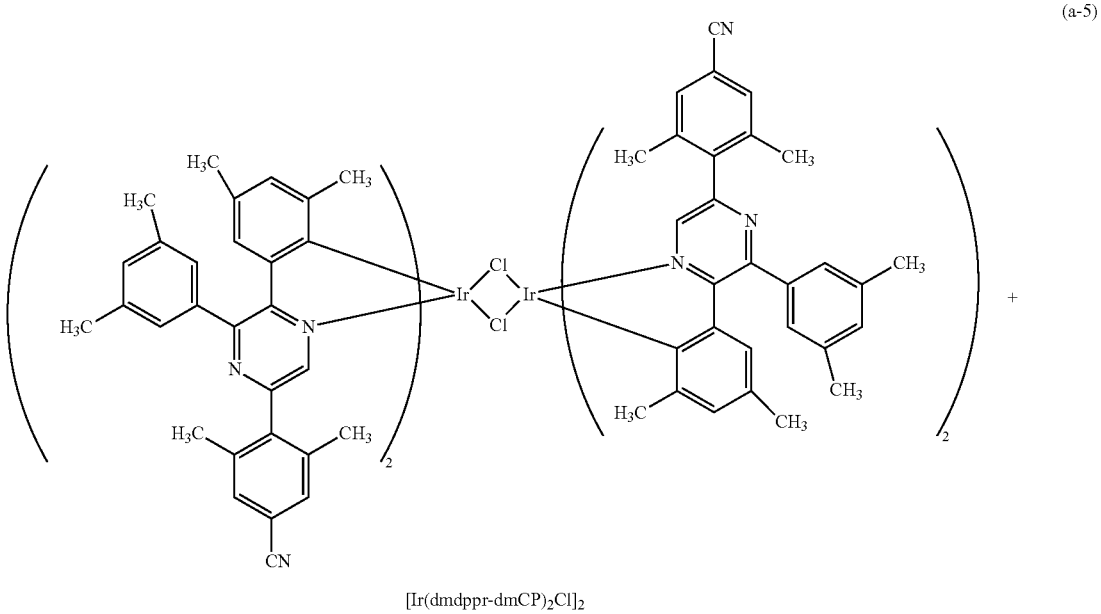

[Ir(dmdppr-dmCP)₂Cl]₂

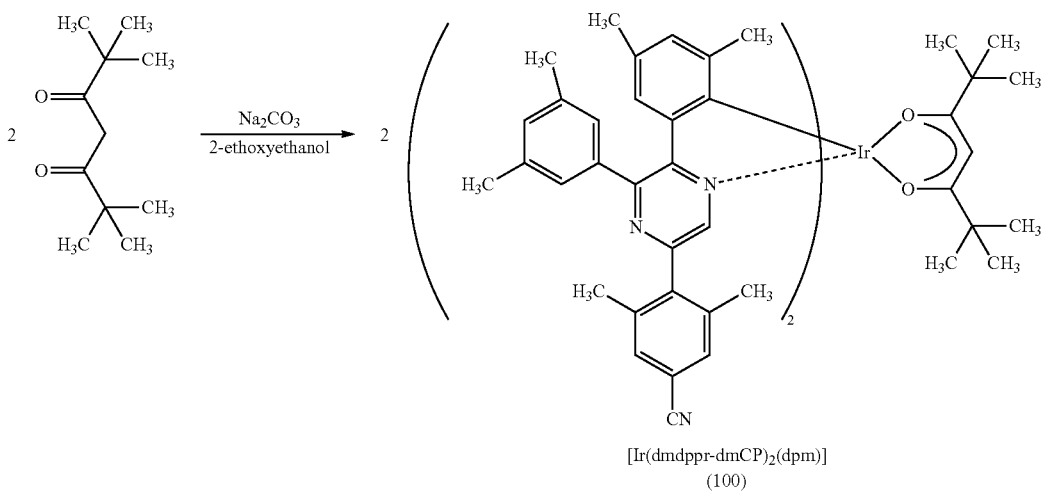

[Ir(dmdppr-dmCP)₂(dpm)]
(100)

Note that results of the analysis of the red powder obtained in Step 5 by nuclear magnetic resonance spectrometry ($^1$H-NMR) are given below. These results revealed that [Ir(dmdppr-dmCP)₂(dpm)], which is the organometallic complex represented by Structural Formula (100), was obtained in this synthesis example.

$^1$H-NMR. δ (CD₂Cl₂): 0.91 (s, 18H), 1.41 (s, 6H), 1.95 (s, 6H), 2.12 (s, 12H), 2.35 (s, 12H), 5.63 (s, 1H), 6.49 (s, 2H), 6.86 (s, 2H), 7.17 (s, 2H), 7.34 (s, 4H), 7.43 (s, 4H), 8.15 (s, 2H).

Example 3

Figure 30:
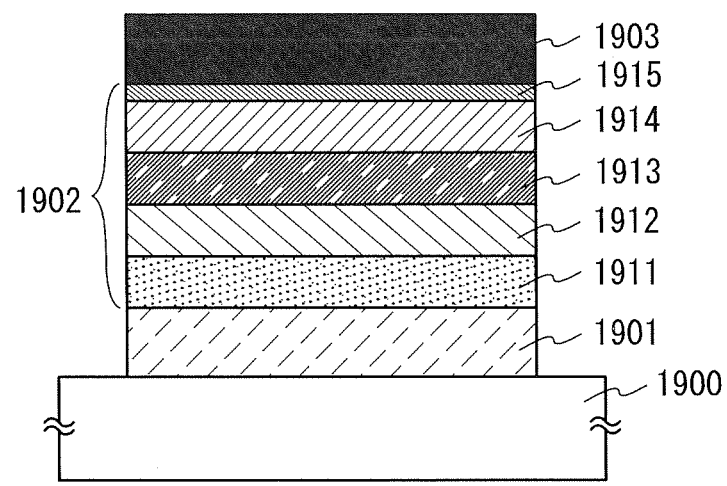
FIG. 30 illustrates a light-emitting element.
Figure 31:
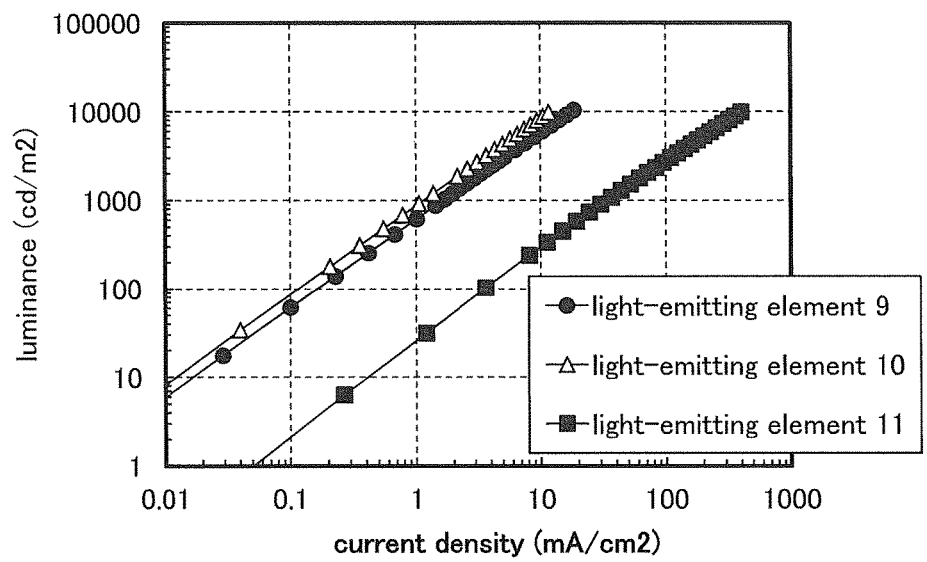
FIG. 31 shows the luminance-current density characteristics of light-emitting elements 9 to 11.
Figure 32:
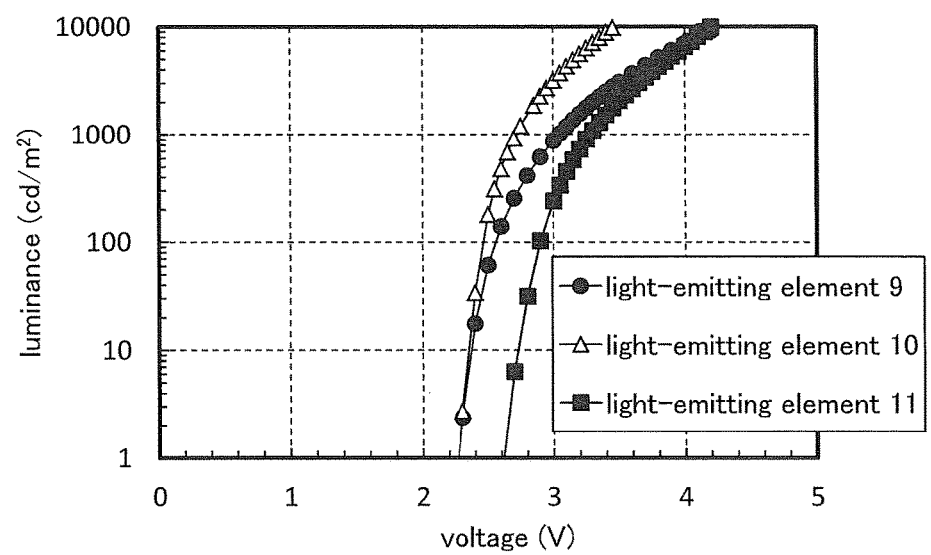
FIG. 32 shows the luminance-voltage characteristics of the light-emitting elements 9 to 11.
Figure 33:
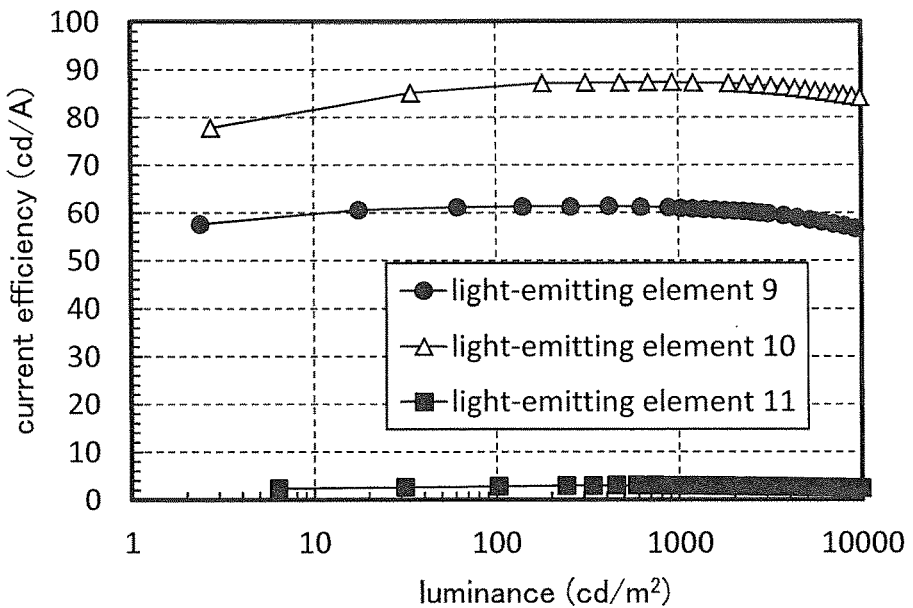
FIG. 33 shows the current efficiency-luminance characteristics of the light-emitting elements 9 to 11.
Figure 34:
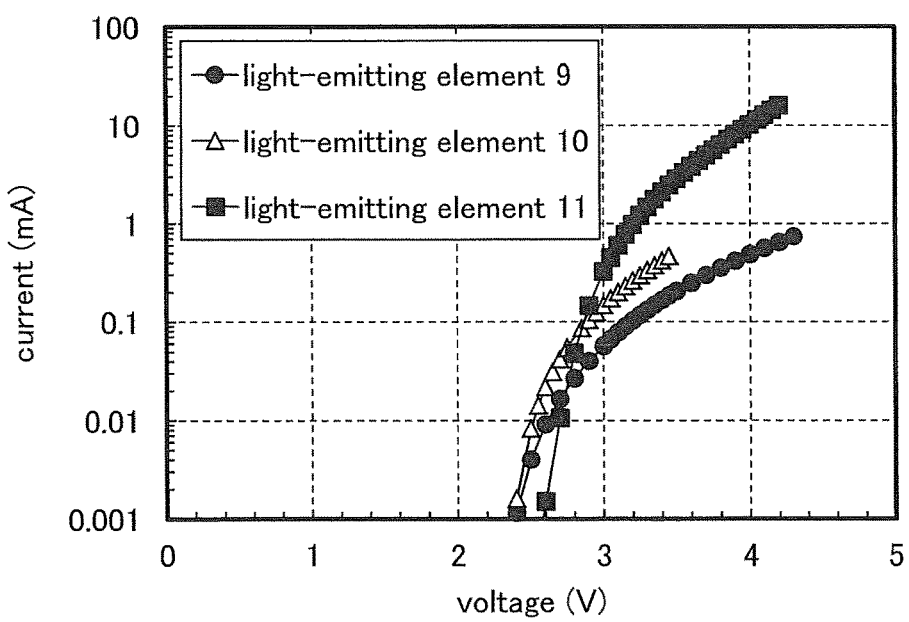
FIG. 34 shows the current-voltage characteristics of the light-emitting elements 9 to 11.

In this example, an element structure, a fabrication method, and properties of a light-emitting element used in the light-emitting device of one embodiment of the present invention will be described. Note that FIG. 30 illustrates an element structure of light-emitting elements described in this example, and Table 7 shows specific structures. Chemical formulae of materials used in this example are shown below. Note that "ote tha the table represents an alloy film of silver (Ag), palladium (Pd), and copper (Cu) (i.e., an Ag—Pd—Cu film).

TABLE 7

| | First electrode | Hole-injection layer | Hole-transport layer | Light-emitting layer | Electron-transport layer | | Electron-injection layer | Second electrode | |
|---|---|---|---|---|---|---|---|---|---|
| Light-emitting element 9(R) | APC\ITO (10 nm) | DBT3P-II:MoOx (1:0.5, 15 nm) | BPAFLP (15 nm) | * | 2mDBTBPDBq-II (30 nm) | NBphen (20 nm) | LiF (1 nm) | Ag:Mg (1:0.1, 30 nm) | ITO (70 nm) |
| Light-emitting element 10(G) | APC\ITO (110 nm) | DBT3P-II:MoOx (1:0.5, 15 nm) | BPAFLP (15 nm) | ** | 2mDBTBPDBq-II (15 nm) | Bphen (15 nm) | LiF (1 nm) | Ag:Mg (1:0.1, 30 nm) | ITO (70 nm) |
| Light-emitting element 11(B) | APC\ITO (85 nm) | PCPPn:MoOx (1:0.5, 37.5 nm) | PCPPn (15 nm) | *** | cgDBCzPA (5 nm) | Nbphen (15 nm) | LiF (1 nm) | Ag:Mg (1:0.1, 30 nm) | ITO (70 nm) |

\* 2mDBTBPDBq-II:PCBBiF:[Ir(dmdppr-P)₂(dibm)] (0.7:0.3:0.04 (20 nm)\0.8:0.2:0.04 (20 nm))
\*\* 2mDBTBPDBq-II:PCBBiF:[Ir(tBuppm)₃] (0.7:0.3:0.06 (20 nm)\0.8:0.2:0.06 (20 nm))
\*\*\* cgDBCzPA:1,6BnfAPrn-03 (1:0.03 (25 nm))

[Chemical formulae 11]

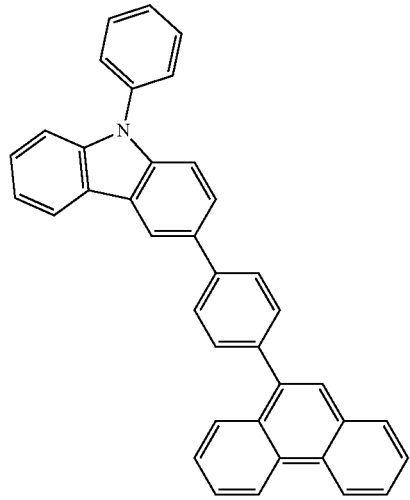

PCPPn

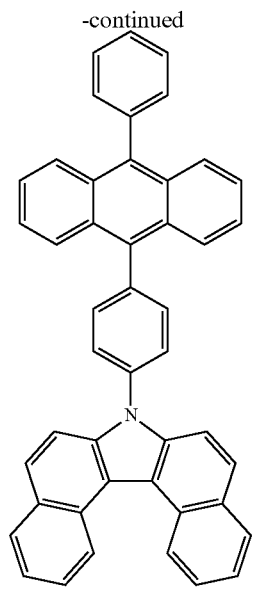

cgDBCzPA

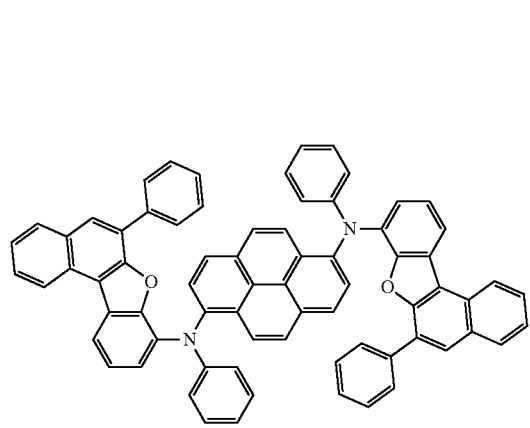

1,6BnfAPrn-03

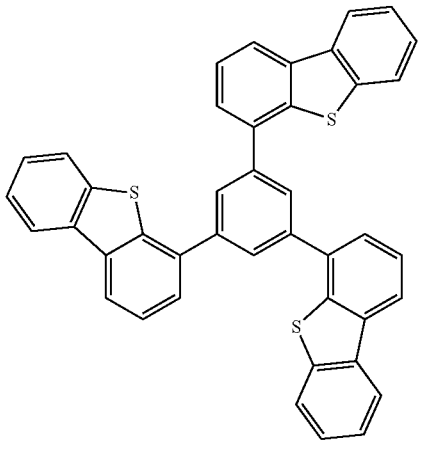

DBT3P-II

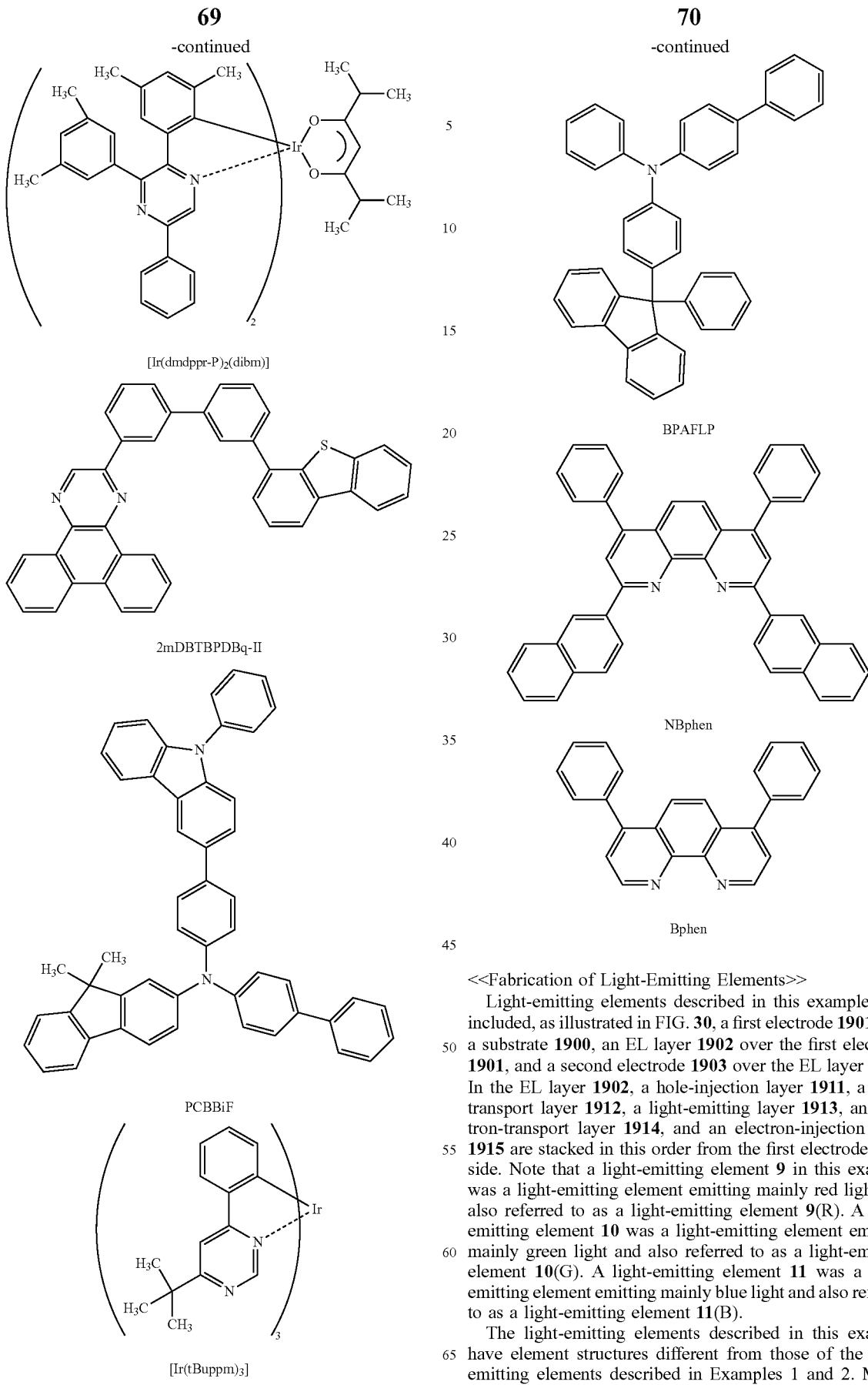

<<Fabrication of Light-Emitting Elements>>

Light-emitting elements described in this example each included, as illustrated in FIG. 30, a first electrode 1901 over a substrate 1900, an EL layer 1902 over the first electrode 1901, and a second electrode 1903 over the EL layer 1902. In the EL layer 1902, a hole-injection layer 1911, a hole-transport layer 1912, a light-emitting layer 1913, an electron-transport layer 1914, and an electron-injection layer 1915 are stacked in this order from the first electrode 1901 side. Note that a light-emitting element 9 in this example was a light-emitting element emitting mainly red light and also referred to as a light-emitting element 9(R). A light-emitting element 10 was a light-emitting element emitting mainly green light and also referred to as a light-emitting element 10(G). A light-emitting element 11 was a light-emitting element emitting mainly blue light and also referred to as a light-emitting element 11(B).

The light-emitting elements described in this example have element structures different from those of the light-emitting elements described in Examples 1 and 2. Meanwhile, functional layers included in the light-emitting elements can be formed in a manner similar to that described in Example 1; thus, Example 1 is referred to and the description is omitted in this example.

<<Operation Characteristics of Light-Emitting Elements>>

Figure 35:
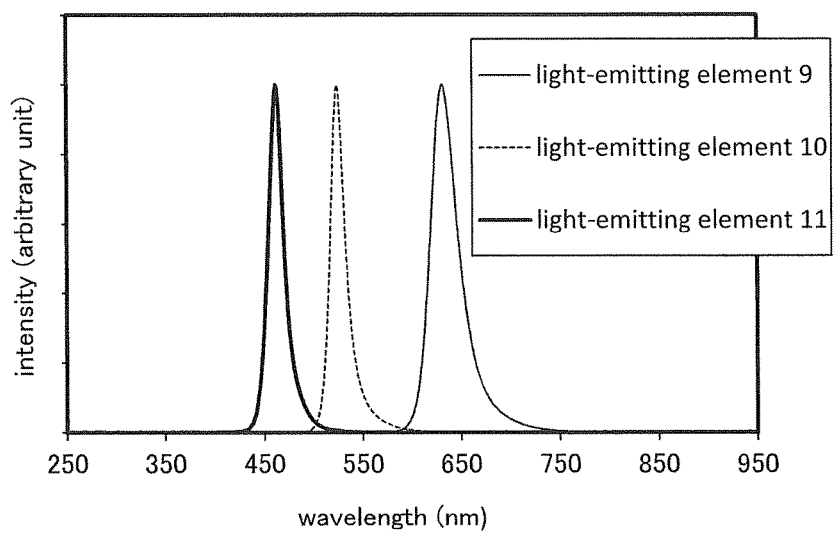
FIG. 35 shows the emission spectra of the light-emitting elements 9 to 11.

Operation characteristics of the formed light-emitting elements were measured. Note that the measurement was performed at room temperature (in an atmosphere kept at 25° C.). The results are shown in FIG. 31 to FIG. 34. FIG. 35 shows emission spectra when current at a current density of 2.5 mA/cm² was applied to the light-emitting elements. The emission spectra were measured with a multi-channel spectrometer (PMA-12 manufactured by Hamamatsu Photonics K.K.). As shown in FIG. 35, the emission spectrum of the light-emitting element 9 which emits red light has a peak at around 632 nm, the emission spectrum of the light-emitting element 10 which emits green light has a peak at around 524 nm, and the emission spectrum of the light-emitting element 11 which emits blue light has a peak at around 462 nm. The spectrum shapes were narrowed.

Figure 36:
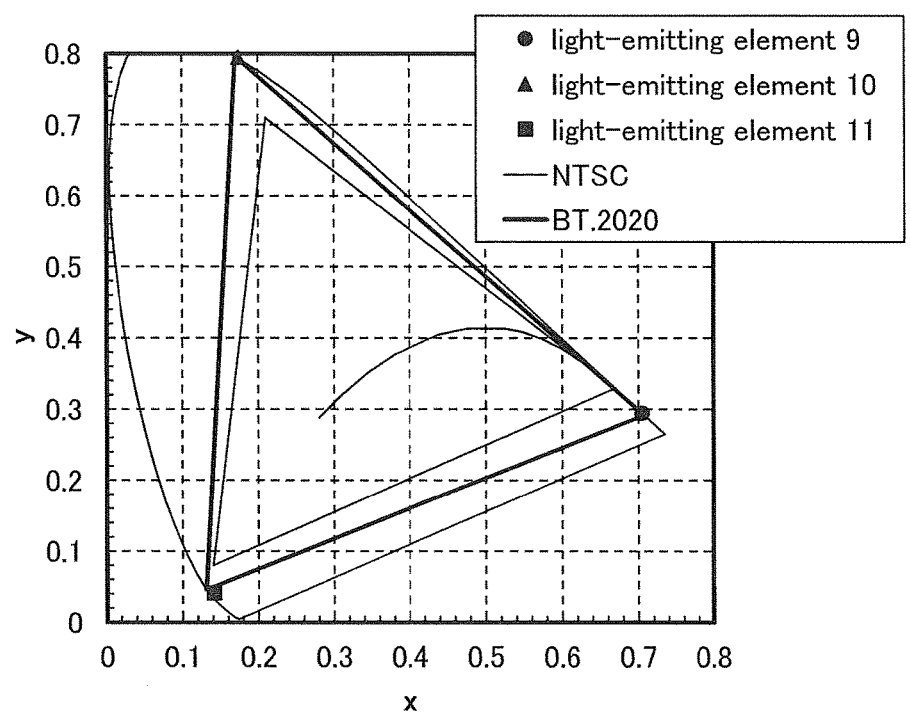
FIG. 36 shows the CIE1931 chromaticity coordinates (x,y chromaticity coordinates).

Table 8 below shows the chromaticities (x, y) of the light-emitting elements (the light-emitting elements 9, 10, and 11) fabricated in this example measured with a luminance colorimeter (BM-5AS, manufactured by TOPCON CORPORATION). Note that the chromaticities of the light-emitting elements were measured at a luminance of approximately 1000 cd/m². FIG. 36 shows the CIE1931 chromaticity coordinates (x,y chromaticity coordinates) listed in Table 8.

TABLE 8

|  | x | y |
|---|---|---|
| Light-emitting element 9(R) | 0.705 | 0.295 |
| Light-emitting element 10(G) | 0.174 | 0.794 |
| Light-emitting element 11(B) | 0.141 | 0.041 |

Although the chromaticities (x, y) of the light-emitting elements obtained here are chromaticities on the CIE1931 chromaticity coordinates (x,y chromaticity coordinates) as described above, chromaticities on the CIE1976 chromaticity coordinates (u',v' chromaticity coordinates), which are defined so that the perceived color differences may correspond to distances equivalent in the color space, can be obtained with the use of the following conversion equations (1).

[Formula 1]

$$u' = 4x/(12y - 2x + 3)$$
$$v' = 9y/(12y - 2x + 3)$$
(1)

The chromaticities of the light-emitting elements in this example on the CIE1976 chromaticity coordinates (u',v' chromaticity coordinates) are listed in Table 9 below. Table 9 also shows the chromaticity coordinates in accordance with the BT.2020 standard for comparison.

TABLE 9

|  | Example 3 | | BT.2020 | |
|---|---|---|---|---|
|  | u' | v' | u' | v' |
| R | 0.552 | 0.517 | 0.557 | 0.517 |
| G | 0.057 | 0.587 | 0.056 | 0.587 |
| B | 0.174 | 0.120 | 0.159 | 0.126 |

Figure 37:
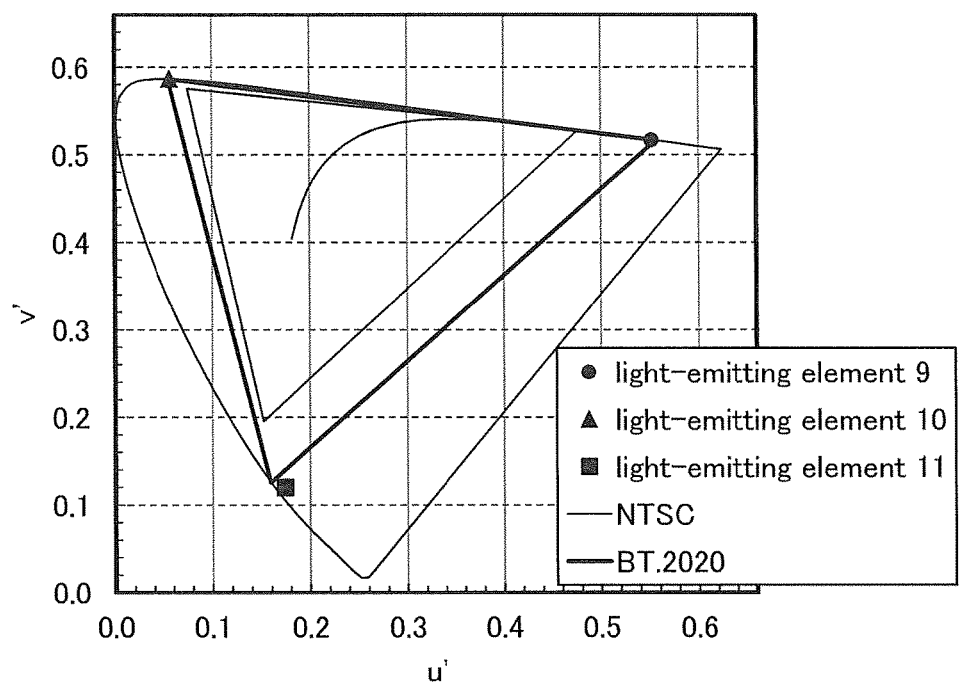
FIG. 37 shows the CIE1976 chromaticity coordinates (u',v' chromaticity coordinates).
Figure 38:
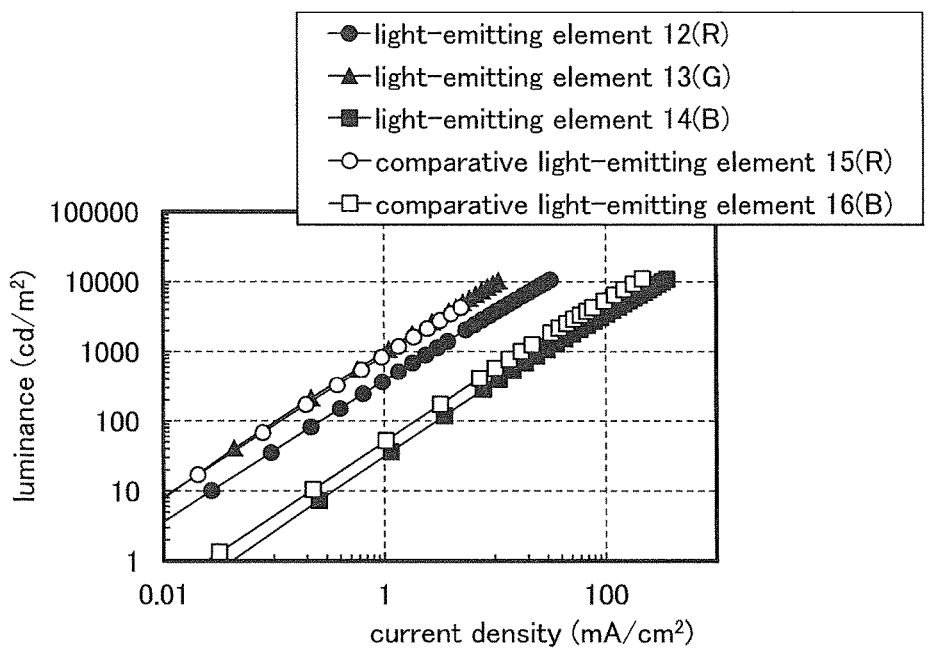
FIG. 38 shows the luminance-current density characteristics of light-emitting elements.
Figure 39:
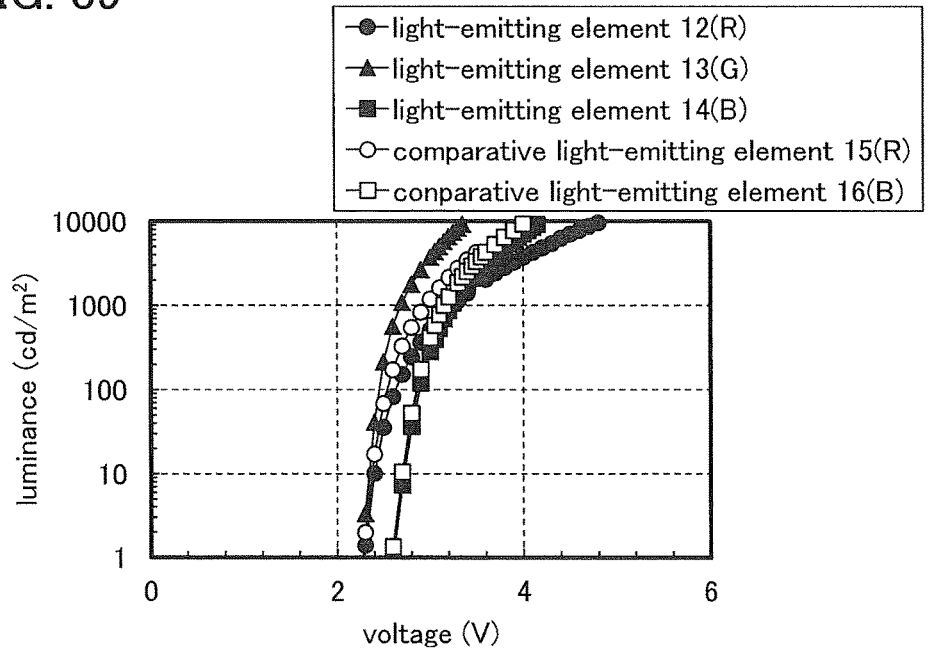
FIG. 39 shows the luminance-voltage characteristics of light-emitting elements.
Figure 40:
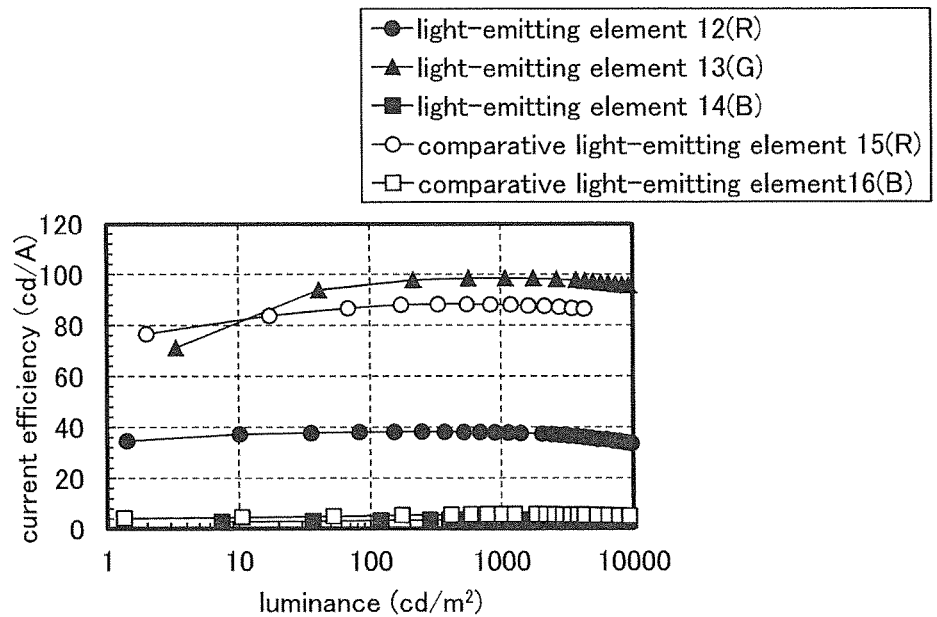
FIG. 40 shows the current efficiency-luminance characteristics of light-emitting elements.
Figure 41:
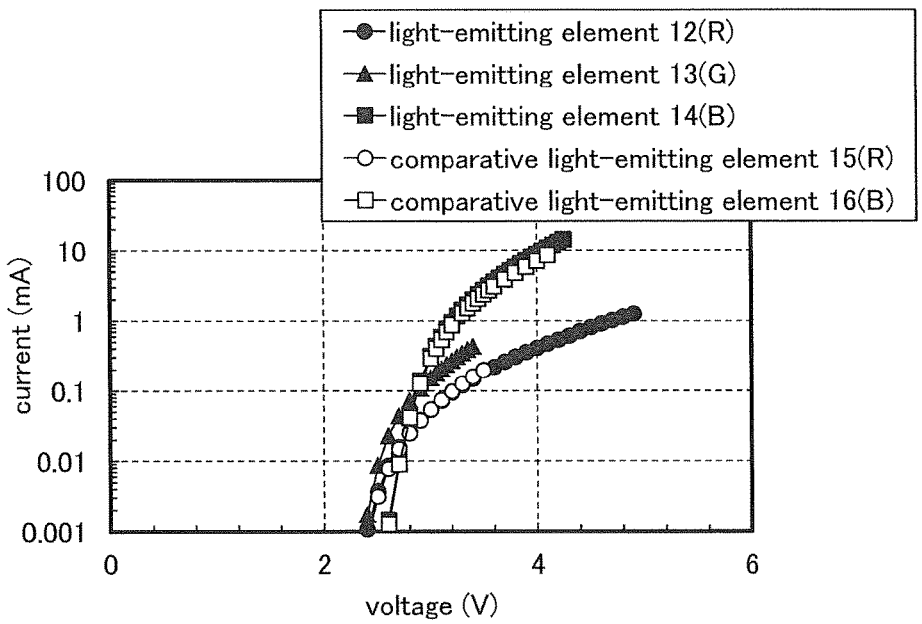
FIG. 41 shows the current-voltage characteristics of light-emitting elements.

The BT.2020 area ratio calculated from the chromaticities (u', v') in Table 9 was 100%. FIG. 37 shows the chromaticity coordinates listed in Table 9.

According to the above results, the use of the light-emitting elements described in this example can offer extremely wide-range color reproducibility.

Example 4

In this example, an element structure and properties of a light-emitting element used in the light-emitting device of one embodiment of the present invention will be described. Note that FIG. 30 illustrates an element structure of light-emitting elements described in this example, and Table 10 shows specific structures. Chemical formulae of materials used in this example are shown below.

TABLE 10

|  | First electrode | Hole-injection layer | Hole-transport layer | Light-emitting layer | Electron-transport layer | Electron-injection layer | Second electrode | |
|---|---|---|---|---|---|---|---|---|
| Light-emitting element 12(R) | APC\ITO (120 nm) | DBT3P-II:MoOx (1:0.5, 60 nm) | BPAFLP (15 nm) | * | 2mDBTBPDBq-II (30 nm) | NBphen (20 nm) | LiF (1 nm) | Ag:Mg (1:0.1, 25 nm) | ITO (70 nm) |
| Light-emitting element 13(G) | APC\ITO (110 nm) | DBT3P-II:MoOx (1:0.5, 25 nm) | BPAFLP (15 nm) | ** | 2mDBTBPDBq-II (15 nm) | Bphen (15 nm) | LiF (1 nm) | Ag:Mg (1:0.1, 25 nm) | ITO (70 nm) |
| Light-emitting element 14(B) | APC\ITO (85 nm) | PCPPn:MoOx (1:0.5, 37.5 nm) | PCPPn (15 nm) | *** | cgDBCzPA (5 nm) | NBphen (15 nm) | LiF (1 nm) | Ag:Mg (1:0.1, 25 nm) | ITO (70 nm) |
| Comparative light-emitting element 15(R) | APC\ITO (110 nm) | DBT3P-II:MoOx (1:0.5, 70 nm) | BPAFLP (15 nm) | **** | 2mDBTBPDBq-II (15 nm) | Bphen (15 nm) | LiF (1 nm) | Ag:Mg (1:0.1, 25 nm) | ITO (70 nm) |
| Comparative light-emitting element 16(B) | APC\ITO (85 nm) | PCPPn:MoOx (1:0.5, 37.5 nm) | PCPPn (15 nm) | ***** | cgDBCzPA (5 nm) | NBphen (15 nm) | LiF (1 nm) | Ag:Mg (1:0.1, 25 nm) | ITO (70 nm) |

\* 2mDBTBPDBq-II:PCBBiF:[Ir(dmdppr-P)$_2$(dibm)] (0.7:0.3:0.04 (20 nm)\0.8:0.2:0.04 (20 nm))
\*\* 2mDBTBPDBq-II:PCBBiF:[Ir(tBuppm)$_3$] (0.7:0.3:0.06 (20 nm)\0.8:0.2:0.06 (20 nm))
\*\*\* cgDBCzPA:1,6BnfAPrn-03 (1:0.03 (25 nm))
\*\*\*\* 2mDBTBPDBq-II:PCBBiF:[Ir(dmdppr-dmp)$_2$(dpm)] (0.7:0.3:0.06 (20 nm)\0.8:0.2:0.06 (20 nm))
\*\*\*\*\* cgDBCzPA:1,6mMemFLPAPrn (1:0.03 (25 nm))

[Chemical Formulae 12]
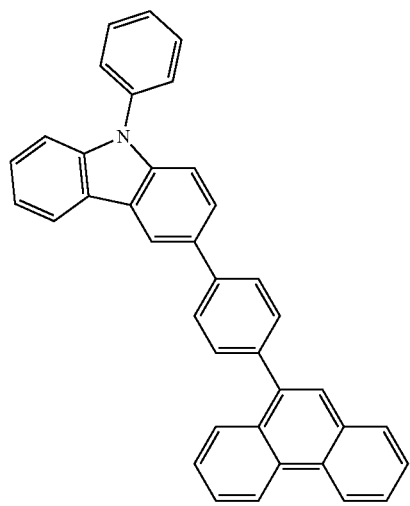
PCPPn
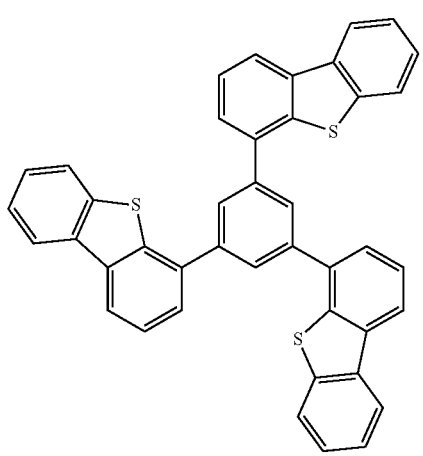
DBT3P-II
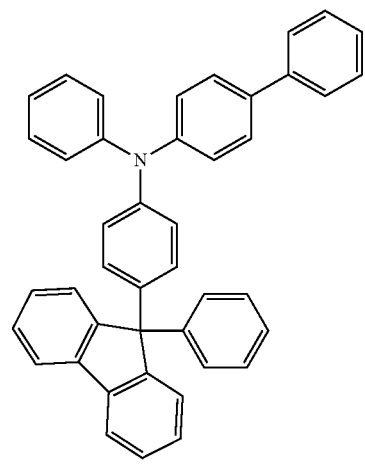
BPAFLP
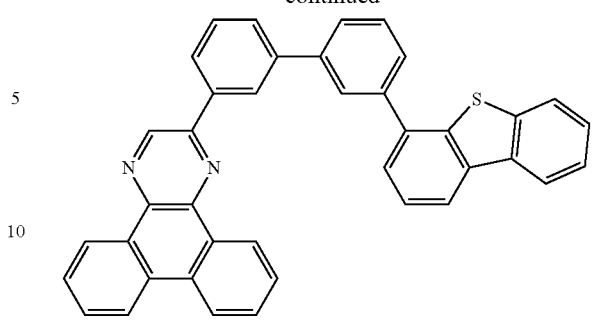
2mDBTBPDBq-II
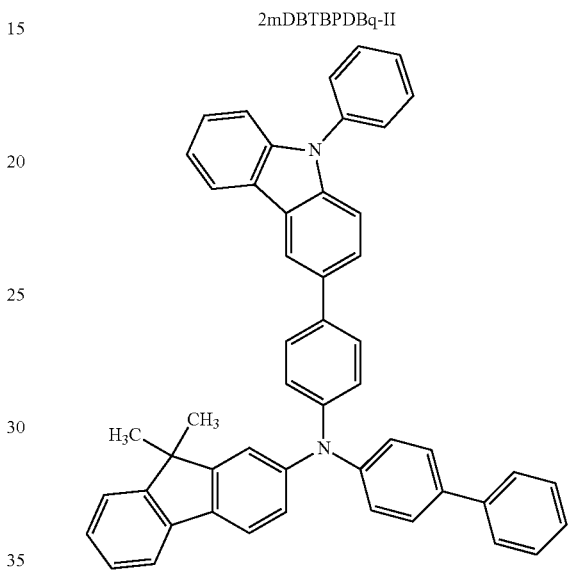
PCBBiF
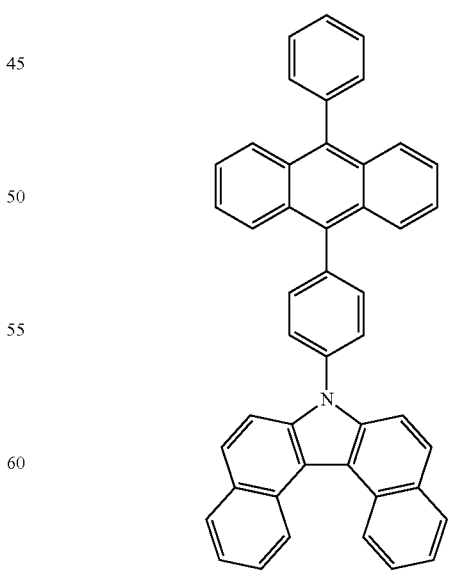
cgDBCzPA -continued

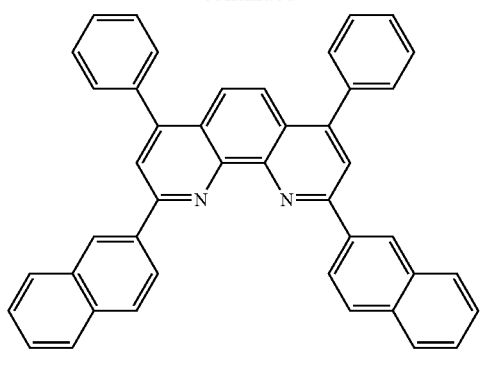

NBphen

[Chemical Formulae 13]

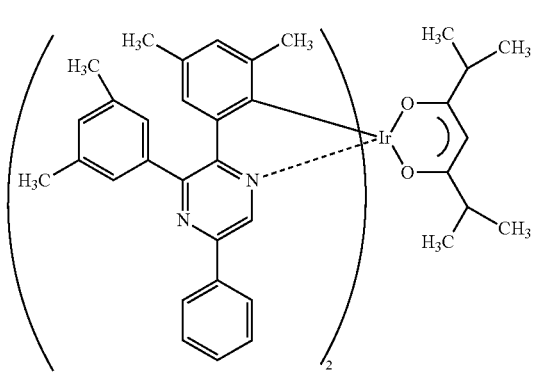

[Ir(dmdppr-P)₂(dibm)]

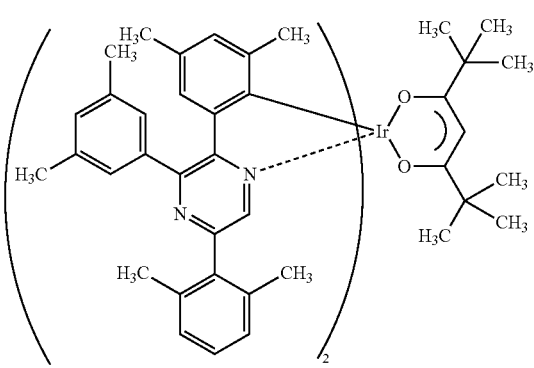

[Ir(dmdppr-dmp)₂(dpm)]

-continued

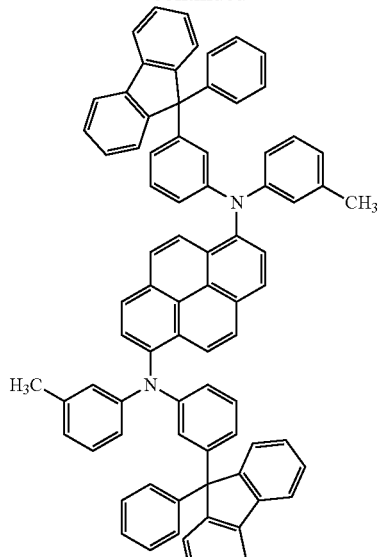

1,6mMemFLPAPrn

[Ir(tBuppm)₃]

1,6BnfAPrn-03

<<Fabrication of Light-Emitting Elements>>

Light-emitting elements described in this example each included, as illustrated in FIG. 30, the first electrode 1901 over the substrate 1900, the EL layer 1902 over the first electrode 1901, and the second electrode 1903 over the EL layer 1902. In the EL layer 1902, the hole-injection layer 1911, the hole-transport layer 1912, the light-emitting layer 1913, the electron-transport layer 1914, and the electron-injection layer 1915 are stacked in this order from the first electrode 1901 side. Note that a light-emitting element 12 and a comparative light-emitting element 15 described in this example were light-emitting elements that mainly emit red light and also referred to as a light-emitting element 12(R) and a comparative light-emitting element 15(R), respectively. A light-emitting element 13 was a light-emitting element that mainly emits green light and also referred to as a light-emitting element 13(G). A light-emitting element 14 and a comparative light-emitting element 16 were light-emitting elements that mainly emit blue light and also referred to as a light-emitting element 14(B) and a comparative light-emitting element 16(B), respectively.

The light-emitting elements described in this example had element structures different from those of the light-emitting elements described in Examples 1 to 3. Meanwhile, functional layers included in the light-emitting elements can be formed in a manner similar to that described in Example 1; thus, Example 1 is referred to and the description is omitted in this example.

<<Operation Characteristics of Light-Emitting Elements>>

Operation characteristics of the formed light-emitting elements were measured. Note that the measurement was performed at room temperature (in an atmosphere kept at 25° C.). The results are shown in FIG. 38 to FIG. 41.

Table 11 shows initial values of main characteristics of the light-emitting elements at around 1000 cd/m².

TABLE 11

| | Voltage (V) | Current (mA) | Current density (mA/cm²) | Chromaticity (x, y) | Luminance (cd/m²) | Current efficiency (cd/A) | Power efficiency (lm/W) | External quantum efficiency (%) |
|---|---|---|---|---|---|---|---|---|
| Light-emitting element 12(R) | 3.2 | 0.10 | 2.4 | (0.711, 0.289) | 900 | 38 | 37 | 44 |
| Light-emitting element 13(G) | 2.7 | 0.04 | 1.1 | (0.183, 0.786) | 1100 | 99 | 110 | 24 |
| Light-emitting element 14(B) | 3.3 | 1.20 | 29 | (0.141, 0.044) | 1100 | 3.6 | 3.5 | 6.9 |
| Comparative light-emitting element 15(R) | 2.9 | 0.04 | 0.95 | (0.670, 0.331) | 840 | 88 | 96 | 48 |
| Comparative light-emitting element 16(B) | 3.2 | 0.70 | 17 | (0.138, 0.072) | 1000 | 5.8 | 5.8 | 8.7 |

Figure 42:
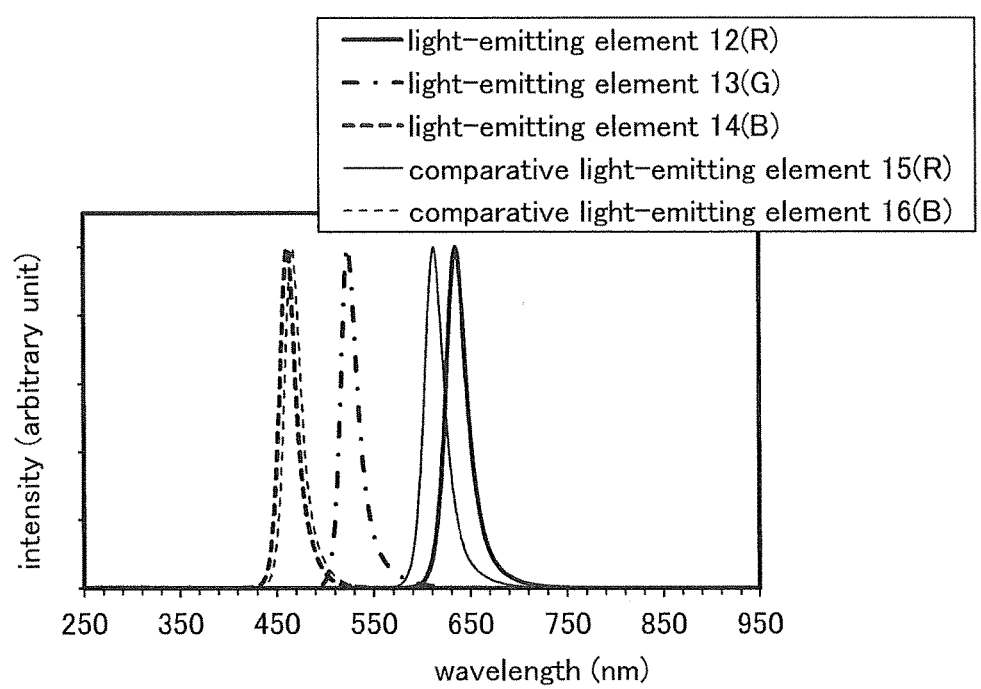
FIG. 42 shows the emission spectra of light-emitting elements.

FIG. 42 shows emission spectra when current at a current density of 2.5 mA/cm² was applied to the light-emitting elements. The emission spectra were measured with a multichannel spectrometer (PMA-12 produced by Hamamatsu Photonics K.K.). As shown in FIG. 42, the emission spectrum of the light-emitting element 12 which emits red light has a peak around 635 nm, the emission spectrum of the light-emitting element 13 which emits green light has a peak around 525 nm, and the emission spectrum of the light-emitting element 14 which emits blue light has a peak at around 462 nm. The spectrum shapes were narrowed. Furthermore, the emission spectrum of the comparative light-emitting element 15 has a peak at around 612 nm, and the emission spectrum of the comparative light-emitting element 16 has a peak at around 467 nm.

Here, three types of top-emission panels (a panel 1, a panel 2, and a panel 3) each of which was formed by combination of the light-emitting elements listed in Table 11 were assumed. Table 12 shows the simulation results obtained when a white color at D65 and 300 cd/m² is assumed to be displayed entirely under the following conditions: an aperture ratio is 15% (5% for each of the R, G, and B pixels) and attenuation of light by a circular polarizing plate or the like is 60%.

TABLE 12

| Structure | | Panel 1 R: Light-emitting element 12(R) G: Light-emitting element 13(G) B: Light-emitting element 14(B) | | Panel 2 R: Comparative light-emitting element 15(R) G: Light-emitting element 13(G) B: Light-emitting element 14(B) | | Panel 3 R: Light-emitting element 12(R) G: Light-emitting element 13(G) B: Comparative light-emitting element 16(B) | |
|---|---|---|---|---|---|---|---|
| | | x | y | x | y | x | y |
| Chromaticity | R | 0.713 | 0.287 | 0.670 | 0.330 | 0.713 | 0.287 |
| | G | 0.182 | 0.786 | 0.182 | 0.786 | 0.182 | 0.786 |
| | B | 0.141 | 0.045 | 0.141 | 0.045 | 0.138 | 0.072 |
| BT.2020 area ratio (CIE (u', v')) (%) | | 101 | | 83 | | 89 | |
| Luminance of panel (cd/m²) | R | 73 | | 92 | | 74 | |
| | G | 209 | | 191 | | 192 | |
| | B | 18 | | 18 | | 29 | |

TABLE 12-continued

| Structure | | Panel 1 R: Light-emitting element 12(R) G: Light-emitting element 13(G) B: Light-emitting element 14(B) | | Panel 2 R: Comparative light-emitting element 15(R) G: Light-emitting element 13(G) B: Light-emitting element 14(B) | | Panel 3 R: Light-emitting element 12(R) G: Light-emitting element 13(G) B: Comparative light-emitting element 16(B) | |
|---|---|---|---|---|---|---|---|
| | | x | y | x | y | x | y |
| Luminance in pixel (cd/m²) | R | 3671 | | 4586 | | 3720 | |
| | G | 10450 | | 9533 | | 9834 | |
| | B | 879 | | 881 | | 1446 | |
| Voltage (V) | R | 4.0 | | 3.5 | | 4.0 | |
| | G | 3.4 | | 3.4 | | 3.4 | |
| | B | 3.2 | | 3.2 | | 3.2 | |
| Current efficiency (cd/A) | R | 36.5 | | 86.4 | | 36.5 | |
| | G | 95.3 | | 95.6 | | 95.5 | |
| | B | 3.7 | | 3.7 | | 5.8 | |
| Power consumption (mW/cm²) | | 7.7 | | 6.5 | | 7.8 | |

Figure 55:
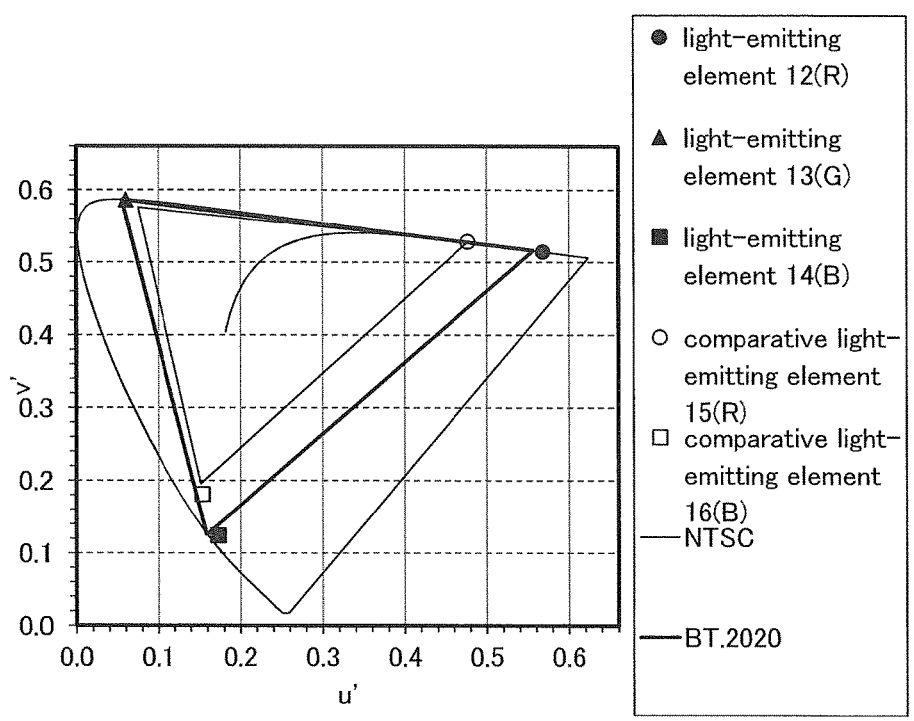
FIG. 55 shows the CIE1976 chromaticity coordinates (u',v' chromaticity coordinates).

As shown in Table 12, the BT.2020 area ratio of the panel 1 formed by the combination of the light-emitting elements 12(R), 13(G), and 14(B) is 101% when being calculated from the chromaticities of the light-emitting elements on the CIE1976 chromaticity coordinates (u',v' chromaticity coordinates), which were obtained from the chromaticities in Table 11. The BT.2020 area ratio of the panel 2 formed by the combination of the comparative light-emitting element 15(R) and the light-emitting elements 13(G) and 14(B) is 83%, and the BT.2020 area ratio of the panel 3 formed by the combination of the light-emitting elements 12(R) and 13(G) and the comparative light-emitting element 16(B) is 89%. FIG. 55 is a chromaticity diagram showing the chromaticities of the light-emitting elements 12(R), 13(G), and 14(B) and the comparative light-emitting elements 15(R) and 16(B) on the CIE1976 chromaticity coordinates (u',v' chromaticity coordinates).

According to the above results, the use of the light-emitting elements described in this example can offer extremely wide-range color reproducibility.

Figure 43:
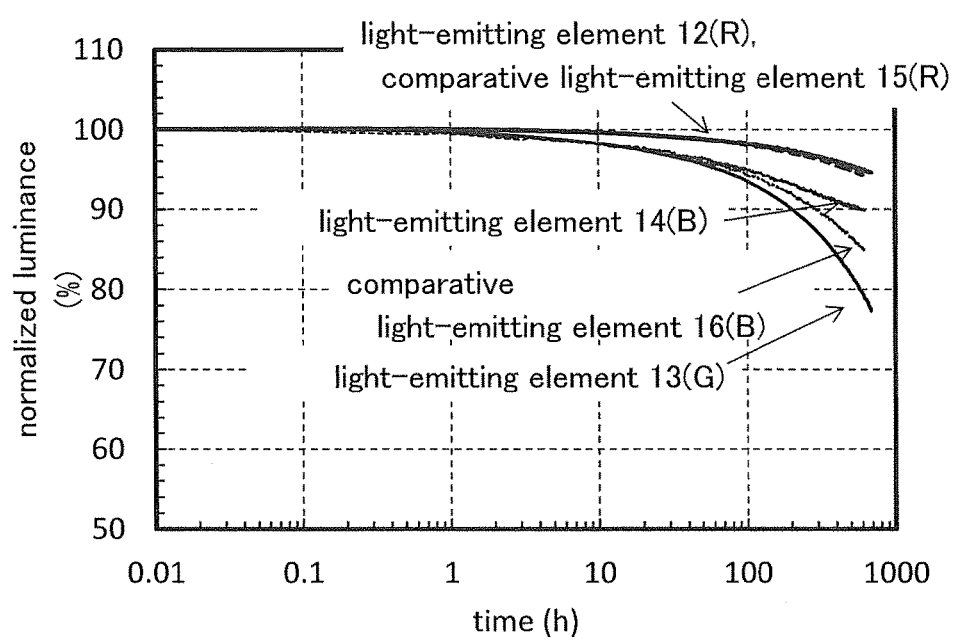
FIG. 43 shows the reliability of light-emitting elements.

Reliability tests were performed on the light-emitting elements. FIG. 43 shows results of the reliability tests. In FIG. 43, the vertical axis represents normalized luminance (%) with an initial luminance of 100%, and the horizontal axis represents driving time (h) of the elements. Note that in the reliability tests, the light-emitting elements were driven under the conditions where the initial luminance was set to 300 cd/m$^2$ and the current density was constant.

The results in FIG. 43 indicate that the reliability of the light-emitting element 12(R) is as high as that of the comparative light-emitting element 15(R) even though the light-emitting element 12(R) has higher current density than the comparative light-emitting element 15(R). The results also indicate that the light-emitting element 14(B) has higher reliability than the comparative light-emitting element 16(B).

Example 5

In this example, an element structure and properties of a light-emitting element used in the light-emitting device of one embodiment of the present invention will be described. Note that FIG. 30 illustrates an element structure of light-emitting elements described in this example, and Table 13 shows specific structures. Chemical formulae of materials used in this example are shown below.

[Chemical Formula 14]

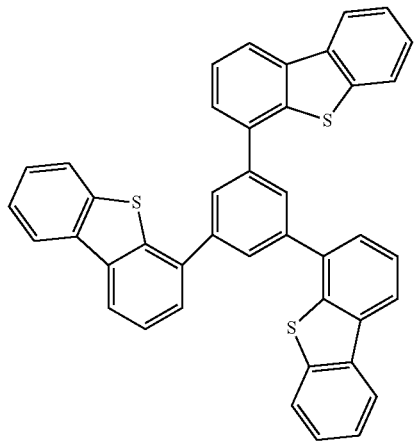

DBT3P-II

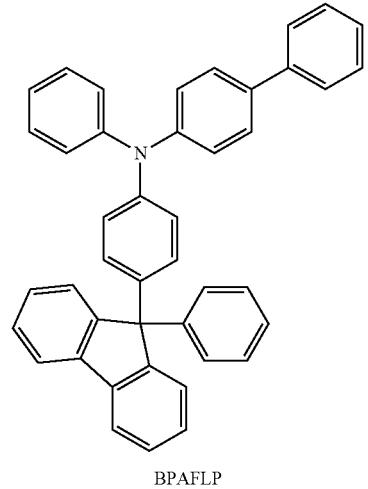

BPAFLP

TABLE 13

|  | First electrode | Hole-injection layer | Hole-transport layer | Light-emitting layer | Electron-transport layer | Electron-injection layer | Second electrode |
|---|---|---|---|---|---|---|---|
| Light-emitting element 17(R) | ITO (70 nm) | DBT3P-II:MoOx (1:0.5, 75 nm) | BPAFLP (20 nm) | * | 2mDBTBPDBq-II (30 nm) | NBphen (15 nm) | LiF (1 nm) | Al (200 nm) |
| Light-emitting element 18(R) |  |  |  | ** |  |  |  |

* 2mDBTBPDBq-II:PCBBiF:[Ir(dmdppr-dmp)$_2$(dpm)] (0.7:0.3:0.06 (20 nm)\0.8:0.2:0.06 (20 nm))
** 2mDBTBPDBq-II:PCBBiF:[Ir(dmdppr-P)$_2$(dibm)] (0.7:0.3:0.06 (20 nm)\0.8:0.2:0.06 (20 nm))

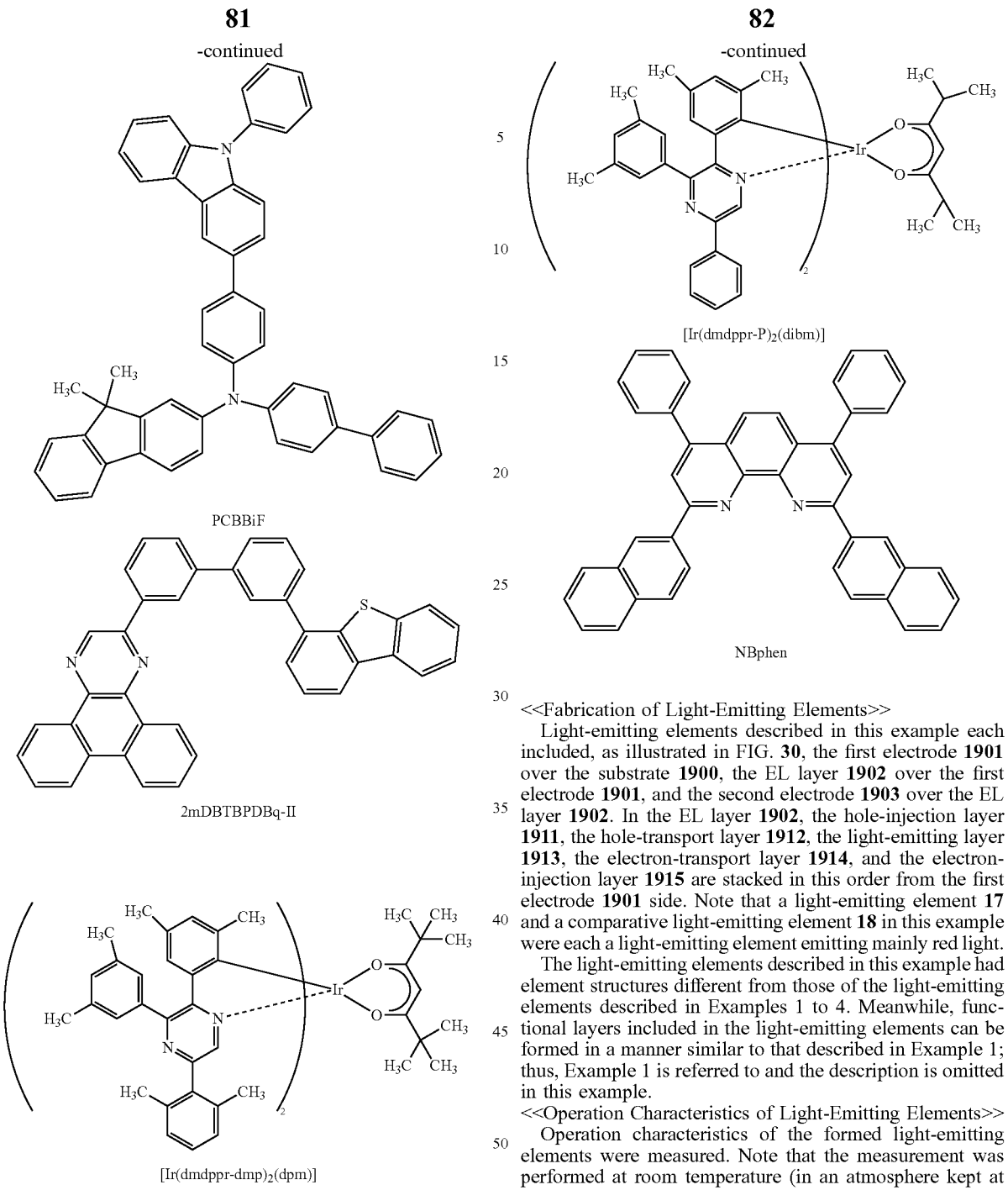

<<Fabrication of Light-Emitting Elements>>

Light-emitting elements described in this example each included, as illustrated in FIG. 30, the first electrode 1901 over the substrate 1900, the EL layer 1902 over the first electrode 1901, and the second electrode 1903 over the EL layer 1902. In the EL layer 1902, the hole-injection layer 1911, the hole-transport layer 1912, the light-emitting layer 1913, the electron-transport layer 1914, and the electron-injection layer 1915 are stacked in this order from the first electrode 1901 side. Note that a light-emitting element 17 and a comparative light-emitting element 18 in this example were each a light-emitting element emitting mainly red light.

The light-emitting elements described in this example had element structures different from those of the light-emitting elements described in Examples 1 to 4. Meanwhile, functional layers included in the light-emitting elements can be formed in a manner similar to that described in Example 1; thus, Example 1 is referred to and the description is omitted in this example.

<<Operation Characteristics of Light-Emitting Elements>>

Operation characteristics of the formed light-emitting elements were measured. Note that the measurement was performed at room temperature (in an atmosphere kept at 25° C.). Table 14 shows initial values of main characteristics of the light-emitting elements at around 1000 cd/m$^2$.

TABLE 14

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting element 17(R) | 3.6 | 0.23 | 5.8 | (0.709, 0.290) | 940 | 16.2 | 14 | 27.4 |
| Comparative light-emitting element 18(R) | 3.3 | 0.13 | 3.1 | (0.669, 0.331) | 1100 | 34.2 | 33 | 29.9 |

Figure 44:
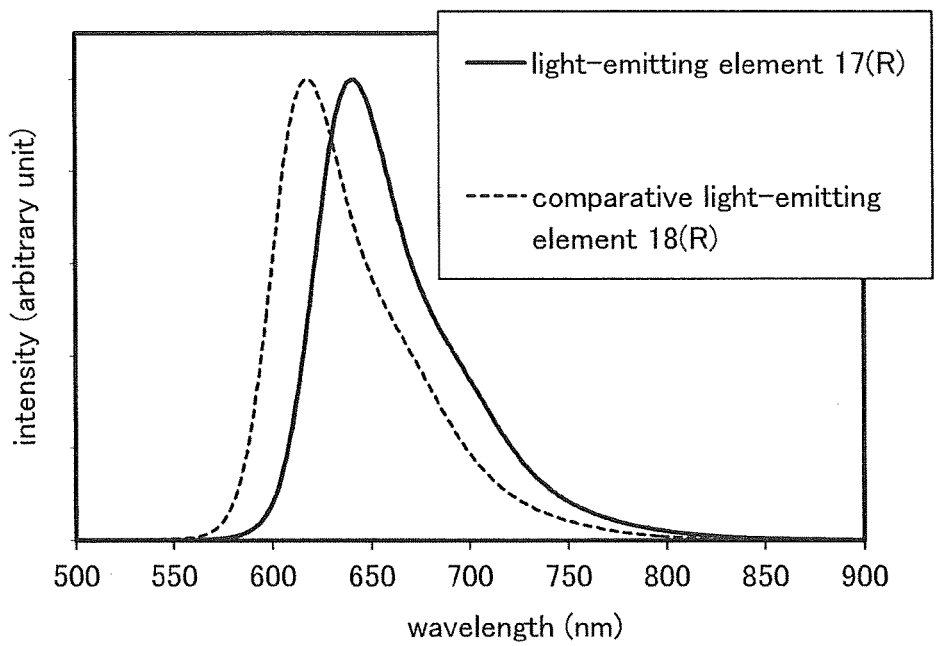
FIG. 44 shows the emission spectra of light-emitting elements.

FIG. 44 shows emission spectra when current at a current density of 2.5 mA/cm² was applied to the light-emitting elements. The emission spectra were measured with a multichannel spectrometer (PMA-12 manufactured by Hamamatsu Photonics K.K.). The emission spectrum of a light-emitting element 17(R) has a peak wavelength at around 642 nm, and the full width at half maximum (FWHM) is 62 nm. The emission spectrum of a comparative light-emitting element 18(R) has a peak wavelength at around 612 nm, and the full width at half maximum (FWHM) is 62 nm. The light-emitting element 17(R) and the comparative light-emitting element 18(R) have similar spectrum shapes.

Figure 45:
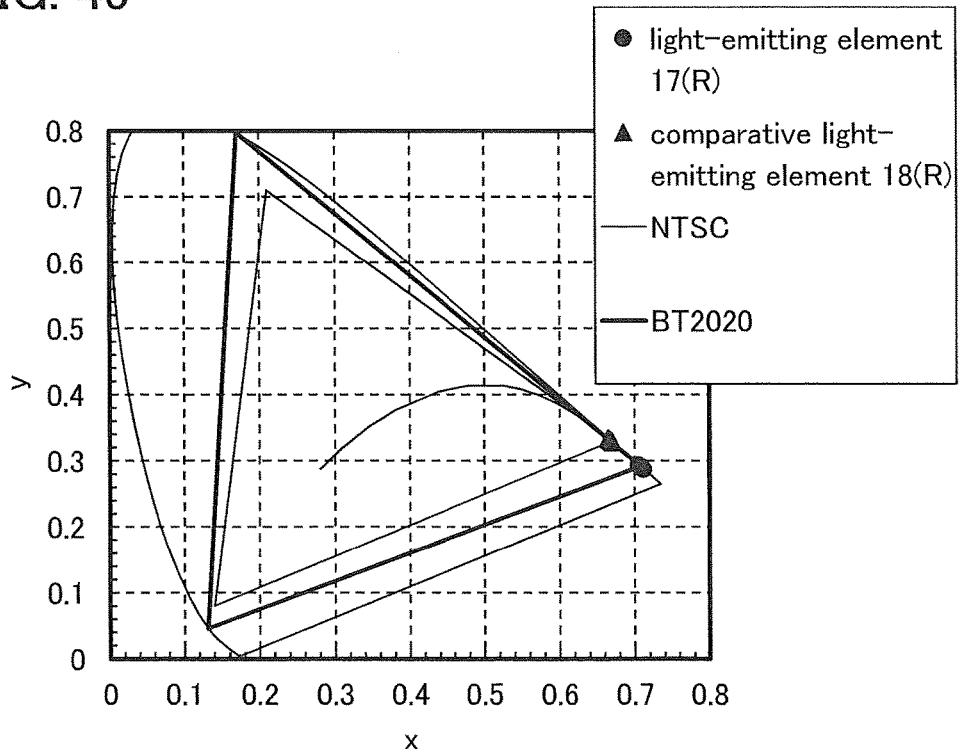
FIG. 45 shows the CIE1931 chromaticity coordinates (x,y chromaticity coordinates).

FIG. 45 shows the CIE1931 chromaticity coordinates (x,y chromaticity coordinates) of the light-emitting element 17(R) and the comparative light-emitting element 18(R). FIG. 45 indicates that the light-emitting element 17(R) meets the chromaticity of red in the BT.2020 standard.

Figure 46:
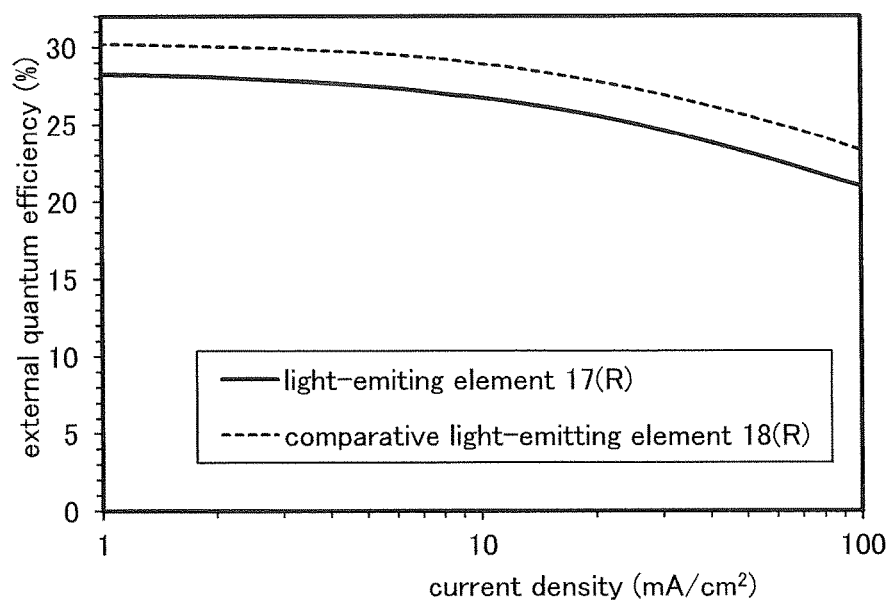
FIG. 46 shows the relationships between external quantum efficiency and current density.

FIG. 46 shows the relationships between external quantum efficiency and current density of the light-emitting element 17(R) and the comparative light-emitting element 18(R). The elements show similar results.

Figure 47:
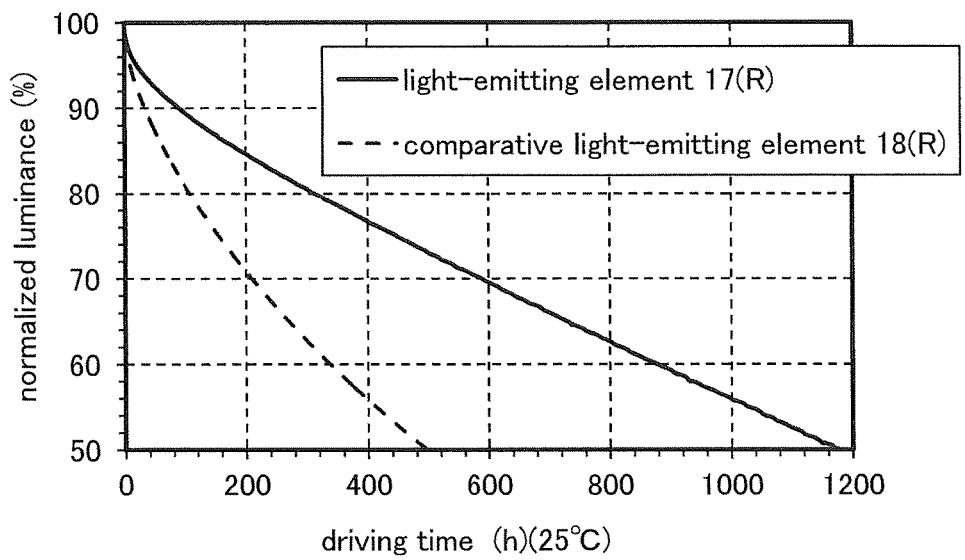
FIG. 47 shows the results of driving tests (25° C.) of light-emitting elements.
Figure 48:
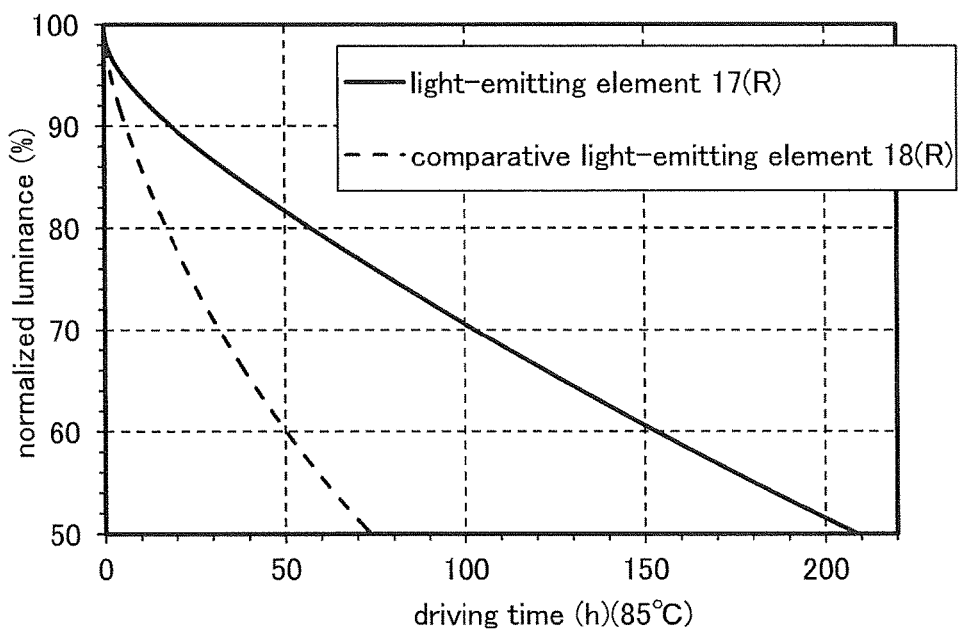
FIG. 48 shows the results of driving tests (85° C.) of light-emitting elements.

Driving tests were conducted on the light-emitting element 17(R) and the comparative light-emitting element 18(R) with a driving current of 50 mA/cm². FIG. 47 shows the results obtained when the tests were conducted at room temperature (25° C.) and FIG. 48 shows the results obtained when the tests were conducted at a high temperature (85° C.). The results indicate that the light-emitting element 17(R) can be driven for 1200 hours at room temperature (25° C.) until the normalized luminance is reduced to 50% while the comparative light-emitting element 18(R) can be driven for 500 hours, which reveals that the lifetime of the light-emitting element 17(R) is approximately 2.4 times as long as that of the comparative light-emitting element 18(R). The results also indicate that the light-emitting element 17(R) can be driven for 210 hours at a high temperature (85° C.) until the normalized luminance is reduced to 50% while the comparative light-emitting element 18(R) can be driven for 75 hours, which reveals that the lifetime of the light-emitting element 17(R) is approximately 3 times as long as that of the comparative light-emitting element 18(R). Thus, it is found that the light-emitting element 17(R) has smaller temperature dependence of lifetime than the comparative light-emitting element 18(R).

In addition, the comparison result of the driving time of the light-emitting element 17(R) until the normalized luminance is reduced to 50% in FIG. 47 and FIG. 48 indicates that the lifetime when driven at a high temperature (85° C.) is only approximately ⅕ shorter than the lifetime when driven at room temperature (25° C.). This means that the light-emitting element 17(R) has favorable heat resistance and has a long lifetime even at high temperatures.

Figure 49:
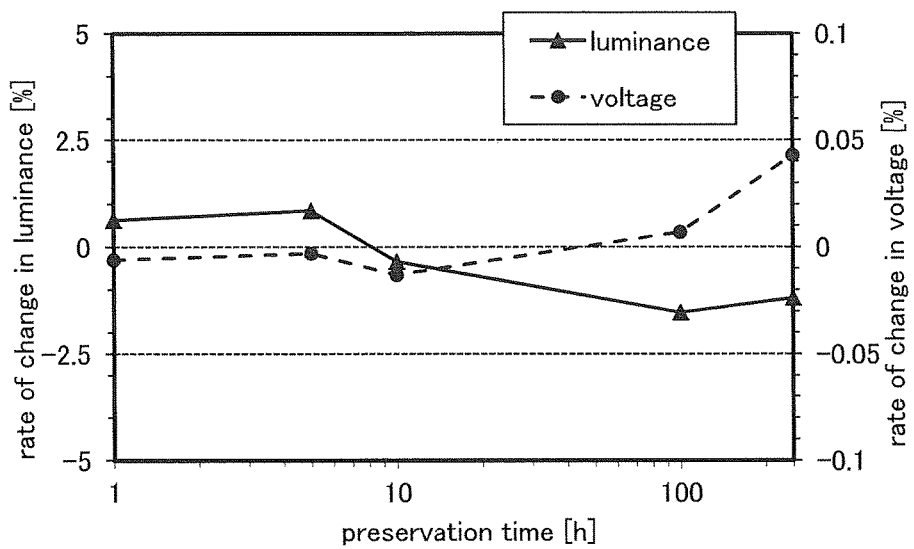
FIG. 49 shows the results of high-temperature preservation tests of a light-emitting element.

FIG. 49 shows the results of preservation test at high temperatures for the light-emitting element 17(R). As apparent from FIG. 49, even when the light-emitting element 17(R) is preserved at a high temperature (85° C.) for 200 hours, the luminance change is small (maximum of 1.5%) and the driving voltage change is small (maximum of 0.05%).

Example 6

In this example, an element structure and properties of a light-emitting element used in the light-emitting device of one embodiment of the present invention will be described. Note that FIG. 30 illustrates an element structure of light-emitting elements described in this example, and Table 15 shows specific structures. Chemical formulae of materials used in this example are shown below.

TABLE 15

| | First electrode | Hole-injection layer | Hole-transport layer | Light-emitting layer | Electron-transport layer | Electron-injection layer | Second electrode |
|---|---|---|---|---|---|---|---|
| Light-emitting element 19(B) | ITO (70 nm) | PCPPn:MoOx (4:2, 10 nm) | PCPPn (30 nm) | * | cgDBCzPA (15 nm) | NBphen (10 nm) | LiF (1 nm) | Al (200 nm) |
| Light-emitting element 20(B) | | | PCPPn (25 nm) | ** | | | | |

* cgDBCzPA:1,6BnfAPrn-03 (1:0.03 (25 nm))
** cgDBCzPA:1,6mMemFLPAPrn (1:0.03 (25 nm))

[Chemical Formulae 15]

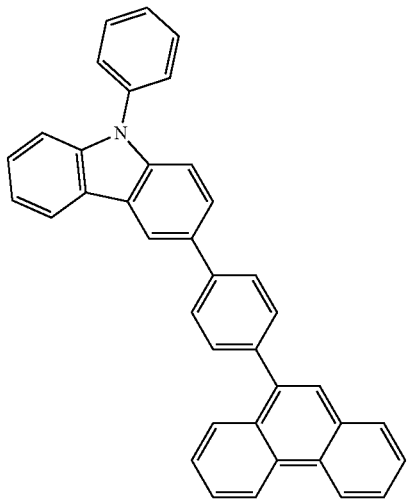

PCPPn

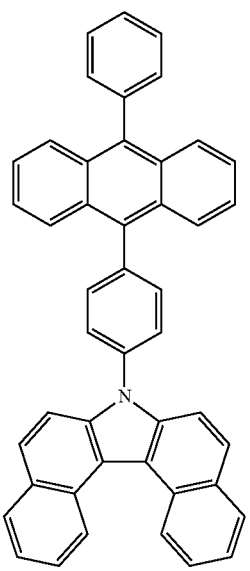

cgDBCzPA

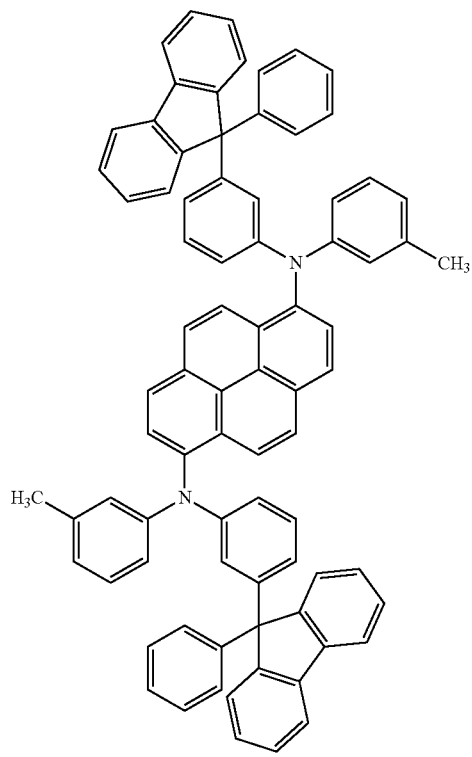

1,6mMemFLPAPrn

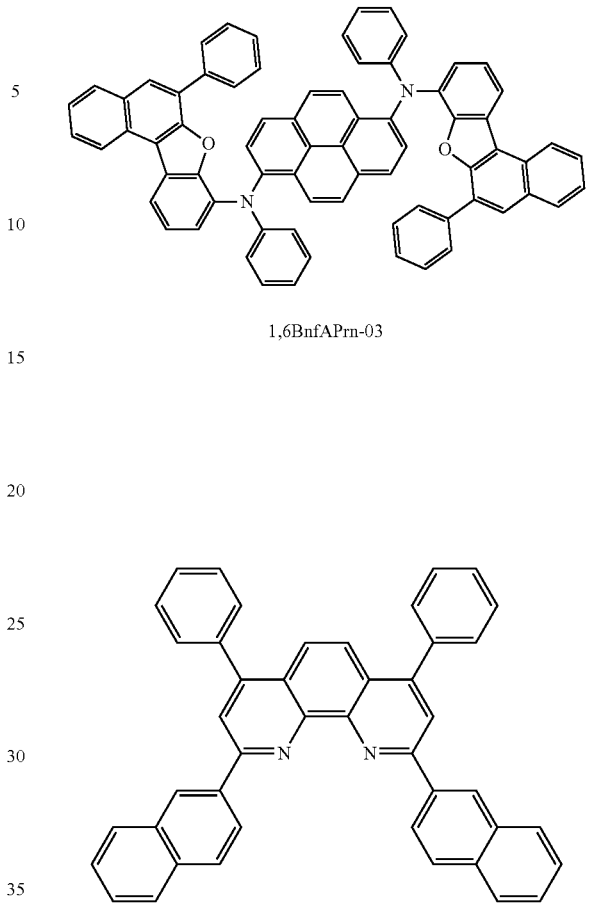

1,6BnfAPrn-03

NBphen

<<Fabrication of Light-Emitting Elements>>

Light-emitting elements described in this example each included, as illustrated in FIG. 30, the first electrode 1901 over the substrate 1900, the EL layer 1902 over the first electrode 1901, and the second electrode 1903 over the EL layer 1902. In the EL layer 1902, the hole-injection layer 1911, the hole-transport layer 1912, the light-emitting layer 1913, the electron-transport layer 1914, and the electron-injection layer 1915 are stacked in this order from the first electrode 1901 side. Note that a light-emitting element 19 and a comparative light-emitting element 20 in this example were each a light-emitting element emitting mainly blue light.

The light-emitting elements described in this example had element structures different from those of the light-emitting elements described in Examples 1 to 5. Meanwhile, functional layers included in the light-emitting elements can be formed in a manner similar to that described in Example 1; thus, Example 1 is referred to and the description is omitted in this example.

<<Operation Characteristics of Light-Emitting Elements>>

Operation characteristics of the formed light-emitting elements were measured. Note that the measurement was performed at room temperature (in an atmosphere kept at 25° C.). Table 16 shows initial values of main characteristics of the light-emitting elements at around 1000 cd/m$^2$.

TABLE 16

| | Voltage (V) | Current (mA) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|---|
| Light-emitting element 19(B) | 3.1 | 0.36 | 9.0 | (0.140, 0.115) | 940 | 10.4 | 11 | 10.8 |
| Comparative light-emitting element 20(B) | 3.1 | 0.28 | 7.1 | (0.137, 0.177) | 1100 | 15.7 | 16 | 12.7 |

Figure 50:
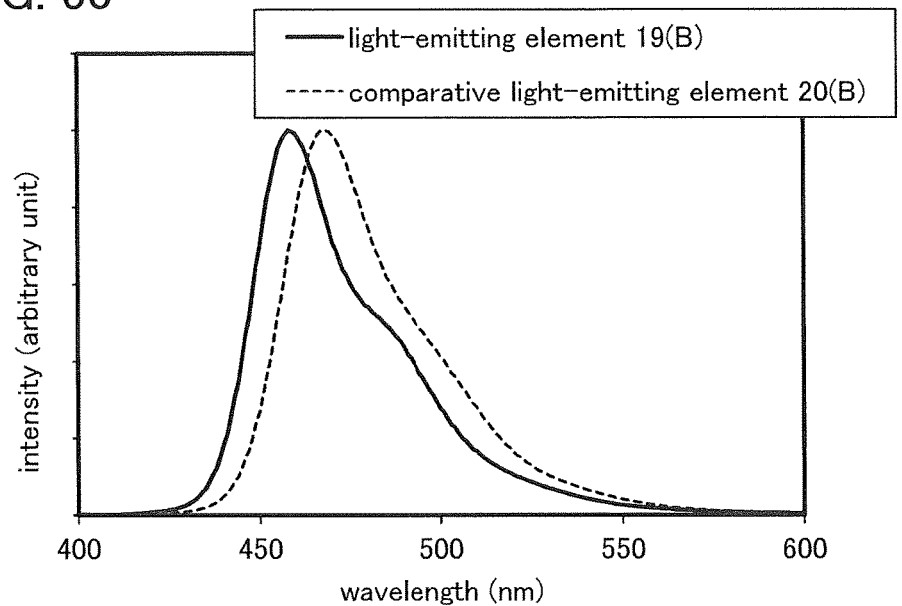
FIG. 50 shows the emission spectra of light-emitting elements.

FIG. 50 shows emission spectra when current at a current density of 12.5 mA/cm$^2$ was applied to the light-emitting elements. The emission spectra were measured with a multichannel spectrometer (PMA-12 manufactured by Hamamatsu Photonics K.K.). The emission spectrum of a light-emitting element 19(B) has a peak wavelength at around 458 nm, and the emission spectrum of a comparative light-emitting element 20(B) has a peak wavelength at around 468 nm. The results show that blue light emitted from the light-emitting element 19(B) is deeper than that emitted from the comparative light-emitting element 20(B).

Figure 51:
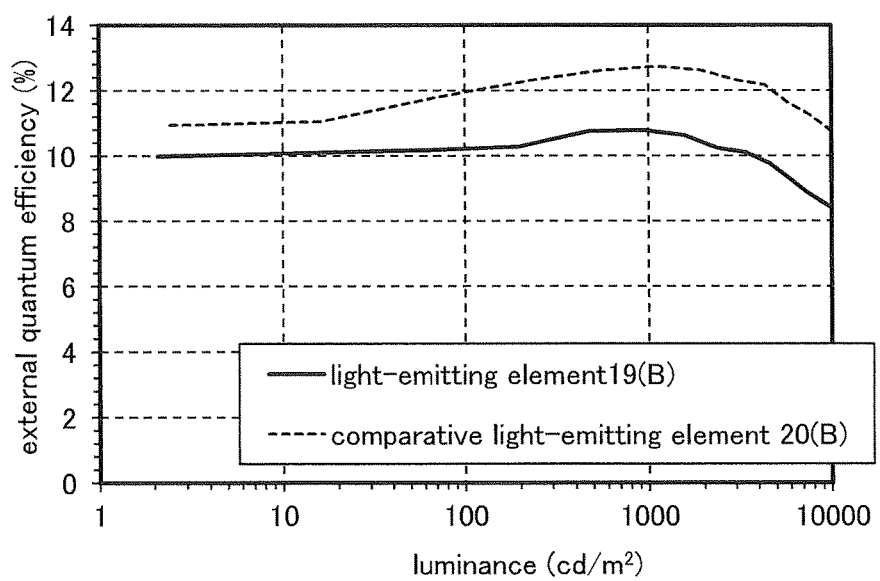
FIG. 51 shows the relationships between external quantum efficiency and luminance.

FIG. 51 shows the relationships between external quantum efficiency and luminance of the light-emitting element 19(B) and the comparative light-emitting element 20(B). The results show that the light-emitting element 19(B) has lower external quantum efficiency than the comparative light-emitting element 20(B). This is because the fluorescence quantum yield of the light-emitting element 19(B) (77%) is lower than the fluorescence quantum yield of the comparative light-emitting element 20(B) (90%) by approximately 10%.

Figure 52:
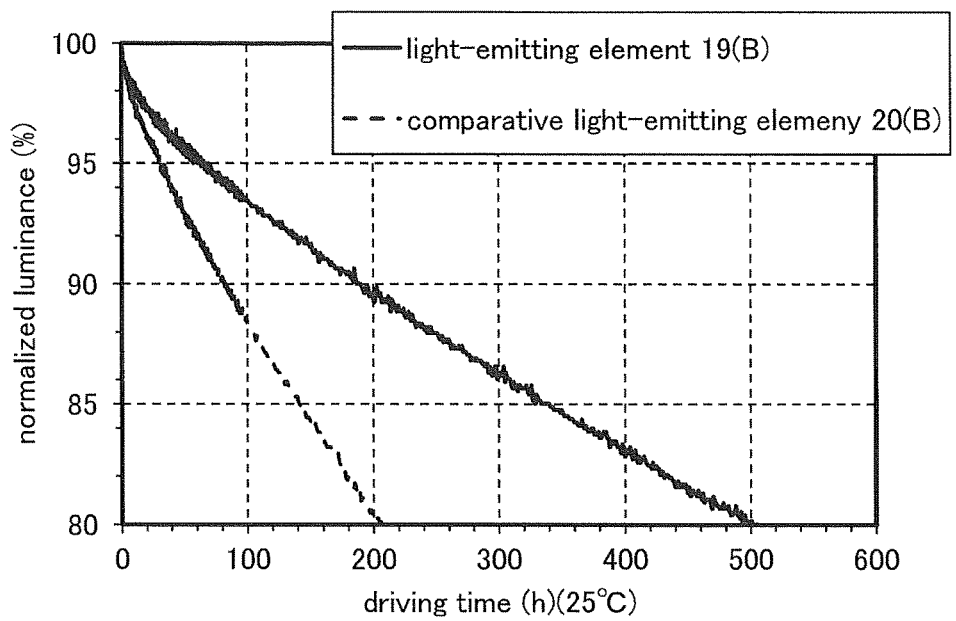
FIG. 52 shows the results of driving tests (25° C.) of light-emitting elements.
Figure 53:
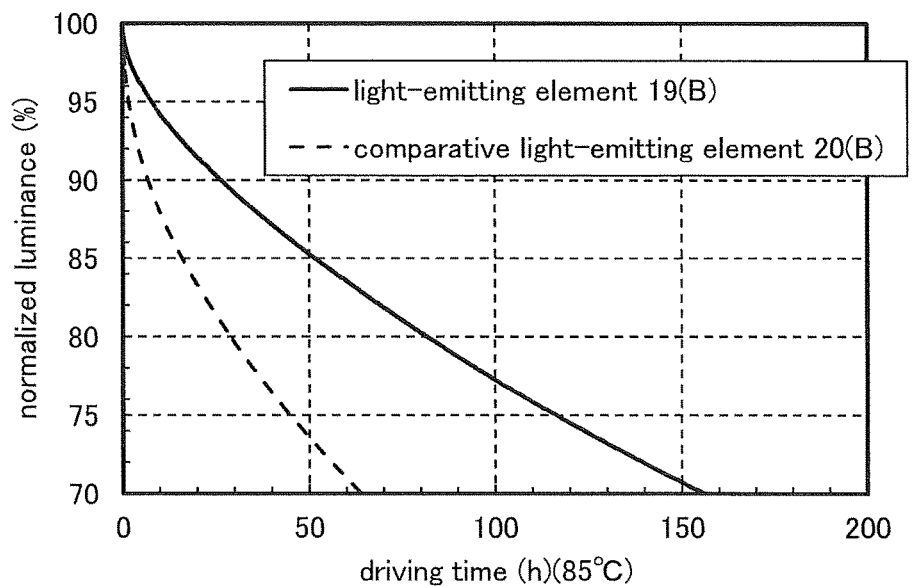
FIG. 53 shows the results of driving tests (85° C.) of light-emitting elements.

Driving tests were conducted on the light-emitting element 19(B) and the comparative light-emitting element 20(B) with a driving current of 50 mA/cm$^2$. FIG. 52 shows the results obtained when the tests were conducted at room temperature (25° C.) and FIG. 53 shows the results obtained when the tests were conducted at a high temperature (85° C.). The results indicate that the light-emitting element 19(B) can be driven for approximately 500 hours at room temperature (25° C.) until the normalized luminance is reduced to 80% while the comparative light-emitting element 20(B) can drive for approximately 200 hours, which reveals that the lifetime of the light-emitting element 19(B) is approximately 2.5 times as long as that of the comparative light-emitting element 20(B). The results also indicate that the light-emitting element 19(B) can be driven for 82 hours at a high temperature (85° C.) until the normalized luminance is reduced to 80% while the comparative light-emitting element 20(B) can be driven for 29 hours, which reveals that the lifetime of the light-emitting element 19(B) is approximately 2.8 times as long as that of the comparative light-emitting element 20(B). Thus, it is found that the light-emitting element 19(B) has smaller temperature dependence of lifetime than the comparative light-emitting element 20(B).

In addition, the comparison result of the driving time of the light-emitting element 19(B) until the normalized luminance is reduced to 80% in FIG. 52 and FIG. 53 indicates that the lifetime when driven at a high temperature (85° C.) is only approximately ⅙ shorter than the lifetime when driven at room temperature (25° C.). This means that the light-emitting element 19(B) has favorable heat resistance and has a long lifetime even at high temperatures.

Figure 54:
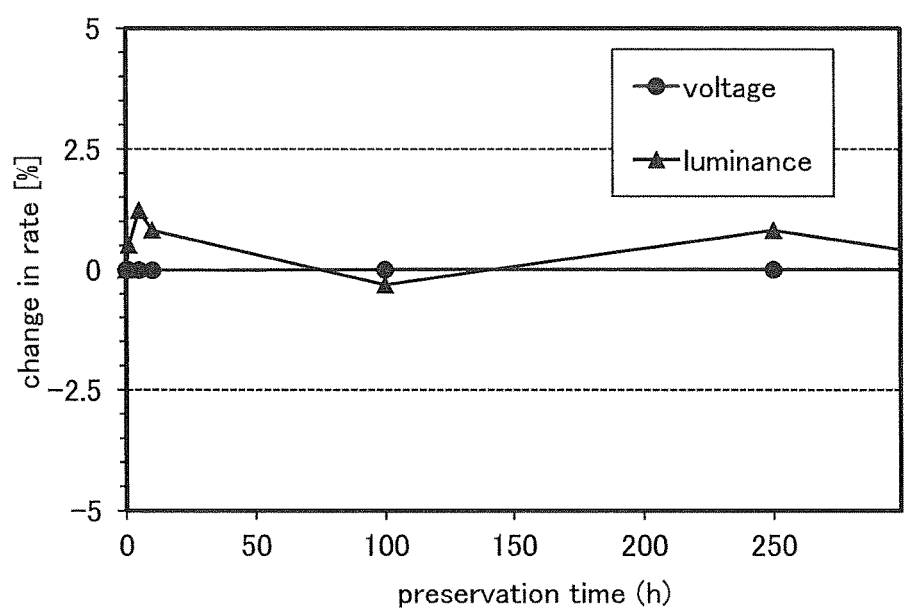
FIG. 54 shows the results of high-temperature preservation tests of a light-emitting element.

FIG. 54 shows the results of preservation test at high temperatures for the light-emitting element 19(B). As apparent from FIG. 54, even when the light-emitting element 19(B) is preserved at a high temperature (85° C.) for 250 hours, the luminance change and the driving voltage change are small (maximum of 0.8%).

REFERENCE NUMERALS

101: first electrode, 102: second electrode, 103: EL layer, 103R: EL layer, 103G: EL layer, 103B: EL layer, 104R: color filter, 104G: color filter, 104B: color filter, 105R: first light-emitting element, 105G: second light-emitting element, 105B: third light-emitting element, 106R: red light, 106G: green light, 106B: blue light, 201: first electrode, 202: second electrode, 203: EL layer, 203*a*: EL layer, 203*b*: EL layer, 204: charge generation layer, 211: hole-injection layer, 211*a*: hole-injection layer, 211*b*: hole-injection layer, 212: hole-transport layer, 212*a*: hole-transport layer, 212*b*: hole-transport layer, 213: light-emitting layer, 213*a*: light-emitting layer, 213*b*: light-emitting layer, 214: electron-transport layer, 214*a*: electron-transport layer, 214*b*: electron-transport layer, 215: electron-injection layer, 215*a*: electron-injection layer, 215*b*: electron-injection layer, 301: first substrate, 302: transistor (FET), 303: light-emitting element, 303R: light-emitting element, 303G: light-emitting element, 303B: light-emitting element, 303W: light-emitting element, 304: EL layer, 305: second substrate, 306R: color filter, 306G: color filter, 306B: color filter, 307: first electrode, 308: second electrode, 309: black layer (black matrix), 401: first substrate, 402: pixel portion, 403: driver circuit portion, 404*a*: driver circuit portion, 404*b*: driver circuit portion, 405: sealant, 406: second substrate, 407: lead wiring, 408: flexible printed circuit (FPC), 409: FET, 410: FET, 411: FET (switching FET), 412: FET (current control FET), 413: first electrode, 414: insulator, 415: EL layer, 416: second electrode, 417: light-emitting element, 418: space, 900: substrate, 901: first electrode, 902*a*: first EL layer, 902*b*: second EL layer, 903: second electrode, 904: charge generation layer, 905: substrate, 906: color filter, 911*a*: first hole-injection layer, 911*b*: second hole-injection layer, 912*a*: first hole-transport layer, 912*b*: second hole-transport layer, 913*a*: light-emitting layer (A), 913(*b*1): light-emitting layer (B1), 913(*b*2): light-emitting layer (B2), 914*a*: first electron-transport layer, 914*b*: second electron-transport layer, 915*a*: first electron-injection layer, 915*b*: second electron-injection layer, 1900: substrate, 1901: first electrode, 1902: EL layer, 1903: second electrode, 1911: hole-injection layer, 1912: hole-transport layer, 1913: light-emitting layer, 1914: electron-transport layer, 1915: electron-injection layer, 2000: touch panel, 2501: display panel, 2502R: pixel, 2502*t*: transistor, 2503*c*: capacitor, 2503*g*: scan line driver circuit, 2503*t*: transistor, 2509: FPC, 2510: substrate, 2511: wiring, 2519: terminal, 2521: insulating layer, 2528: insulator, 2550R: light-emitting element, 2560: sealing layer, 2567BM: light-blocking layer, 2567*p*: anti-reflection layer, 2567R: coloring layer, 2570: substrate, 2590: substrate, 2591: electrode, 2592: electrode, 2593: insulating layer, 2594: wiring, 2595: touch sensor, 2597: adhesive layer, 2598: wiring, 2599: terminal, 2601: pulse voltage output circuit, 2602: current sensing circuit, 2603: capacitor, 2611: transistor, 2612: transistor, 2613: transistor, 2621: electrode, 2622: electrode, 3000: display device, 3001: circuit (G), 3002: circuit (S), 3003: display portion, 3004: pixel, 3005: conductive film, 3007: opening, 3010: liquid crystal element, 3011: light-emitting element, 3015: transistor, 3016: transistor, 3017: transistor, 3018: terminal portion, 3019: terminal portion, 3021: substrate, 3022: substrate, 3023: light-emitting element, 3024: liquid crystal element, 3025: insulating layer, 3028: coloring layer, 3029: adhesive layer, 3030: conductive layer, 3031: EL layer, 3032: conductive layer, 3033: opening, 3034: coloring layer, 3035: light-blocking layer, 3036: structure, 3037: conductive layer, 3038: liquid crystal, 3039: conductive layer, 3040: alignment film, 3041: alignment film, 3042: adhesive layer, 3043: conductive layer, 3044: FPC, 3045: connection layer, 3046: insulating layer, 3047: connection portion, 3048: connector, 4000: lighting device, 4001: substrate, 4002: light-emitting element, 4003: substrate, 4004: electrode, 4005: EL layer, 4006: electrode, 4007: electrode, 4008: electrode, 4009: auxiliary wiring, 4010: insulating layer, 4011: sealing substrate, 4012: sealant, 4013: desiccant, 4015: diffusion plate, 4100: lighting device, 4200: lighting device, 4201: substrate, 4202: light-emitting element, 4204: electrode, 4205: EL layer, 4206: electrode, 4207: electrode, 4208: electrode, 4209: auxiliary wiring, 4210: insulating layer, 4211: sealing substrate, 4212: sealant, 4213: barrier film, 4214: planarization film, 4215: diffusion plate, 4300: lighting device, 5101: light, 5102: wheel, 5103: door, 5104: display portion, 5105: steering wheel, 5106: gear lever, 5107: seat, 5108: inner rearview mirror, 7100: television device, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7302: housing, 7304: display portion, 7305: icon, 7306: icon, 7311: operation button, 7312: operation button, 7313: connection terminal, 7321: band, 7322: clasp, 7400: mobile phone, 7401: housing, 7402: display portion, 7403: operation button, 7404: external connection portion, 7405: speaker, 7406: microphone, 7407: camera, 7500(1): housing, 7500(2): housing, 7501(1): first screen, 7501(2): first screen, 7502(1): second screen, 7502(2): second screen, 8001: ceiling light, 8002: foot light, 8003: sheet-like lighting, 8004: lighting device, 9310: portable information terminal, 9311: display portion, 9312: display region, 9313: hinge, and 9315: housing.

This application is based on Japanese Patent Application Serial No. 2016-101783 filed with Japan Patent Office on May 20, 2016, Japanese Patent Application Serial No. 2016-178920 filed with Japan Patent Office on Sep. 13, 2016, and Japanese Patent Application Serial No. 2016-231618 filed with Japan Patent Office on Nov. 29, 2016, the entire contents of which are hereby incorporated by reference.

The invention claimed is:
1. A light-emitting device comprising:
a first light-emitting element, a second light-emitting element, and a third light-emitting element,
wherein each of the first light-emitting element, the second light-emitting element, and the third light-emitting element comprises a pair of electrodes and an EL layer between the pair of electrodes,
wherein at least one of the EL layer in the first light-emitting element and the EL layer in the second light-emitting element contains a phosphorescent substance,
wherein light emitted from the first light-emitting element has, on CIE1931 chromaticity coordinates, a chromaticity x of greater than 0.680 and less than or equal to 0.720 and a chromaticity y of greater than or equal to 0.260 and less than or equal to 0.320,
wherein light emitted from the second light-emitting element has, on the CIE1931 chromaticity coordinates, a chromaticity x of greater than or equal to 0.130 and less than or equal to 0.250 and a chromaticity y of greater than 0.710 and less than or equal to 0.810, and
wherein light emitted from the third light-emitting element has, on the CIE1931 chromaticity coordinates, a chromaticity x of greater than or equal to 0.120 and less than or equal to 0.170 and a chromaticity y of greater than or equal to 0.020 and less than 0.060.
2. The light-emitting device according to claim 1,
wherein the EL layer in the third light-emitting element contains a fluorescent substance.
3. The light-emitting device according to claim 1,
wherein in each of the first light-emitting element, the second light-emitting element, and the third light-emitting element, one of the pair of electrodes is a reflective electrode and the other of the pair of electrodes is a transflective electrode,
wherein an optical path length between the reflective electrode and the transflective electrode in the first light-emitting element is set so that emission intensity of red light can be increased,
wherein an optical path length between the reflective electrode and the transflective electrode in the second light-emitting element is set so that emission intensity of green light can be increased, and
wherein an optical path length between the reflective electrode and the transflective electrode in the third light-emitting element is set so that emission intensity of blue light can be increased.
4. The light-emitting device according to claim 1,
wherein an area of a triangle formed by connecting CIE 1931 chromaticity coordinates of the light emitted from the first light-emitting element, the light emitted from the second light-emitting element, and the light emitted from the third light-emitting element is 80% or more and 100% or less of an area of a triangle formed by connecting CIE 1931 chromaticity coordinates of red, green, and blue of a BT.2020 standard.
5. An electronic device comprising:
the light-emitting device according to claim 1; and
an operation key, a speaker, a microphone, or an external connection portion.
6. A light-emitting device comprising:
a plurality of light-emitting elements including a first light-emitting element, a second light-emitting element, and a third light-emitting element;
a first color filter overlapping the first light-emitting element;
a second color filter overlapping the second light-emitting element; and
a third color filter overlapping the third light-emitting element,
wherein each of the first light-emitting element, the second light-emitting element, and the third light-emitting element comprises a pair of electrodes and an EL layer between the pair of electrodes, wherein the EL layer is shared by the first light-emitting element, the second light-emitting element, and the third light-emitting element and emits white light, wherein light obtained from the first light-emitting element through the first color filter has, on CIE1931 chromaticity coordinates, a chromaticity x of greater than 0.680 and less than or equal to 0.720 and a chromaticity y of greater than or equal to 0.260 and less than or equal to 0.320, wherein light obtained from the second light-emitting element through the second color filter has, on the CIE1931 chromaticity coordinates, a chromaticity x of greater than or equal to 0.130 and less than or equal to 0.250 and a chromaticity y of greater than 0.710 and less than or equal to 0.810, and wherein light obtained from the third light-emitting element through the third color filter has, on the CIE1931 chromaticity coordinates, a chromaticity x of greater than or equal to 0.120 and less than or equal to 0.170 and a chromaticity y of greater than or equal to 0.020 and less than 0.060.

7. The light-emitting device according to claim 6,
wherein in each of the first light-emitting element, the second light-emitting element, and the third light-emitting element, one of the pair of electrodes is a reflective electrode and the other of the pair of electrodes is a transflective electrode, wherein an optical path length between the reflective electrode and the transflective electrode in the first light-emitting element is set so that emission intensity of red light can be increased, wherein an optical path length between the reflective electrode and the transflective electrode in the second light-emitting element is set so that emission intensity of green light can be increased, and wherein an optical path length between the reflective electrode and the transflective electrode in the third light-emitting element is set so that emission intensity of blue light can be increased.

8. The light-emitting device according to claim 6,
wherein the EL layer comprises a first EL layer, a second EL layer, and a charge generation layer between the first EL layer and the second EL layer, wherein the first EL layer contains a red light-emitting substance and a green light-emitting substance, and wherein the second EL layer contains a blue light-emitting substance.

9. The light-emitting device according to claim 8,
wherein at least one of the red light-emitting substance and the green light-emitting substance is a phosphorescent substance, and wherein the blue light-emitting substance is a fluorescent substance.

10. The light-emitting device according to claim 6,
wherein the first color filter has a 600-nm light transmittance of less than or equal to 60% and a 650-nm light transmittance of greater than or equal to 70%, wherein the second color filter has a 480-nm light transmittance of less than or equal to 60%, a 580-nm light transmittance of less than or equal to 60%, and a 530-nm light transmittance of greater than or equal to 70%, and wherein the third color filter has a 510-nm light transmittance of less than or equal to 60% and a 450-nm light transmittance of greater than or equal to 70%.

11. The light-emitting device according to claim 6, wherein the light obtained from the first light-emitting element through the first color filter has an emission spectrum whose peak value is within a range from 620 nm to 680 nm.

12. The light-emitting device according to claim 6,
wherein an area of a triangle formed by connecting CIE 1931 chromaticity coordinates of the light emitted from the first light-emitting element, the light emitted from the second light-emitting element, and the light emitted from the third light-emitting element is 80% or more and 100% or less of an area of a triangle formed by connecting CIE 1931 chromaticity coordinates of red, green, and blue of a BT.2020 standard.

13. An electronic device comprising:
the light-emitting device according to claim 6; and
an operation key, a speaker, a microphone, or an external connection portion.

* * * * *